United States Patent
Hashimoto et al.

(10) Patent No.: US 8,264,577 B2
(45) Date of Patent: Sep. 11, 2012

(54) IMAGE PICKUP DEVICE, SPATIAL INFORMATION DETECTING APPARATUS USING THE SAME DEVICE AND METHOD FOR TAKING OUT RECEIVED-LIGHT OUTPUT FROM THE SAME DEVICE

(75) Inventors: Yusuke Hashimoto, Neyagawa (JP); Fumi Tsunesada, Osaka (JP); Kenji Imai, Kadoma (JP); Yuji Takada, Kyoto (JP)

(73) Assignee: Panasonic Corporation, Osaka (JP)

( * ) Notice: Subject to any disclaimer, the term of this patent is extended or adjusted under 35 U.S.C. 154(b) by 358 days.

(21) Appl. No.: 12/593,820

(22) PCT Filed: Mar. 28, 2008

(86) PCT No.: PCT/JP2008/056729
§ 371 (c)(1), (2), (4) Date: Sep. 29, 2009

(87) PCT Pub. No.: WO2008/123597
PCT Pub. Date: Oct. 16, 2008

(65) Prior Publication Data
US 2010/0097506 A1  Apr. 22, 2010

(30) Foreign Application Priority Data

Mar. 30, 2007 (JP) ................................. 2007-095616
Mar. 30, 2007 (JP) ................................. 2007-095617

(51) Int. Cl.
*H04N 5/335* (2011.01)
*H04L 31/113* (2006.01)
*H01L 27/00* (2006.01)

(52) U.S. Cl. ........ 348/296; 348/294; 348/302; 348/311; 257/291; 257/292; 250/208.1

(58) Field of Classification Search .......... 348/294–324; 257/291–292; 250/208.1
See application file for complete search history.

(56) References Cited

U.S. PATENT DOCUMENTS 4,803,710 A  2/1989  Elabd
(Continued)

FOREIGN PATENT DOCUMENTS

GB  2 021 313 A  11/1979
(Continued)

OTHER PUBLICATIONS

Partial international Search Report for the Application No. PCT/JP2008/056729 mailed Dec. 18, 2008.
(Continued)

*Primary Examiner* — Chieh M Fan
*Assistant Examiner* — Quang Le
(74) *Attorney, Agent, or Firm* — Cheng Law Group, PLLC

(57) ABSTRACT

A compact image pickup device with high sensitivity is provided, which is suitable for a spatial information detecting apparatus. The image pickup device has a plurality of image pickup units arranged on a semiconductor substrate. Each of the image pickup units has a light receiving array of photoelectric conversion elements for generating electric charges corresponding to a received-light amount, a transfer array of charge transfer elements, an accumulation array of charge accumulation elements each having a greater charge storage capacity than a saturation charge amount of the photoelectric conversion element, and a charge-amount adjusting portion configured to determine an amount of undesired electric charges to be separated from the electric charges generated by each of the photoelectric conversion elements. The transfer array and the light receiving array are arranged in a line in a vertical direction. The accumulation array is disposed adjacent to the transfer array in a horizontal direction.

16 Claims, 25 Drawing Sheets

U.S. PATENT DOCUMENTS

| | | | |
|---|---|---|---|
| 4,975,777 A | 12/1990 | Lee et al. | |
| 5,652,622 A * | 7/1997 | Hynecek | 348/311 |
| 5,877,521 A * | 3/1999 | Johnson et al. | 257/223 |
| 5,900,769 A | 5/1999 | Tanabe | |
| 7,362,419 B2 | 4/2008 | Kurihara et al. | |
| 7,476,841 B2 * | 1/2009 | Hashimoto et al. | 250/214.1 |
| 2002/0057356 A1 | 5/2002 | Tanabe | |
| 2002/0140003 A1 | 10/2002 | Mizobuchi et al. | |
| 2005/0178946 A1 | 8/2005 | Hashimoto et al. | |
| 2007/0057209 A1 | 3/2007 | Kurihara et al. | |

FOREIGN PATENT DOCUMENTS

| | | |
|---|---|---|
| JP | 2006-84430 A | 3/2006 |
| WO | WO-90/16083 A1 | 12/1990 |
| WO | WO-2008/081997 A2 | 7/2008 |

OTHER PUBLICATIONS

International Search Report for the Application No. PCT/JP2008/056729 mailed Feb. 9, 2009.

* cited by examiner

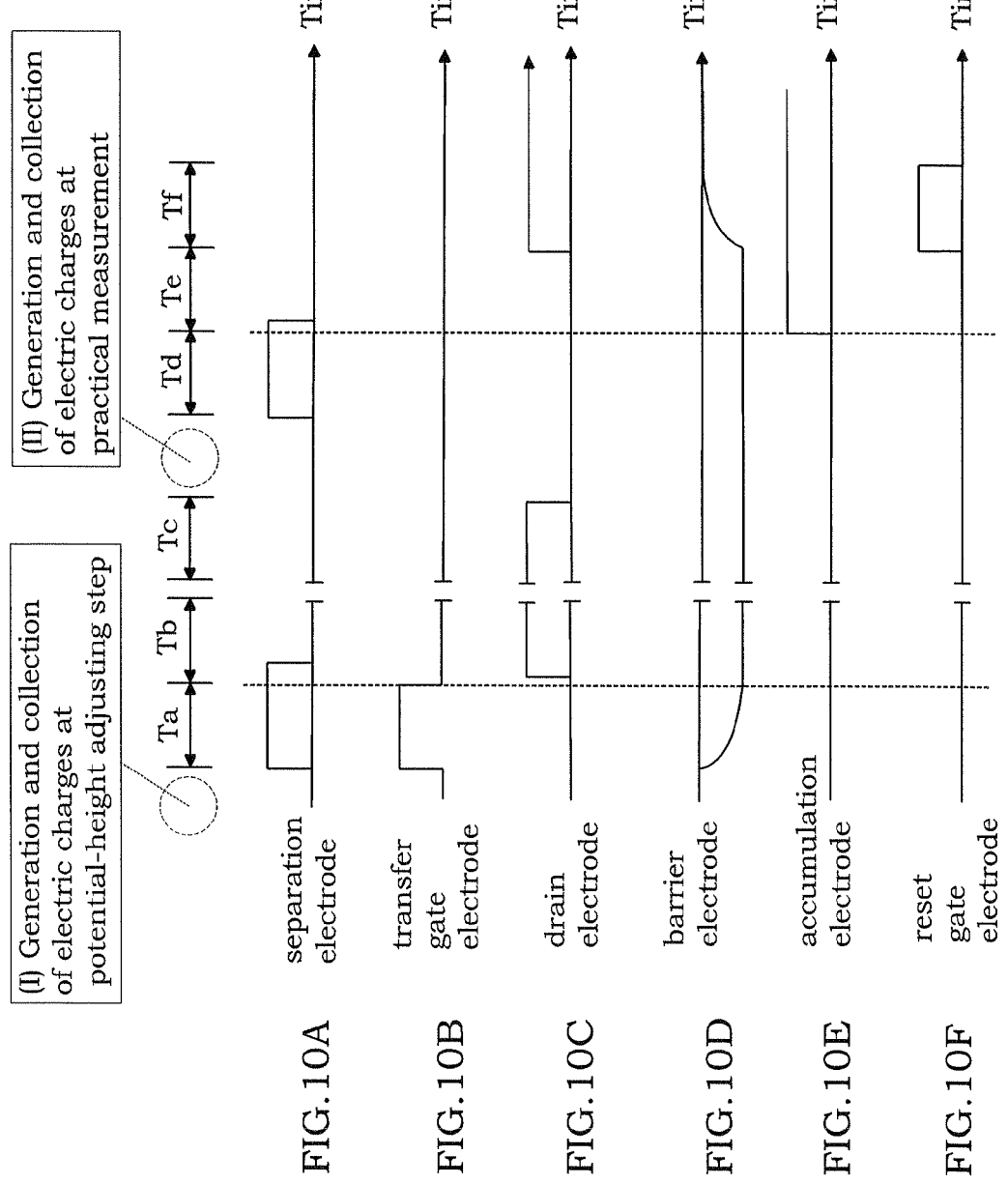

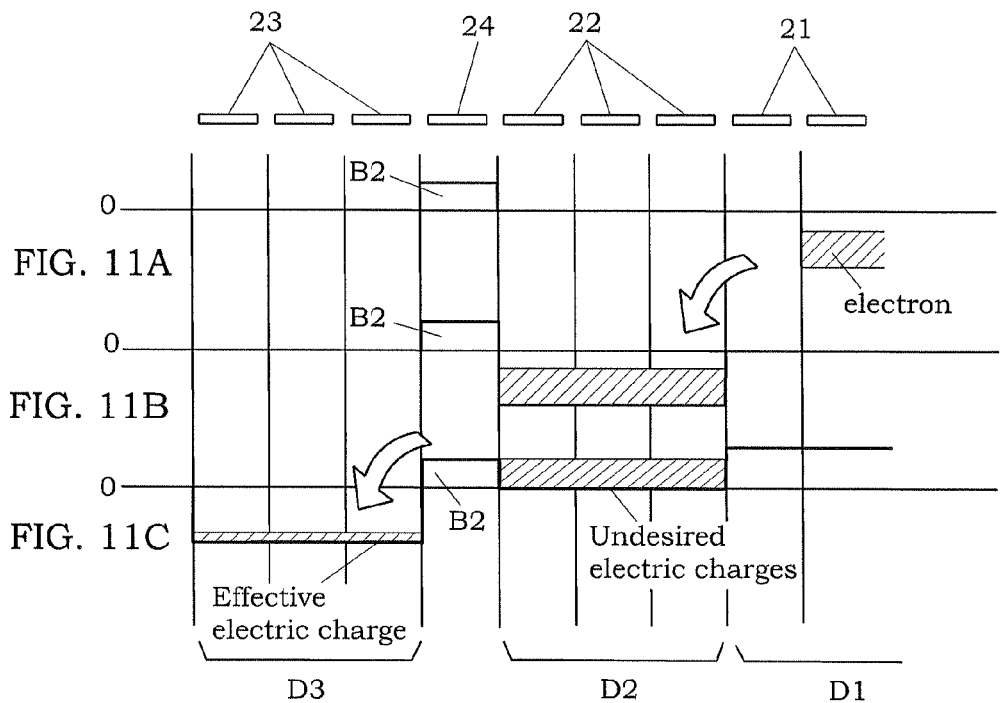
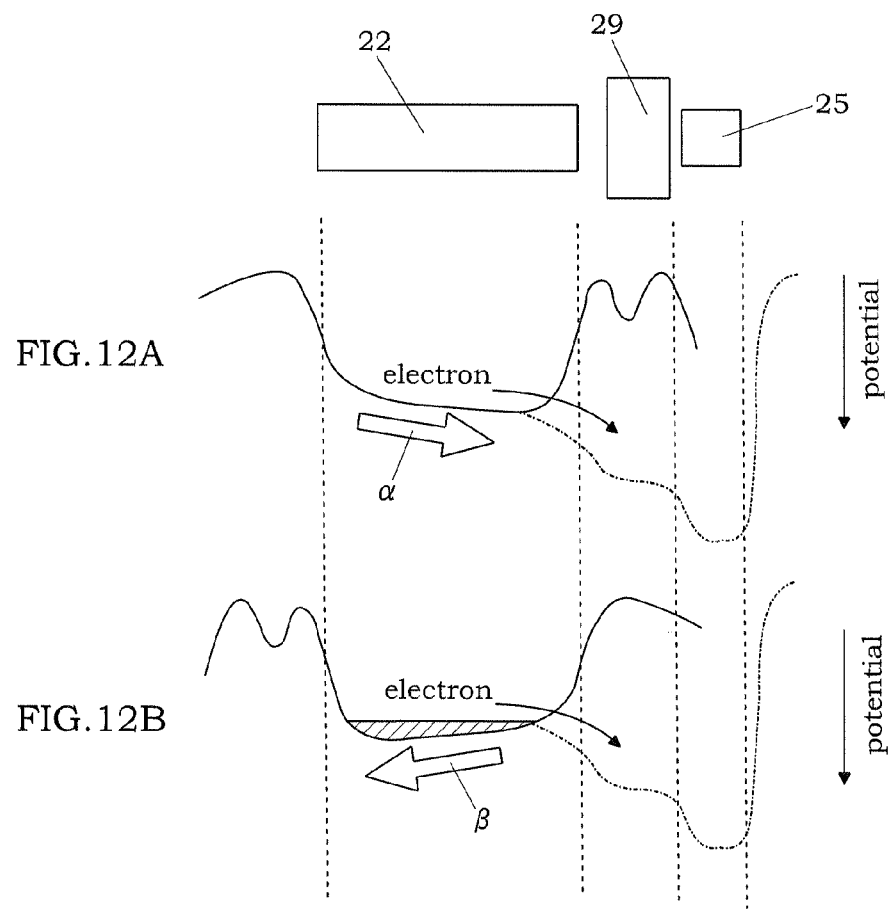

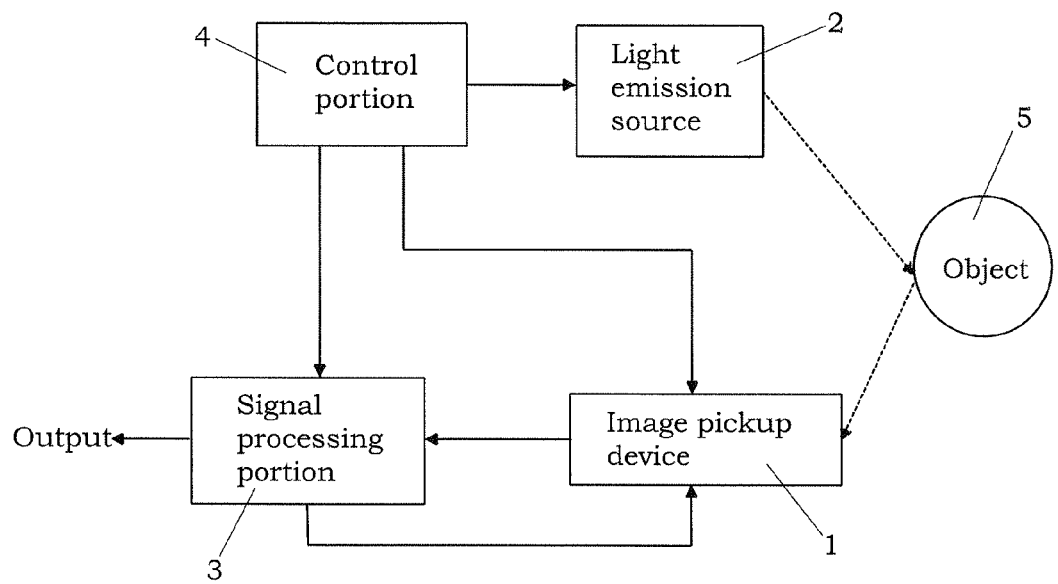
FIG.13
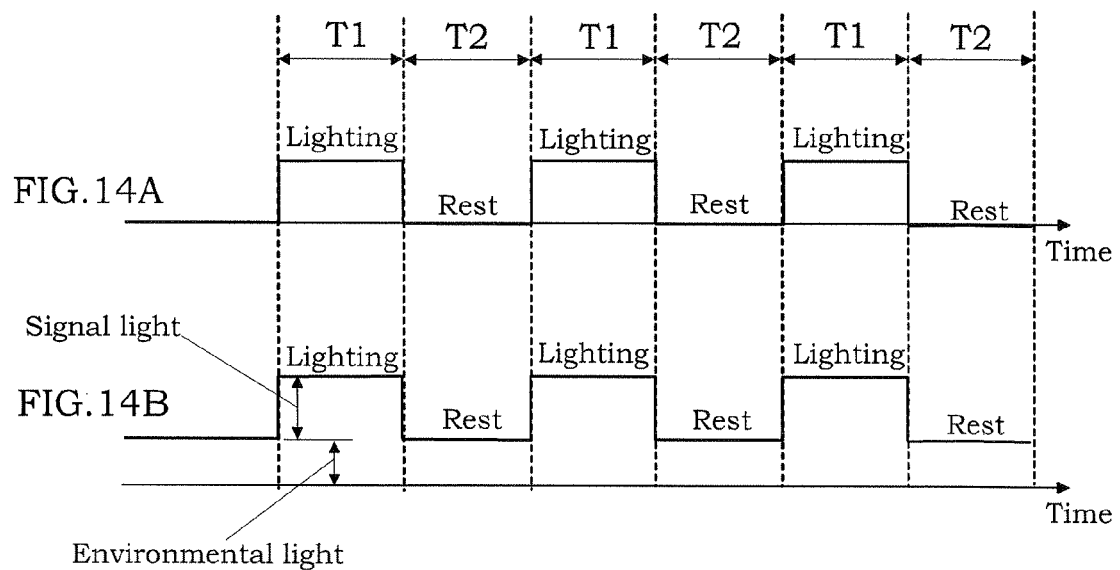
FIG.14A
FIG.14B

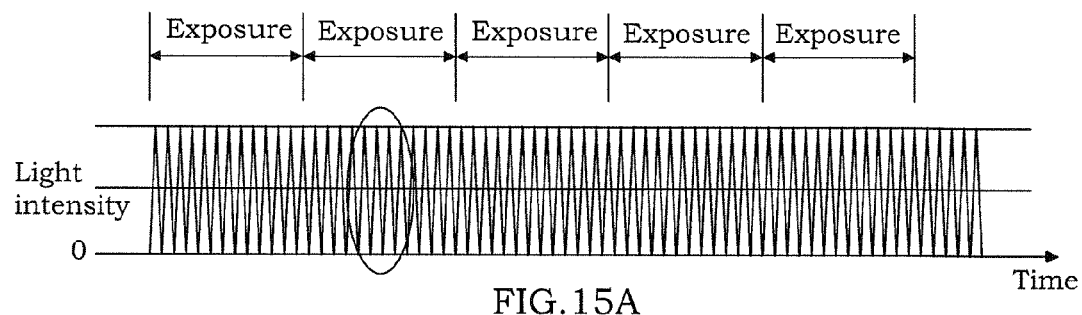
FIG.15A
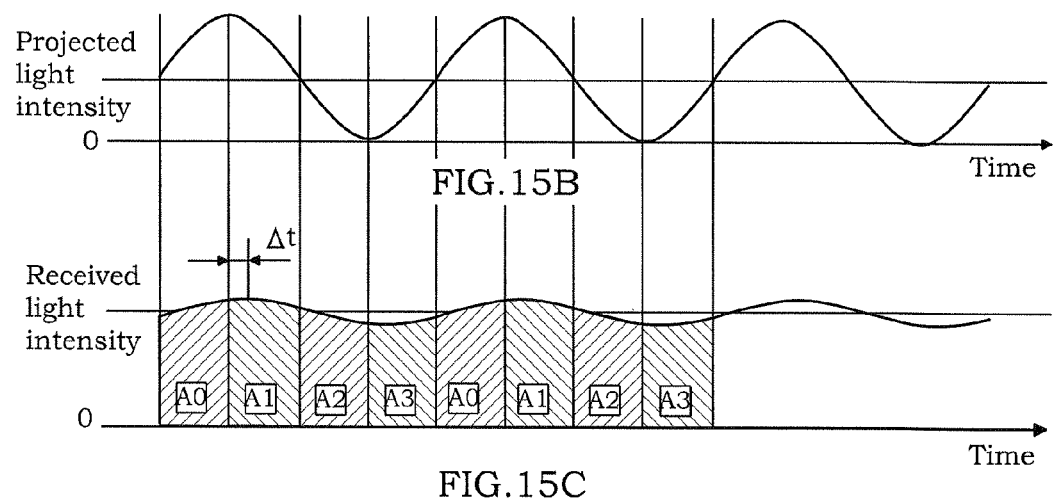
FIG.15B
FIG.15C

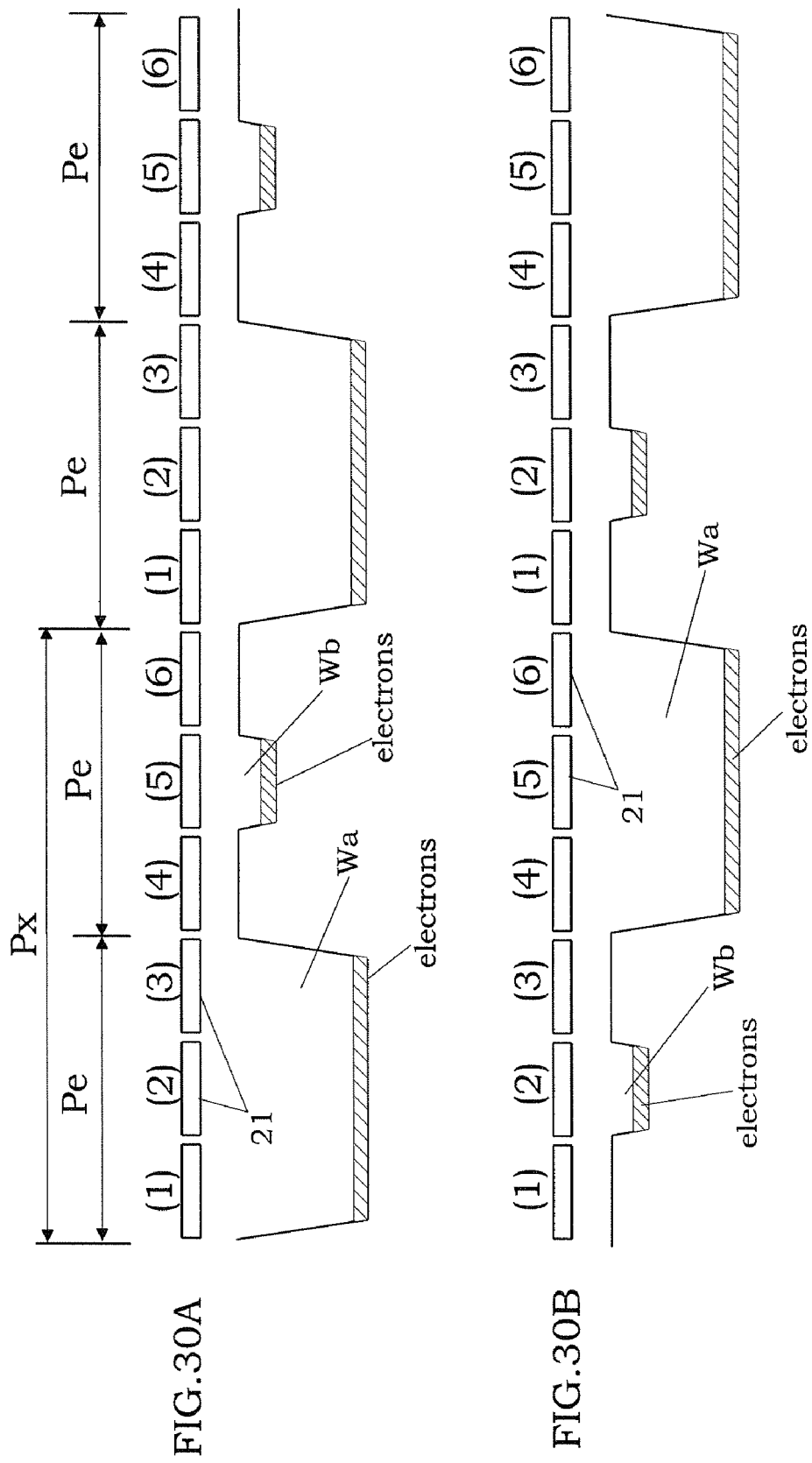

IMAGE PICKUP DEVICE, SPATIAL INFORMATION DETECTING APPARATUS USING THE SAME DEVICE AND METHOD FOR TAKING OUT RECEIVED-LIGHT OUTPUT FROM THE SAME DEVICE

TECHNICAL FIELD

The present invention relates to an image pickup device preferably used for an apparatus for detecting spatial information.

BACKGROUND ART

In an image pickup device for taking out electric charges corresponding to a received-light amount as a received-light output, as an exposure time becomes longer, the received-light amount increases. In general, an upper limit of the received-light output reflecting the received-light amount is determined depending on the size and the impurity concentration of the charge generating portion or the charge transfer portion. Therefore, even if the exposure time is extended, the received-light output accurately reflecting the received-light amount cannot be obtained when these portions are saturated. Thus, the extension of the exposure time does not always bring about an improvement in sensitivity.

For example, Japanese Patent Early Publication No. 2006-84430 discloses a distance image sensor, which comprises a light emission source for irradiating an intensity-modulated light into a target space, a light detecting element having a plurality of photosensitive portions for receiving light from the target space and generating electric charges corresponding to the received-light amount, a control circuit for controlling a light receiving period where the photosensitive portions receive the light from the target space, and a image generator for determining a distance to an object in the target space by use of electric charges generated by the photosensitive portions, and generating a distance image. In this image sensor, the control circuit controls the timing of transferring electric charges such that the light detecting element provides the electric charges collected for each of detection periods having different lengths to the image generator. In addition, the image generator selects an appropriate detection period from the detection periods having different lengths such that the electric charges collected for the appropriate detection period becomes maximum within a range not exceeding a permissible charge amount of the light detecting element, and determines the distance by use of the electric charges collected for the appropriate detection period.

Thus, the received-light output can be accurately obtained by preventing the photosensitive portions from saturation. However, since the received-light amount is adjusted by changing the length of the exposure time, it is impossible to obtain the electric charge amount more than the permissible charge amount of the light detecting element. In other words, to expand the dynamic range of the received-light output, for example, it is needed to increase the area of the photosensitive portions. However, it leads to an increase in size of the light detecting element.

SUMMARY OF THE INVENTION

Therefore, a primary concern of the present invention is to provide an image pickup device capable of expanding the dynamic range of the received-light output, i.e., achieving an improvement in sensitivity by preventing the saturation phenomenon without increasing photoelectric converting areas.

That is, the image pickup device of the present invention comprises a plurality of image pickup units formed on a semiconductor substrate. Each of the image pickup units comprises:
a light receiving array of photoelectric conversion elements, each of which is configured to receive light, and generate electric charges corresponding to a received-light amount;
a transfer array of charge transfer elements;
an accumulation array of charge accumulation elements, which is configured to accumulate the electric charges transferred from the light receiving array through the transfer array; and
a plurality of control electrodes, which are formed at regions corresponding to the photoelectric conversion elements on the semiconductor substrate through an insulating layer, and used to transfer the electric charges from the light receiving array to the transfer array;
wherein the transfer array and the light receiving array are arranged in a line in a first direction,
the accumulation array is disposed adjacent to the transfer array in a second direction substantially orthogonal to the first direction,
the transfer array and the accumulation array are disposed in a light shielding region, and
each of the charge accumulation elements has a charge storage capacity greater than a saturation charge amount of each of the photoelectric conversion elements.

According to the present invention, since the electric charges generated by each of the photoelectric conversion elements are accumulated in a corresponding charge accumulation element(s) separately formed from the photoelectric conversion element, and the charge storage capacity of the charge accumulation element is greater than the saturation charge amount of the photoelectric conversion element, it is possible to obtain an increased dynamic range of the image pickup device with respect to the received-light output. In other words, an improvement in sensitivity can be achieved. For example, each of the charge accumulation elements preferably has a large charge storage capacity in such a degree that several folds of the electric charge amount generated per one exposure operation by the photoelectric conversion element can be stored in the charge accumulation element, or a total amount of the electric charges obtained by repeating an operation of transferring the electric charges from the photoelectric conversion element to the transfer array plural times can be accumulated in the charge accumulation element.

In addition, since the electric charges are transferred from the light receiving array to the accumulation array through the transfer array, the light receiving array can be efficiently used to receive the light and generate the electric charges corresponding to the received-light amount during an operation of moving the electric charges from the transfer array to the accumulation array. As a result, this brings about an improvement in response speed. Furthermore, a reduction in frame rate can be prevented by cumulatively accumulating the electric charges in the charge accumulation elements without taking out the electric charges to the outside of the image pickup device every charge generating operation of the photoelectric conversion elements.

In the present invention, when the electric charges are transferred from the light receiving array to the accumulation array through the transfer array, it does not always mean that the photoelectric conversion elements correspond one-on-one with the charge accumulation elements. For example, each of the photoelectric conversion elements can be associated with an integral multiple of the charge accumulation element, e.g., two or four charge accumulation elements.

It is particularly preferred that each of the image pickup units further comprises a charge-amount adjusting portion configured to determine an amount of undesired electric charges to be separated from the electric charges generated by each of the photoelectric conversion elements, and the accumulation array and the charge-amount adjusting portion are arranged in a line in the first direction. In this case, after the undesired electric charges depending on environmental light other than a signal light are removed from the electric charges generated by the photoelectric conversion element, the remaining electric charges are sent as effective electric charges to the transfer array. Therefore, it is further effective to prevent the saturation phenomenon. In addition, when the charge amount adjusting portion is formed adjacent to the light receiving array in the second direction (e.g., a horizontal direction), and the accumulation array and the charge amount adjusting portion are disposed in a line in the first direction (e.g., a vertical direction), the charge-amount adjusting portion is efficiently arranged in each of the image pickup units. As a result, it is possible to provide the image pickup device having the function of separating the undesired electric charges without causing an increase in size of the image pickup unit.

It is also preferred that each of the charge transfer elements is a first impurity diffusion layer formed in the semiconductor substrate, and each of the charge accumulation elements is a second impurity diffusion layer formed in the semiconductor substrate to have a larger impurity concentration than the first impurity diffusion layer. In this case, it is possible to easily obtain the large charge storage capacity of the charge accumulation element without causing the increase in size of the image pickup unit.

In addition, it is preferred that each of the image pickup units further comprises a separation zone configured to provide a potential barrier between the accumulation array and the transfer array. Furthermore, it is preferred that each of the image pickup units further comprises at least one barrier control electrode formed at a region corresponding to the separation zone on the semiconductor substrate through an insulating layer. In this case, it is possible to prevent that electric charges of the transfer array are mixed with the electric charges of the accumulation array in a period where the transfer array receives the electric charges from the light receiving array. In addition, after the electric charges are transferred from the light receiving array to the transfer array, they can be accurately accumulated in a desired charge accumulation element(s) by controlling a height of a potential barrier formed in the separation zone to move the electric charges from the transfer array to the accumulation array. In particular, it is possible to smoothly move the electric charge from the transfer array to the accumulation array by appropriately controlling voltages applied to the transfer control electrode, the accumulation control electrode and the barrier control electrode.

In addition, it is preferred that each of the image pickup units comprises at least one of a first slit region formed between the separation zone and the charge transfer element and a second slit region formed between the separation zone and the charge accumulation element, and the first slit region is a third impurity diffusion layer formed in the semiconductor substrate to have a larger impurity concentration than the first impurity diffusion layer, and the second slit region is a fourth impurity diffusion layer formed in the semiconductor substrate to have a larger impurity concentration than the second impurity diffusion layer. In this case, the movement of electric charges from the transfer array to the accumulation array can be further accelerated by the formation of a potential gradient(s) in the charge transfer element and/or the charge accumulation element. In addition, due to the potential barrier formed between the charge transfer element and the charge accumulation element, it is possible to prevent that electric charges are mixed therebetween.

In addition, it is preferred that each of the image pickup units further comprises an overflow drain formed adjacent to the accumulation array. Furthermore, it is preferred that each of the image pickup units further comprises an overflow drain formed adjacent to each of the photoelectric conversion elements, and a buffer region having no overflow drain, which is provided between the light receiving array and the transfer array. In this case, the buffer region prevents potential interference between the overflow drain adjacent to the accumulation array and the overflow drain adjacent to the photoelectric conversion element. That is, it is possible to prevent that the electric charges of the light receiving array flow into the overflow drain adjacent to the accumulation array, or the electric charges of the transfer array flow into the overflow drain adjacent to the photoelectric conversion element. As a result, the electric charge amount accurately reflecting the received-light amount can be accumulated in the accumulation array. The buffer region may be also used as a space for wirings.

Another concern of the present invention is to provide a spatial information detecting apparatus using the above-explained image pickup device. That is, the spatial information detecting apparatus of the present invention is characterized by comprising:
a light emission source configured to irradiate a light intensity-modulated by a modulation signal to a target space;
the above-described image pickup device for receiving light from the target space, generating electric charges corresponding to a received-light amount, and outputting the electric charges as a received-light output; and
an analyzer configured to determine spatial information of the target space according to the received-light output of the image pickup device.

The spatial information detecting apparatus described above preferably comprises a controller configured to control a control voltage applied to the control electrodes to change an aperture area of a potential well formed in the semiconductor substrate such that the aperture area of the potential well is switched between a charge collecting period where the potential well has a large aperture area and a charge holding period where the potential well has a small aperture area. In this case, a distance measuring apparatus for determining a distance to an object in the target space can be achieved by using the image pickup device of the present invention. It is also preferred that the light emission source irradiates the intensity-modulated light to a target space so as to alternately repeat a lighting period where the intensity-modulated light is irradiated to the target space, and a rest period where the intensity-modulated light is not irradiated to the target space. In this case, an object detecting apparatus for checking the presence or absence of an object in the target space can be achieved by using the image pickup device of the present invention.

A further concern of the present invention is to provide a method for taking out a received-light output from the above-described image pickup device. That is, the charge take-out method of the present invention is characterized by comprising the steps of: repeating an exposure-accumulation operation plural times, which comprises the steps of receiving light from a target space with the light receiving array of the image pickup device to generate electric charges corresponding to a received-light amount, transferring the generated electric charges from the light receiving array to the accumulation array through the transfer array of the image pickup device, and accumulating the transferred electric charges in the accumulation array; and taking out, as a received-light output, a total amount of the electric charges accumulated in the accumulation array by repeating the exposure-accumulation operation plural times.

In the charge take-out method described above, it is preferred that the exposure-accumulation operation comprises the steps of irradiating a light intensity-modulated by a modulation signal to a target space, and receiving the light from the target space by the light receiving array to generate electric charges corresponding to the received-light amount in a predetermined phase zone of the modulation signal. In this case, it is suitable to determine a distance to an object in the target space. Alternatively, it is preferred that the exposure-accumulation operation comprises the steps of irradiating an intensity-modulated light to a target space so as to alternately repeat a lighting period where the intensity-modulated light is irradiated to the target space, and a rest period where the intensity-modulated light is not irradiated to the target space, and receiving the light from the target space by the light receiving array to generate electric charges corresponding to the received-light amount in each of the lighting period and the rest period. In this case, it is suitable to check the presence or absence of an object in the target space.

Further characteristics of the present invention and advantages brought thereby will be clearly understood from the best mode for carrying out the invention described below.

BRIEF EXPLANATION OF THE DRAWINGS

FIGS. 10A to 10F are operation explanatory diagrams of the image pickup device;

FIGS. 11A to 11C are diagrams showing potential changes in an operation of the image pickup device;

FIG. 12A is a diagram showing a potential change in the image pickup device of the present embodiment, and FIG. 12B is a diagram showing a potential change in another image pickup device;

FIG. 13 is a block diagram of a spatial information detecting apparatus using the image pickup device of the present invention;

FIGS. 14A and 14B are explanatory diagrams of an intensity detecting operation of the spatial information detecting apparatus;

FIGS. 15A to 15C are explanatory diagrams of a distance measuring operation of the spatial information detecting apparatus;

FIGS. 30A and 30B are explanatory diagrams showing a charge collecting operation and a charge holding operation, respectively.

BEST MODE FOR CARRYING OUT THE INVENTION

The image pickup device of the present invention and the spatial information detecting apparatus using the same device are explained below in detail according to preferred embodiments shown in the attached drawings.

In the following embodiments, a two dimensional image sensor is explained as the image pickup device of the present invention. In this image sensor, a plurality of pixels are arranged along a vertical direction to form a pixel row, and a plurality of the pixel rows are arranged in a horizontal direction to obtain a matrix arrangement of pixels. To facilitate the understanding of the present invention, a range equivalent to one pixel is mainly explained. The technical concept of the present invention is also available in a device requiring the configuration equivalent to one pixel of the two dimensional image sensor, or a one dimensional (linear) image sensor having plural pixels arranged in a single row.

(Basic Configuration)

Figure 1:
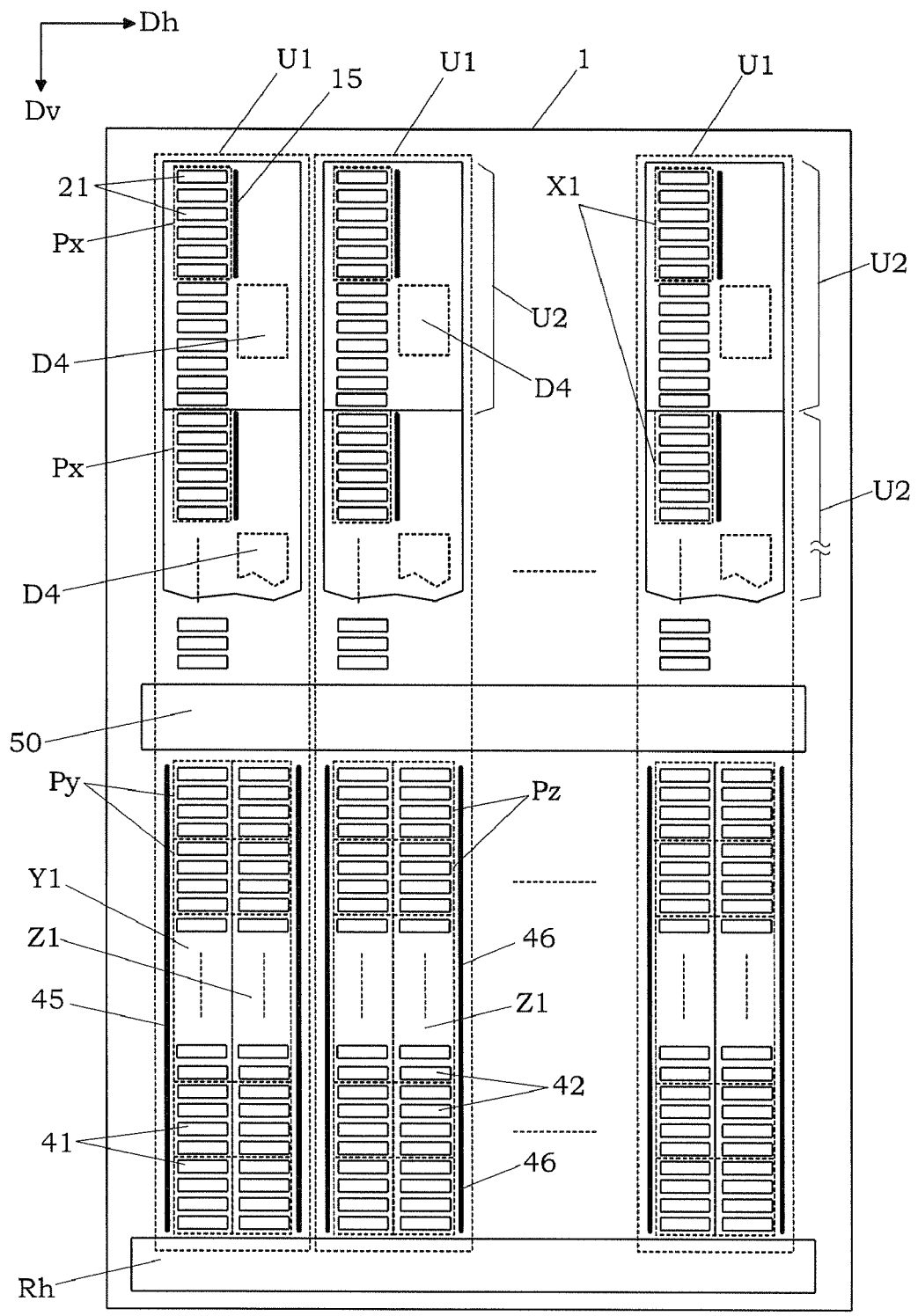
FIG. 1 is a schematic top view of an image pickup device according to a preferred embodiment of the present invention.

As shown in FIG. 1, the image pickup device 1 has a plurality of image pickup units U1 arranged on a single semiconductor substrate. In FIG. 1, a longitudinal direction of the image pickup unit U1 corresponds to the vertical direction Dv, and a lateral direction thereof corresponds to the horizontal direction Dh. Each of the image pickup units U1 is mainly formed with a plurality of charge generation units U2 arranged in the vertical direction Dv, and, a transfer array Y1 of charge transfer elements Py, an accumulation array Z1 of charge accumulation elements Pz formed adjacent to the transfer array, a buffer region 50 extending in the horizontal direction Dh between the lowest one of the charge generation units U2 and the top ends of the transfer array Y1 and the accumulation array Z1, and a horizontal transfer resistor Rh formed at the bottom ends of the transfer array Y1 and the accumulation array Z1.

Figure 2:
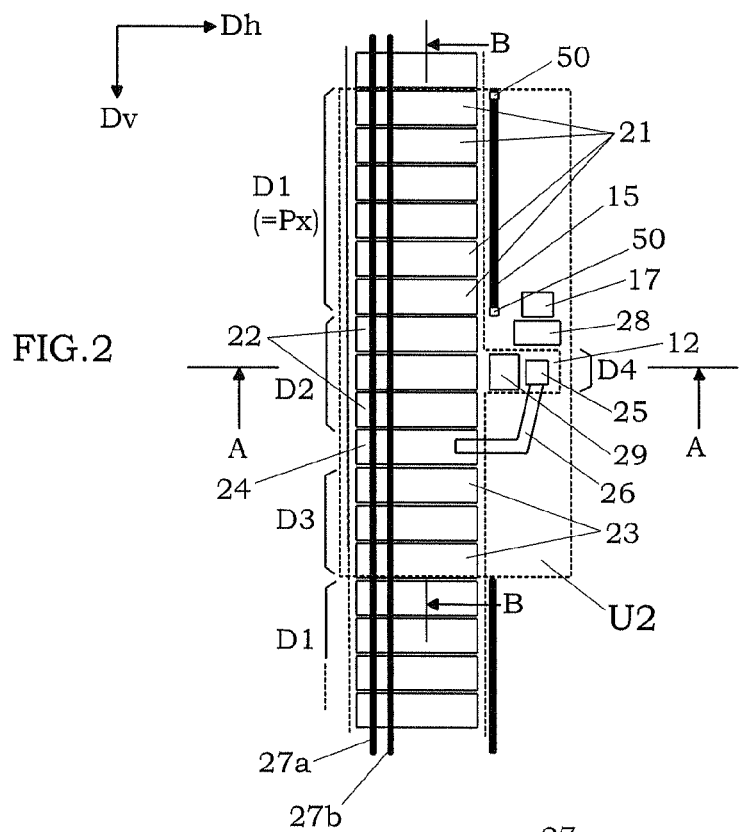
FIG. 2 is a top view showing a charge generation area including a light receiving array of the image pickup unit.

In each of the image pickup unit U1, since a photoelectric conversion element Px for receiving light and generating electric charges corresponding to a received-light amount is included in each of the charge generation units U2 arranged in the vertical direction Dv, it means that the vertical arrangement of the charge generation units U2 provides a light receiving array X1 of the photoelectric conversion elements Px. As shown in FIG. 2, each of the charge generation units U2 comprises a charge generating portion D1 corresponding to the photoelectric conversion element Px, a charge separating portion D2, a charge accumulating portion D3, and a charge-amount adjusting portion D4. In addition, a light shielding film 70 is formed on a region other than the charge generating portion D1 in the charge generation unit U2. In some instances, the light-shielding film 70 on the charge-amount adjusting portion D4 may be omitted.

In this embodiment, each of the charge generation units U2 corresponds to one image pickup pixel. Therefore, a matrix pattern of the image pickup pixels is obtained in the image pickup device 1.

Figure 4A:
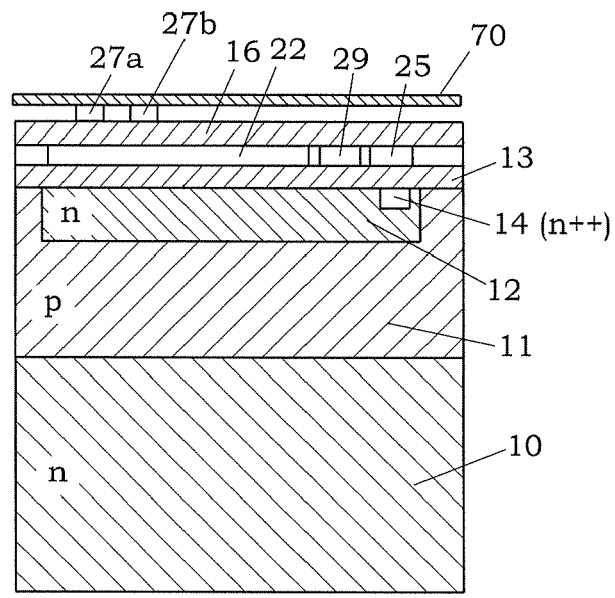
FIG. 4A is a cross-sectional view taken along the line A-A in FIG. 2.
Figure 4B:
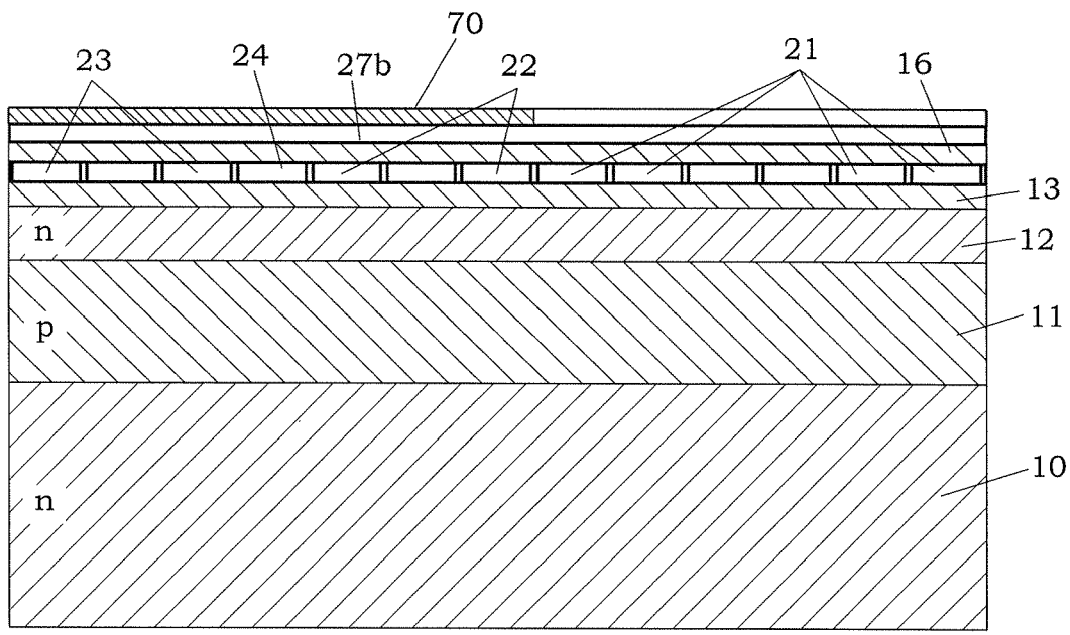
FIG. 4B is a cross sectional view taken along the line B-B in FIG. 2.

As shown in FIGS. 4A and 4B, the charge generation units U2 is formed with a substrate 10, a device formation layer 11 formed on the substrate 10 by a semiconductor material (e.g., silicon) of a first conductive type (e.g., "p" type), a well 12 formed over a required depth from the general surface (i.e., the top surface) of the device formation layer 11 by a semiconductor material of a second conductive type (e.g., "n" type), an insulating layer 13 such as silicon oxide or silicon nitride formed on the general surface of the well 12 as well as the general surface of the device formation layer 11, and electrodes disposed on the insulating layer 13. The electrodes comprise control electrodes 21, separation electrodes 22, accumulation electrodes 23, and a barrier electrode 24.

In this embodiment, the substrate 10 is formed by a semiconductor material of the second conductive type (e.g., "n" type). In the well 12, a well of the second conductive type having a higher impurity concentration (i.e., "n++" type) than the well 12 is formed as a charge holding well 14. An end portion 25 of a connection line 26 is connected to a position above the charge holding well 14 through an insulating layer 13, the other end of the connection line 26 is connected to the barrier electrode 24. Alternatively, an ohmic connection may be formed between the charge holding well 14 and the end portion 25 of the connection line 26.

In the plan view, each of the control electrodes 21, the separation electrodes 22, the accumulation electrodes 23 and the barrier electrode 24 is configured in a substantially same rectangular shape. In addition, these electrodes are arranged in a line in the vertical direction Dv, and in substantially parallel to each other in the horizontal direction Dh. In this embodiment, six control electrodes 21, three separation electrodes 22, single barrier electrode 24 and three accumulation electrodes 23 are disposed in each of the charge generation units U2. These electrodes may be formed in different shapes or dimensions from each other. As an example, a size of the barrier electrode 24 in the longitudinal direction (i.e., the horizontal direction Dh) may be formed to be larger than the sizes of the separation electrode 22 and the accumulation electrode 23.

In this embodiment, the charge holding well 14 is positioned adjacent to a center one of the three separation electrodes 22 in the horizontal direction Dh. In addition, an overflow drain 15 is formed as a charge discarding portion adjacent to the control electrodes 21 (i.e., the photoelectric conversion element Px). For example, the overflow drain 15 can be defined as an elongate region of the second conductive type having a higher impurity concentration than the well 12. The overflow drain 15 is directly connected to a drain electrode 50 such as a contact pad not through the insulating layer 13. In the present embodiment, the drain electrodes 50 are disposed on opposite end portions of the overflow drain 15, which are electrically connected to drain electrodes (not shown) on overflow drains of adjacent charge generation units U2 in a bus-wiring manner.

In addition, both of the overflow drain 15 and the charge holding well 14 are formed at one side (i.e., the right side in FIG. 2) of the electrode arrangement in the vertical direction Dv. In addition, the well 12 formed under the center separation electrode 22 overhangs in the horizontal direction Dh, as show in FIG. 4A, so that the charge holding region 14 is disposed in the well 12. On the other hand, the well 12 is not formed in a region corresponding to the overflow drain 15.

The overflow drain 15 can be used to discard the undesired electric charges from the charge separating portion D2 as well as the residual electric charges from the charge generating portion D1 (=the photoelectric conversion element Px). When it is not needed to discard the residual electric charges from the charge generating portion D1, the overflow drain 15 may be omitted. In this case, the same configuration as the charge-amount adjusting portion D4 described later can be used to discard the undesired electric charges from the charge separating portion D2.

The control electrodes 21 have translucency. It is desired that the separation electrodes 22, the accumulation electrodes 23, and the barrier electrode 24 do not have translucency. In the case of simultaneously forming these electrodes, all of them may have translucency. In FIGS. 4A and 4B, a window portion is formed at a region corresponding to the control electrodes 21 (=the charge generating portion D1) with respect to each of the charge generating units U2, and the other region is covered by the light shielding film 70. In the following explanation, electrons are used as the electric charges generated by the charge generating portion D1. In the case of using holes as the electric charges, it is needed to reverse each of the conductive types described above and the polarities of voltages explained later.

The region where the six control electrodes 21 are disposed on the well 12 corresponds to the charge generating portion D1. The charge generating portion D1 functions as the photoelectric conversion element Px for generating electric charges by receiving light through the window portion. A region having the separation electrodes 22 is defined as the charge separating portion D2 for separating undesired electric charges from the electric charges generated by the charge generating portion D1 by use of a potential barrier, which is formed under the barrier electrode 24 by applying a voltage to the barrier electrode. A region having the accumulation electrodes 23 is defined as the charge accumulating portion D3 for temporarily accumulating effective electric charges that are electric charges flowing from the charge separating portion D2 into the charge accumulating portion D3 over the potential barrier. In addition, a region including the charge holding well 14 under the end portion 25 of the connection line 26 is defined as the charge-amount adjusting portion D4 for determining the voltage applied to the barrier electrode 24 according to an electric charge amount supplied from the charge separating portion D2 to adjust a height of the potential barrier, as described later.

As described above, the barrier electrode 24 is electrically connected to the charge holding well 14 through the connection line 26. The connection line 26 can be formed by a metal wiring. The barrier electrode 14 has the same potential as the charge holding well 14. Therefore, when electric charges are held in the charge holding well 14, a voltage is applied to the barrier electrode 24 depending on the electric charge amount of the charge holding well 14. In other words, the barrier electrode 24 is charged depending on the electric charge amount of the charge holding well 14.

In this embodiment, when electrons are held in the charge holding well 14, a negative voltage is applied to the barrier electrode 24, so that a potential barrier formed under the barrier electrode becomes high with respect to electrons. That is, the region corresponding to the barrier electrode 24 has a higher potential height with respect to electrons than the charge separating portion D2 corresponding to the separation electrodes 22 and the charge accumulating portion D3 corresponding to the accumulation electrodes 23. Thus, the potential barrier is formed between the charge separating portion D2 and the charge accumulating portion D3. A height of the potential barrier formed under the barrier electrode 24 changes depending on the electric charge amount held in the charge holding well 14 (i.e., the charge-amount adjusting portion D4).

Potentials of the barrier electrode 24 and the charge holding well 14 are determined by the electric charge amount held in the charge-amount adjusting portion D4. On the other hand, voltages applied to the control electrodes 21, the separation electrodes 22 and the accumulation electrodes 23 are individually controlled. For example, positive and negative voltages (+10V, −5V) are applied at appropriate timings. When either one of two electric-power wirings (27a, 27b) is ohmic-connected to the control electrodes 21, the separation electrodes 22 and the accumulation electrodes 23, it is preferred that the electric-power wirings (27a, 27b) are formed by metal wirings. In addition, when the electric-power wirings (27a, 27b) are not connected to the control electrodes 21, the separation electrodes 22 and the accumulation electrodes 23, these electrodes are insulated from the electric-power wirings (27a, 27b) by an insulation layer 16 such as silicon oxide or silicon nitride.

In addition, a reset gate electrode 28 is formed adjacent to the charge-amount adjusting portion D4 in the vertical direction Dv on the general surface of the device formation layer 11, and a reset electrode 17 is located adjacent to the reset gate electrode 28. In the plan view, the reset gate electrode 28 is disposed between a reset drain formed at a region corresponding to the reset electrode 17 and the charge holding well 14 of the charge-amount adjusting portion D4. In addition, both of the reset gate electrode 28 and the reset electrode 17 are provided at one side of the charge-amount adjusting portion D4 in the vertical direction Dv. In FIG. 2, they are provided at the upper side of the charge-amount adjusting portion D4. In addition, as shown in FIG. 2, the reset electrode 17 is spaced in the horizontal direction Dh from the lowermost one of the six control electrodes 21 in the horizontal direction Dh, i.e., the control electrode 21 adjacent to the uppermost one of the three separation electrodes 22. On the other hand, the reset gate electrode 28 is spaced in the horizontal direction Dh from the uppermost one of the three separation electrodes 22, i.e., the separation electrode 22 adjacent to the lowermost one of the six control electrodes 21. The reset drain is defined as a region of the second conductive type (n++) having a high impurity concentration, and directly connected to the reset electrode 17 not through the insulating layer 13. A constant reset voltage is applied to the reset electrode 17.

In addition, in the plan view of FIG. 2, a transfer gate electrode 29 is disposed between a center one of the three separation electrode 22 and the end portion 25 of the connection line 26 positioned above the charge holding well 14. By applying an appropriate voltage to the transfer gate electrode 29, a channel is formed under the transfer gate electrode 29 to enable the movement of electric charges from the charge separating portion D2 to the charge-amount adjusting portion D4.

By the way, a region including the separation electrodes 22, the accumulation electrodes 23, the barrier electrode 24, the reset gate electrode 28, the transfer gate electrode 29, the rest drain (the reset electrode 17) and the charge-amount adjusting portion D4 is defined as a charge weighing area. The separation electrodes 22, the accumulation electrodes 23 and the barrier electrode 24 of the charge weighing area, the control electrodes 21 formed on the photoelectric conversion element Px, and the transfer array Y1 of the charge transfer elements Py are arranged in a first line in the vertical direction Dv. On the other hand, the charge-amount adjusting portion D4, the rest gate electrode 28, the transfer gate electrode 29 and the reset drain (the rest electrode 17) of the charge weighing area, and the accumulation array Z1 of the charge accumulation elements Pz are arranged in a second line parallel to the first line. In brief, in each of the image pickup units U1, the second line including the accumulation array Z1 and the charge-amount adjusting portion D4 is disposed adjacent to the first line including the light receiving array X1 of the photoelectric conversion elements Px, and the transfer array Y1 in the horizontal direction Dh such that they extends in parallel to each other in the vertical direction Dv.

Figure 3:
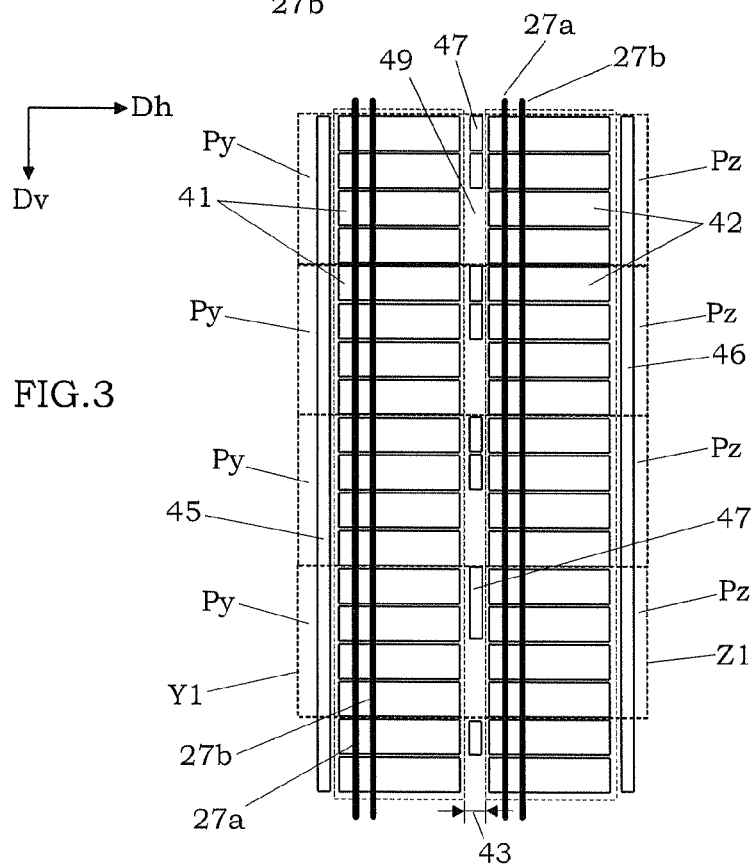
FIG. 3 is a top view showing a transfer array and an accumulation array of the image pickup unit.

Next, the transfer array Y1 the charge transfer elements Py is explained. As shown in FIG. 3, the charge transfer elements Py are used to transfer the electric charges (i.e., effective electric charges) from the charge generation units U2 to the charge accumulation elements Pz of the accumulation array Z1. The electric charges in the charge generation units U2 can be transferred to the transfer array Y1 by controlling voltages applied to the control electrodes 21, the separation electrodes 22, the accumulation electrodes 23, the barrier electrodes 24 and the transfer control electrodes 41. The transfer array Y1 and the light receiving array X1 are disposed in a line in the vertical direction Dv. The transfer array Y1 is disposed in a light-shielding region. For example, the transfer array Y1 is covered by the light shielding film 70.

In this embodiment, each of the charge transfer elements Py is a first impurity diffusion layer formed in the semiconductor substrate, and at least one transfer control electrode 41 is formed at a region corresponding to each of the charge transfer elements Py on the general surface of the well 12 through the insulating layer 13. In this embodiment, four transfer control electrodes 41 placed at the region corresponding to the charge transfer element Py are four-phase driven. The shape and the size of the transfer control electrode 41 are not limited to specific ones. In the present embodiment, the shape and the size of the transfer control electrode 41 are the same as those of the control electrode 21. In addition, an interval between adjacent transfer control electrodes 41 is set to be the same as the interval between adjacent control electrodes 21, the interval between adjacent separation electrodes 22, the interval between adjacent accumulation electrodes 23, and the interval between the barrier electrode 24 and the separation electrode 22 or the accumulation electrode 23.

Next, the accumulation array Z1 of the charge accumulation elements Pz is explained. As shown in FIG. 3, the accumulation array Z1 is formed adjacent to the transfer array Y1 in the horizontal direction Dh such that each of the charge accumulation elements Pz is disposed in a face-to-face relation with each of the charge transfer elements Py. Therefore, in each of the image pickup unit U1, the number of the charge accumulation elements Pz is the same the number of the charge transfer elements Py. Each of the charge accumulation elements Pz has a greater charge storage capacity than a saturation charge amount of each of the photoelectric conversion elements Px. In addition, the accumulation array Z1 is disposed in a light-shielding region. For example, the transfer array Z1 is covered by the light shielding film 70.

The accumulation array Z1 and the transfer array Y1 are disposed in parallel to each other in the vertical direction Dv. In addition, the accumulation array Z1 and an array of the charge-amount adjusting portions D4 of the charge generation units U2 are disposed in a line in the vertical direction Dv. In this case, there is an advantage that the image pickup device can be downsized as a whole by efficiently arranging the light receiving array X1, the transfer array Y1, the accumulation array 21 and the array of the charge-amount adjusting portions D4 in each of the image pickup units U1 without wasting space. In addition, since the accumulation array Z1 is disposed away from the light receiving array X1 on the semiconductor substrate, it is possible to prevent an increase in dark current of the photoelectric conversion elements Px.

In addition, the charge accumulation element Pz has a larger charge storage capacity than the charge transfer element Py. In the present embodiment, to prevent an increase in size of the image pickup unit U1, each of the charge accumulation elements Pz is a second impurity diffusion layer formed in the semiconductor substrate to have a larger impurity concentration than the first impurity diffusion layer of the charge transfer element Py.

For example, when the charge transfer element Py is formed in "n" type, the charge accumulation element Pz is formed in "n+" type. In this case, since a potential well W2 formed in the charge accumulation element Pz has a larger depth than the potential well W1 formed in the charge transfer element Py, a larger amount of electric charges can be accumulated in the charge accumulation element Pz.

In the accumulation array Z1, at least one accumulation control electrode 42 is formed at a region corresponding to each of the charge accumulation elements Pz on the general surface of the well 12 through the insulating layer 13. In this embodiment, four accumulation control electrodes 42 placed at the region corresponding to each of the charge accumulation elements Pz are four-phase driven. Alternatively, six or eight accumulation control electrodes 42 may be placed at the region corresponding to each of the charge accumulation elements Pz. In addition, when a potential well is formed in a region corresponding to two or more of the four accumulation control electrodes 42, it is possible to obtain a larger charge storage capacity of the charge accumulation element Pz. The shape and the size of the accumulation control electrode 42 are not limited to specific ones. In the present embodiment, the shape and the size of the accumulation control electrode 42 are the same as those of the control electrode 21. In addition, an interval between adjacent accumulation control electrodes 42 is set to be the same as the interval between adjacent transfer control electrodes 41.

The number of the charge accumulation elements Pz is not specifically limited. It is preferred that the number of the charge accumulation elements Pz is equal to the number of the charge transfer elements Py. In addition, when the number of the charge accumulation elements Pz is equal to the number of the photoelectric conversion elements Px, the photoelectric conversion elements correspond one-on-one with the charge accumulation elements. On the other hand, when the number of the charge accumulation elements Pz is different from the number of the photoelectric conversion elements Px, each of the photoelectric conversion elements can be associated with an integral multiple of the charge accumulation element Pz, e.g., two or four charge accumulation elements Pz.

Figure 5:
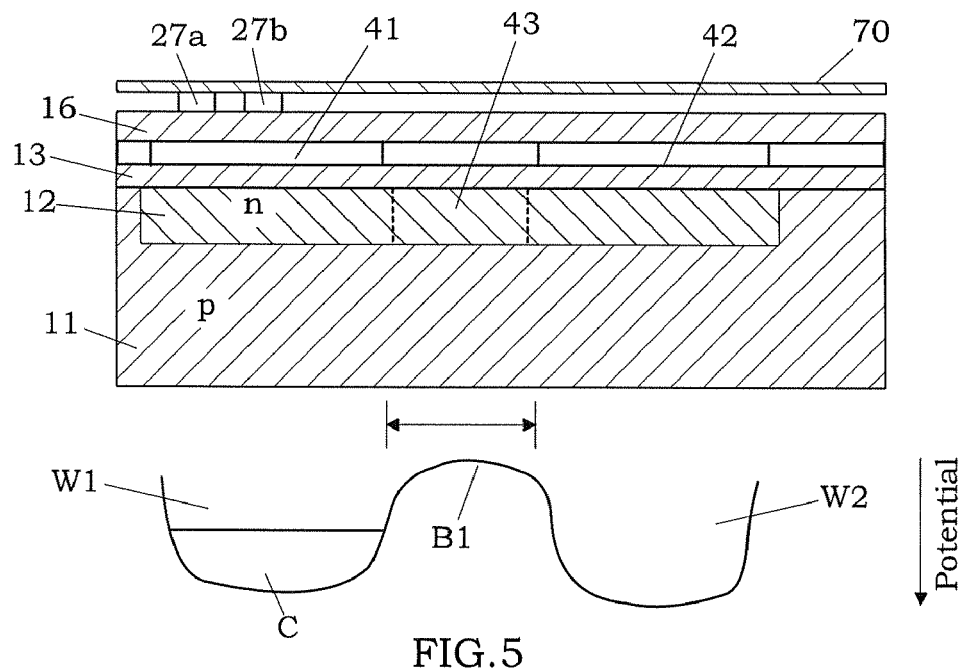
FIG. 5 is a cross-sectional view showing a separation zone formed between the transfer array and the accumulation array of the image pickup unit.

In each of the image pickup unit U1, a separation zone 43 is formed to provide a potential barrier between the transfer array Y1 and the accumulation array Z1. That is, as shown in FIG. 5, when potential wells (W1, W2) are formed in the well 12 under the transfer control electrode 41 and the charge accumulation electrode 41 by applying appropriate voltages these electrodes, a potential barrier B1 can be obtained between the potential wells (W1, W2), i.e., between the charge transfer element Py and the charge accumulation element Pz. In FIG. 5, "C" designates electric charges (i.e., effective electric charges) existing in the potential well.

Figure 6:
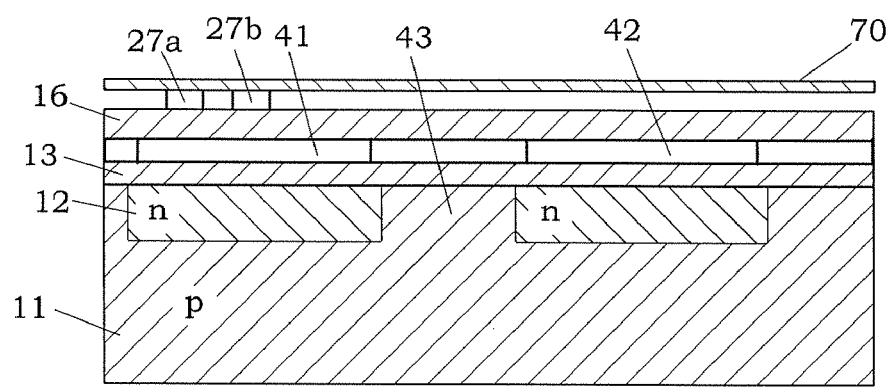
FIG. 6 is a cross-sectional view showing the separation zone according to a modification of the present embodiment.
Figure 7:
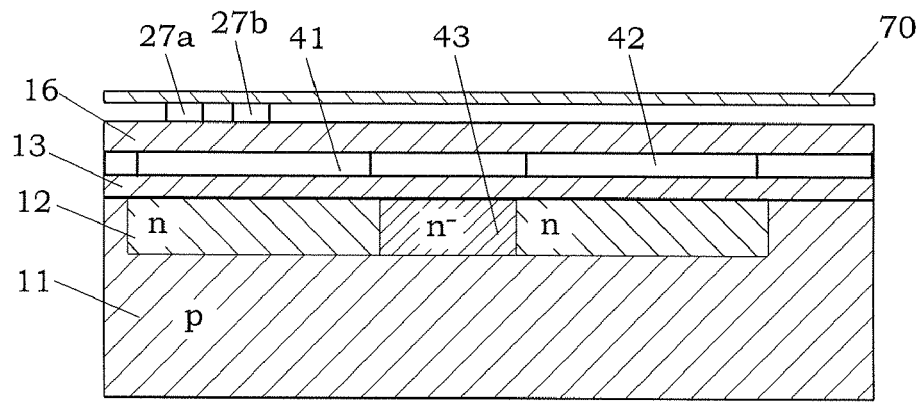
FIG. 7 is a cross-sectional view showing the separation zone according to another modification of the present invention.

In addition, as shown in FIG. 6, when a part of the device formation layer 11 having the different conductive type from the well 12 is put between the accumulation array Z1 and the transfer array Y1, it can function as the separation zone 43. That is, since the well 12 for the accumulation array Z1 and the transfer array Y1 is "n" type, and the device formation layer 11 is "p" type, the potential barrier B1 can be obtained between the accumulation array Z1 and the transfer array Y1. Alternatively, as shown in FIG. 7, the separation zone 43 may be formed to have the same the conductive type as the well 12, and a lower impurity concentration ("N−" type) than the well 12.

By forming the separation zone 43, it is possible to prevent that the electric charges are mixed between the transfer array Y1 and the accumulation array Z1 during a charge transfer operation from the charge generation units U2 (i.e., the light receiving array X1) to the transfer array Y1. In addition, when the potential barrier B1 is pulled down by controlling the applied voltages to the transfer control electrode 41 and the accumulation control electrode 42, the electric charges can be moved from the transfer array Y1 to the accumulation array Z1.

Figure 8A:
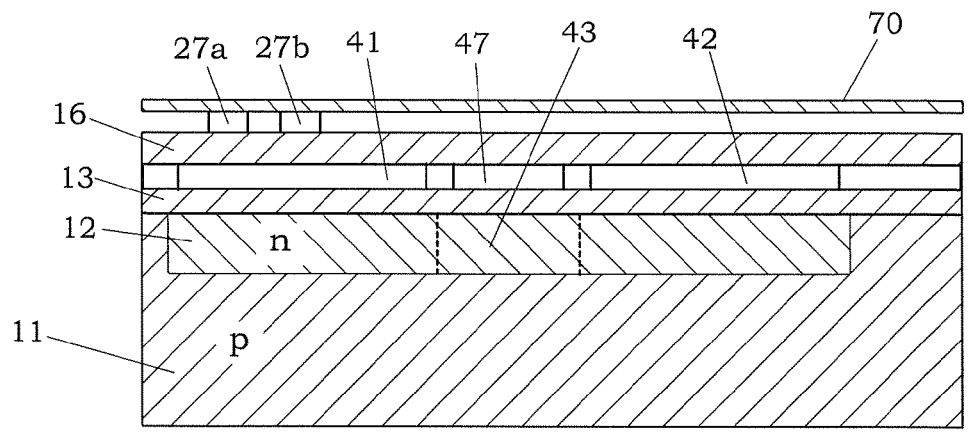
FIG. 8A is a cross-sectional view showing a barrier control electrode formed at a region corresponding to the separation zone.

In addition, as shown in FIG. 8A, it is preferred that a barrier control electrode 47 is formed at a region corresponding to the separation zone 43 on the well 12 through the insulating layer 13. In this case, the movement of electric charges between the transfer array Y1 and the accumulation array Z1 can be further facilitated by controlling an applied voltage to the barrier control electrode 47 as well as the applied voltages to the transfer control electrode 41 and the accumulation control electrode 42.

In the present embodiment, as shown in FIG. 3, the barrier control electrode 47 is disposed in the separation zone 43 between two of the four transfer control electrodes 41 in each of the charge transfer element Py and two of the four accumulation control electrodes 42 in each of the charge accumulation element Pz. On the other hand, an electrode-free region 49 is defined in the separation zone 43 between the remaining two transfer control electrodes 41 in each of the charge transfer element Py and the remaining two accumulation control electrodes 42 in each of the charge accumulation element Pz.

Figure 8B:
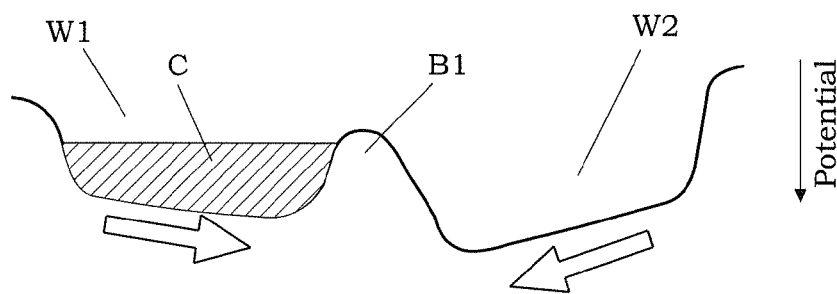
FIGS. 8B to 8D are schematic explanatory diagrams showing a charge transfer operation from the transfer array to the accumulation array in FIG. 8A.
Figure 8C:
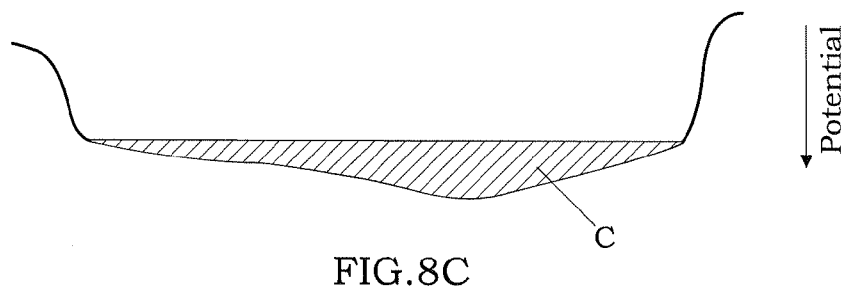
Figure 8D:
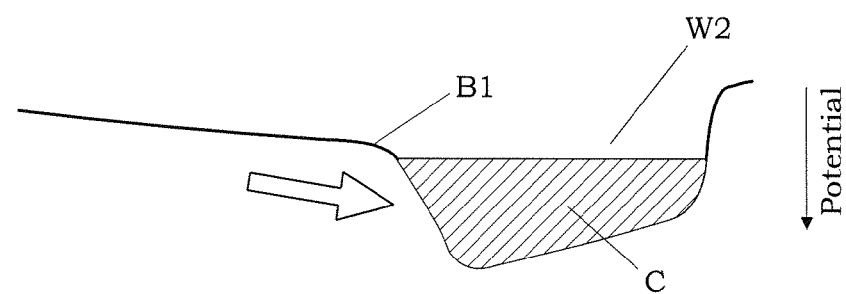

As shown in FIGS. 8B to 8D, a charge transfer operation from the transfer array Y1 to the accumulation array Z1 can be performed by using the barrier control electrode 47. That is, under the condition that effective electric charges C exist in the transfer array Y1, and the potential barrier B1 is formed between the transfer array Y1 and the accumulation array Z1, as shown in FIG. 8B, when an appropriate voltage is applied to the barrier control electrode 47 such that potentials under the transfer control electrode 41, the accumulation control electrode 42 and the barrier control electrode 47 are substantially equal to each other, as shown in FIG. 8C, a part of the effective electric charges C is moved from the transfer array Y1 to the accumulation array Z1.

Next, as shown in FIG. 8D, when the applied voltage to the transfer control electrode 41 is controlled such that the potential well W1 formed as the charge transfer element Py disappears, the effective electric charges move to the region under the barrier control electrode 47 and the accumulation control electrode 42. Subsequently, by controlling the applied voltage to the barrier control electrode 47 to obtain the potential barrier B1, the effective electric charges can be moved in the potential well W2 formed as the charge accumulation element Pz. Thus, according to the procedures of FIGS. 8B to 8D, the charge transfer operation from the transfer array Y1 to the accumulation array Z1 is achieved.

Since the barrier control electrode 47 is formed between each of the charge transfer elements 41 and each of the charge accumulation elements 42 to separately control the potential barrier B1, the effective electric charges C transferred from one of the charge transfer elements 41 and one of the charge accumulation elements 42 through the separation zone 43 are not mixed into an adjacent charge transfer element 41 and/or an adjacent charge accumulation element 42 in the vertical direction Dv.

As described later, the electric charges can be moved from the accumulation array Z1 toward the transfer array Y1 by controlling the applied voltages to the accumulation control electrode 42, the transfer control electrode 41 and the barrier control electrode 47.

Figure 9A:
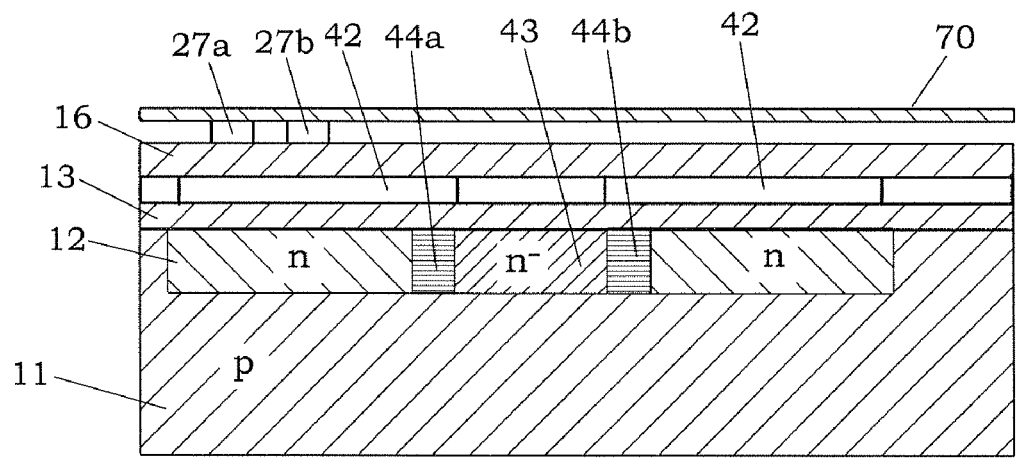
FIG. 9A is a cross-sectional view showing slit regions formed between the transfer array and the separation zone and between the separation zone and the accumulation array.

In the case of transferring the electric charges from the transfer array Y1 to the accumulation array Z1, it is desired to minimize the amount of residual charges in the transfer array Y1. Due to this reason, for example, as shown in FIG. 9A, it is preferred that each of the image pickup units has first and second slit regions (44s, 44b) formed between the separation zone 43 and the charge transfer element Py and between the separation zone 43 and the charge accumulation element Pz. The first slit region 44a is a third impurity diffusion layer formed in well 12 to have a larger impurity concentration (e.g., "n+" type) than the first impurity diffusion layer of the charge transfer element Py. On the other hand, the second slit region 44b is a fourth impurity diffusion layer formed in well 12 to have a larger impurity concentration (e.g., "n++" type) than the second impurity diffusion layer of the charge accumulation element Pz.

Figure 9B:
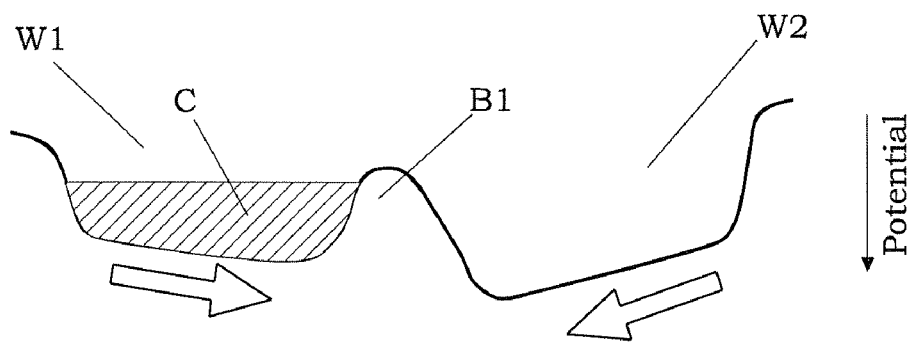
FIGS. 9B and 9C are schematic explanatory diagrams showing a charge transfer operation from the transfer array to the accumulation array in FIG. 9A.

In this case, as shown in FIG. 9B, a depth of the potential well W2 in the vicinity of the separation zone 43 becomes larger than the depth of the potential well W1 in the vicinity of the separation zone 43. In addition, a potential gradient is formed in the potential well W1 to such that the depth of the potential well W1 gradually becomes large toward the separation zone 43. Similarly, a potential gradient is formed in the potential well W2 to such that the depth of the potential well W2 gradually becomes large toward the separation zone 43.

Figure 9C:
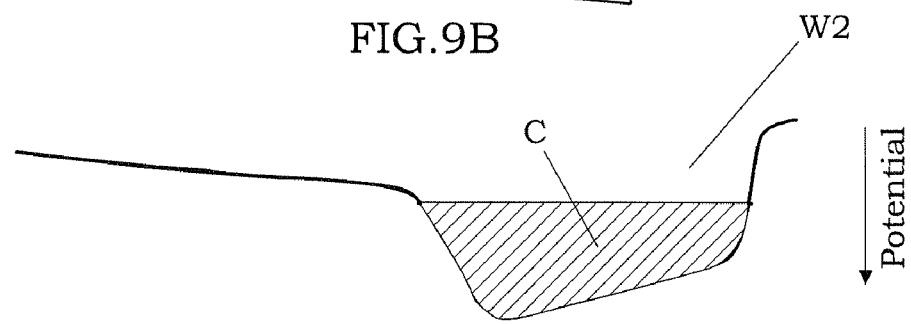

Next, the applied voltages to the accumulation control electrode 42 and the transfer control electrode 41 are controlled such that the electric charges flow from the transfer array Y1 toward the accumulation array Z1 over the potential barrier B1 of the separation zone 43. For example, under the condition that a positive voltage is applied to the transfer control electrode 41 to form the potential well W1, when the positive voltage applied to the transfer control electrode 41 is stopped or removed, the potential well W1 disappears, as shown in FIG. 9C. That is, the potential of the charge transfer element Py reaches the height of the potential barrier B1. As a result, the electric charges in the potential well W1 of the charge transfer element Py can be moved in the potential well W2 of the charge accumulation element Pz beyond the separation zone 43.

In the above procedures, since the potential well W2 is maintained in the charge accumulation element Pz, it is possible to prevent a reverse flow of electric charges from the accumulation array Z1 toward the transfer array Y1. In addition, the electric charges easily move toward the separation zone 43 due to the potential gradients of the potential wells (W1, W2). Therefore, it is possible to prevent a leakage of the electric charges into an adjacent image pickup unit U1 in the horizontal direction Dh.

As shown in FIG. 3, each of the image pickup units U1 has an overflow drain 45 extending in the vertical direction Dv and adjacent to the transfer array Y1 and an overflow drain 46 extending in the vertical direction Dv and adjacent to the accumulation array Z1. That is, the transfer array Y1 is disposed between the overflow drain 45 and the separation zone 43, and the accumulation array 21 is disposed between the overflow drain 46 and the separation zone 43. These overflow drains (45, 46) are capable of discarding the electric charges overflowed from the transfer array Y1 and the accumulation array Z1. As in the overflow drain 15 formed adjacent to the photoelectric converting element Px, each of the overflow drains (45, 46) is directly connected to a drain electrode formed on a region corresponding to the overflow drain (45, 46) not through the insulating layer 13. In addition, each the overflow drains (45, 46) can be formed to have the same conductive type as the well 12, and a higher impurity concentration than the well 12.

To achieve a further reduction in area of the image pickup unit U1, the overflow drain 45 of one of the image pickup units U1 and the overflow drain 46 of an adjacent image pickup unit U1 in the horizontal direction Dh may be provided by a single overflow drain. In other words, the single overflow drain is shared by the adjacent two image pickup units U1. In this case, by discarding the electric charges overflowed from the charge accumulation elements Pz and the charge transfer elements Py through this single overflow drain, it is possible to prevent that the electric charges are mixed between adjacent image pickup units U1, and therefore suppress the occurrence of smear.

To electrically separate the overflow drain 15 from the overflow drains (45, 46), for example, as shown in FIG. 1, it is preferred to form a buffer region 50 having no overflow drain between the charge generation units U2 including the light receiving array X1 and the arrangement of the transfer array Y1 and the accumulation array Z1. The buffer region 50 can be used as an electrode formation area or a wiring formation area. In the case of using the buffer region 50 as the electrode formation area, it is preferred that the buffer region 50 has a width determined such that ten transfer control electrodes 41 and ten accumulation control electrodes 42 can be disposed thereon. On the other hand, in the case of using the buffer region 50 as the wiring formation area, it is preferred that a shield means is formed to prevent the influence of an electric field developed around the wirings on the electric charges generated by the charge generation units U2.

In each of the image pickup units U1, as in conventional CCD image sensors, a horizontal transfer resistor Rh is formed as a charge take-out portion for taking out the electric charges (i.e., effective electric charges) accumulated in the charge accumulation elements Pz to the outside of the image pickup device. The horizontal transfer resistor Rh has a plurality of transfer cells (e.g., "Pu" in FIG. 28A or 29A) arranged in the horizontal direction orthogonal to the accumulation array Z1 and the transfer array Y1.

This horizontal transfer resistor Rh is basically used to read out the electric charges from the accumulation array Z1. If necessary, it can be also used to read out the electric charges from the transfer array Y1. That is, a part of the electric charges accumulated in the accumulation array Z1 is sent to at least one of the transfer cells, and the remaining electric charges accumulated in the accumulation array Z1 are sent to another at least one of the transfer cells through the transfer array Y1.

The electric charges transferred through the horizontal transfer resistor Rh are converted into to a voltage corresponding to the electric charge amount at an output portion (not shown) of the image pickup device 1, and then taken out as the received-light output to the outside of the image pickup device 1. The configurations of the horizontal transfer resistor Rh and the output portion are substantially the same as those of the conventional CCD image sensors, and therefore detail explanations are omitted.

(Operation of the Image Pickup Device)

Referring to FIGS. 10A to 10F and FIGS. 11A to 11C, an operation of the image pickup device 1 described above is explained.

First, an appropriate height of the potential barrier formed under the barrier electrode 24 is determined according to an environment light condition, in which the image pickup device is used. That is, after residual electrons in the well 12 are removed, only the environment light is irradiated to the image pickup device. At this time, a signal light needed to obtain the received-light output of the image pickup device is not irradiated. To obtain an electron-depleted state of the well 12, the electrons remaining in the charge generating portion D1 and the charge separating portion D2 are discarded through a charge discarding portion, i.e., the overflow drain 15. In addition, by applying a reset voltage to the reset gate electrode 28 to form the channel between the charge holding well 14 and the reset drain, the electrons remaining in the charge-amount adjusting portion D4 can be discarded through the reset drain.

In addition, the residual electric charges of the charge accumulating portion D3 of one of the charge generation units U2 can be discarded through the overflow drain 15 of an adjacent charge generation unit U2 in the vertical direction Dv. In FIG. 2, since the electric charges are transferred from the charge generating portion D1 toward the charge accumulating portion D3, i.e., from the upper side to the lower side in the vertical direction Dv, the upper side of the charge generation unit U2 corresponds to the upstream side in the charge transfer direction, and the lower side of the charge generation unit U2 corresponds to the downstream side in the charge transfer direction.

After the residual electrons in the well 12 are discarded, the environment light is irradiated to the image pickup device 1 under the condition that an appropriate voltage is applied to the control electrodes 21 to form a potential well in the charge generating portion D1, so that amounts of electrons and holes corresponding to the received-light amount are generated in the photoelectric converting element Px. In this embodiment, the electrons are collected in the potential well, and the holes are discarded. A method of controlling the voltages applied to the control electrodes 21 is explained later.

After the amount of electrons corresponding to the received-light amount is collected (generated) in the charge generating portion D1, an appropriate voltage is applied to the separation electrodes 22 in a period Ta, as shown in FIG. 10A, to form a potential well in the charge separating portion D2, and the electrons are moved from the charge generating portion D1 to the charge separating portion D2. At this time, the control electrodes 21 are used to transfer the electric charges (i.e., electrons) in the vertical direction Dv. In addition, the "n++" type charge holding well 14 surrounded by the n-type well 12 has a lower potential with respect to electrons. Therefore, as shown in FIG. 10B, when an appropriate voltage is applied to the transfer gate electrode 29 to form a channel between the charge separating portion D2 and the charge holding well 14 of the charge-amount adjusting portion D4, electrons flow from the charge separating portion D2 into the charge holding well 14.

As the electrons flow into the charge holding well 14, the potential of the charge holding well 14 lowers. That is, the potential of the barrier electrode 24 electrically connected to the charge holding well 14 also lowers, as shown in FIG. 10D. As a result, a potential barrier is formed under the barrier electrode 24. A height of the potential barrier is determined depending on the amount of electrons moved from the charge holding well 14 to the barrier electrode 24. In the case of forming a holding electrode at a position corresponding to the charge holding well 14 through the insulation layer 13, a voltage determined depending on the amount of electrons in the charge holding well 14 occurs at the holding electrode. At this time, the same voltage is also applied to the barrier electrode 24 to form the potential barrier under the barrier electrode 24.

In the period Ta, no voltage is applied to the accumulation electrodes 23. Therefore, electrons are not accumulated in the charge accumulating portion D3. With respect to the timing of applying the voltage to the transfer gate electrode 29, for example, the voltages are simultaneously applied to the transfer gate electrode 29 and the separation electrodes 22, as shown in FIGS. 10A and 10B. Alternatively, it is also preferred that the voltage is firstly applied to the separation electrodes 22, and then the voltage is applied to the transfer gate electrode 29.

After the electrons are moved into the charge-amount adjusting portion D4, the applying of the voltage to the transfer gate electrode 29 is stopped to hold the electrons in the charge holding well 14 in the period Tb, as shown in FIG. 10B. In addition, a voltage is applied to the drain electrode 50, as shown in FIG. 10C, so that the residual electrons in the charge separating portion D2 are discarded through the overflow drain 15. In the case of discarding electrons as the electric charges, the electrons can be smoothly discarded by stopping the applying of the voltage to the separation electrodes 22.

As described above, the electric charges generated at the charge generating portion D1 by receiving the light (i.e., the environment light) is used to determine the height of the potential barrier formed under the barrier electrode 24. In brief, the height of the potential barrier is appropriately determined in consideration of the environment light as a disturbance component. Therefore, the above-described procedures can be regarded as a potential-height adjusting operation or an ex ante adjustment operation for the image pickup device.

Next, a received-light output of the image pickup device 1 can be obtained by a practical measurement explained below. That is, the image pickup device 1 receives a light including an intended light (i.e., a signal light) and the environment light, and removes the electric charges corresponding to the environment light amount from the electric charges corresponding to the received-light amount to obtain a true received-light output for the signal light.

Prior to the practical measurement, residual electrons in the well 12 except for the charge-amount adjusting portion D4 are discarded in the period Tc by use of the overflow drain 15, as shown in FIG. 10C. Thereby, the charge generating portion D1 and the charge separating portion D2 are placed in the electron-depleted state.

In addition, the potential barrier B2 is formed under the barrier electrode 24, as shown in FIG. 11A. This potential barrier B2 has an appropriate height determined according to the environment light condition by the potential-height adjusting operation described above. After the image pickup device 1 receives the light including the signal light from the target space, electrons corresponding to the received-light amount are collected in the charge generating portion D1. Then, an appropriate voltage is applied to the separation electrodes 22 in the period Td, as shown in FIG. 10A, to form the potential well for collecting the electrons in the charge separating portion D2. By controlling the applied voltage of the control electrodes 21, the electrons are transferred from the charge generating portion D1 to the charge separating portion D2, as shown in FIG. 11B.

Subsequently, an appropriate voltage is applied to the accumulation electrodes 23 in the period Te, as shown in FIG. 10E, to form a potential well in the charge accumulating portion D3. In this state, when the applying of the voltage to the separation electrodes 22 is stopped, an amount of the electrons determined by the height of the potential barrier B2 flows from the charge separating portion D2 into the charge accumulating portion D3 over the potential barrier B2, as shown in FIG. 11C. On the other hand, the remaining amount of the electrons which can not flow into the charge accumulating portion D3 due to the height of the potential barrier, is kept as undesired electric charges in the charge separating portion D2, as shown in FIG. 11C. The amount of the undesired electric charges is determined according to the height of the potential barrier 24 and the size of the charge separating potion D2. Before stopping the applying of the voltage to the separation electrodes 22, the voltage applied to the control electrodes 21 is controlled such that a potential barrier having a larger height than the potential barrier B2 is formed between the charge separating portion D2 and the charge generating portion D1.

According to the above operation, an appropriate amount of the undesired electric charges are separated from the electrons generated at the charge generating portion D1 by the charge separating portion D2, and the electrons other than the undesired electrons are accumulated as effective electric charges in the charge accumulating portion D3.

After the effective electric charges are accumulated in the charge accumulating portion D3, an appropriate voltage is applied to the drain electrode 50 in the period Tf, as shown in FIG. 10C, so that the undesired electric charges in the charge separating portion D2 are discarded through the overflow drain 15. In addition, to discard the electric charges (i.e., electrons) in the charge-amount adjusting portion D4, an appropriate voltage is applied to the reset gate electrode 28 to form the channel between the charge holding well 14 and the reset drain, as shown in FIG. 10F. After the electrons are discarded from the charge holding well 14, the applying of the voltage to the reset gate electrode 28 is stopped.

By the way, as described above, it is needed to move the electrons from the charge separating portion D2 to the charge-amount adjusting portion D4 in the barrier-height adjusting operation. Since the overflow drain 15 has the function of discarding the undesired electric charges from the charge separating portion D2, the potential of the overflow drain 15 is set to be higher than the potential of the charge separating portion D2. That is, a potential gradient develops in the vicinity of the charge separating portion D2 such that the electric charges easily flow from the charge separating portion D2 to the charge-amount adjusting portion D4. As a result, it is possible to improve the transfer efficiency of the electric charges into the charge-amount adjusting portion D4.

Therefore, if the overflow drain 15 is formed at a side (e.g., the left side in FIG. 2) of the charge generating portion D1, and the barrier-height adjusting portion D4 is formed at the other side (e.g., the right side in FIG. 2) of the charge generating portion D1, a potential gradient is formed in the charge separating portion D2, as shown by an arrow β in FIG. 12B. This potential gradient β prevents a smooth movement of electrons from the charge separating portion D2 toward the barrier-height adjusting portion D4. In FIG. 12B, a dashed line shows a potential gradient formed at the time of moving the electrons into the barrier-height adjusting portion D4 by applying a voltage to the transfer gate 29.

On the contrary, according to this embodiment, since both of the overflow drain 15 and the barrier-height adjusting portion D4 are disposed at one side (e.g., the right side in FIG. 2) of the charge generating portion D1, a potential gradient is formed in the charge separating portion D2, as shown by an arrow α in FIG. 12A. This potential gradient α facilitates the smooth movement of electrons from the charge separating portion D2 toward the barrier-height adjusting portion D4. Thus, since the electrons are efficiently moved from the charge separating portion D2 into the barrier-height adjusting portion D4, it is possible to accurately determine the height of the potential barrier B2 formed between the charge separating portion D2 and the charge accumulating portion D3.

After the effective electric charges obtained after separating the undesired electric charges from the electric charges generated by the charge generating portion D1 (=the photoelectric conversion element Px) are temporarily accumulated in the charge accumulation portion D3, they are transferred to the accumulation array Z1 through the transfer array Y1 by controlling the timings of applying the voltages to the control electrodes 21, the separation electrodes 22, the accumulation electrodes 23, the barrier electrode 24 and the transfer control electrode 41.

In the present embodiment, each of the charge generation units U2 including the photosensitive conversion elements Px is associated with each of the charge accumulation elements Pz. Therefore, the effective electric charges are transferred from one of the charge generation units U2 to a corresponding one of the charge accumulation elements Pz through the transfer array Y1. At this time, since the potential barrier B1 is formed between the transfer array Y1 and the accumulation array Z1, it is possible to prevent that the effective electric charges accidentally flows into the accumulation array Z1 during the operation of transferring the effective electric charges to the transfer array Y1.

By the way, as described later in details, in an intensity detecting operation needing two received-light outputs, one of the charge generation units U2 (=the photoelectric conversion elements Px) is associated with two charge accumulation elements Pz. In this case, the effective electric charges obtained in a period are transferred from the charge generation unit U2 to a corresponding one of the two charge accumulation elements Pz, and the effective electric charges obtained in another period are transferred from the charge generation unit U2 to the other charge accumulation element Pz. Alternatively, in a distance measuring operation needing four received-light outputs, a pair of the charge generation units U2 (=the photoelectric conversion elements Px) is associated with four charge accumulation elements Pz. In this case, the effective electric charges obtained in two of four different periods are transferred from the pair of the charge generation units U2 to corresponding two of the four charge accumulation elements Pz, and the effective electric charges obtained in the remaining two periods are transferred from the pair of the charge generation units U2 to the remaining two charge accumulation elements Pz.

After the operation of transferring the effective electric charges from the charge generation unit U2 to the transfer array Y1 is finished, the applied voltages to the transfer control electrodes 41, the accumulation control electrodes 42 and if necessary the barrier control electrode 47 are controlled to move the effective electric from the transfer array Y1 to the accumulation array Z1.

By a series of operations described above, the effective electric charges corresponding to an image of 1 frame is obtained as the received-light output. However, from the viewpoint of the technical idea of the present invention, the effective electric charges are not taken out to the outside of the image pickup device 1 every charge transfer operation from the charge generation unit U2 to the transfer array Y1. That is, the total amount of the effective electric charges cumulatively accumulated in the accumulation array Z1 by repeating the charge transfer operation plural times is taken out at a time to the outside of the image pickup device 1.

Therefore, even when the amount of the effective electric charges obtained per one charge transfer operation is small, a large amount of the effective electric charges can be obtained in the accumulation array Z1 by repeating the charge transfer operation plural times. This substantially means an improvement in sensitivity. After a sufficient amount of the effective electric charges are accumulated in the accumulation array Z1, they are taken out to the outside of the image pickup device 1 through the horizontal transfer resistor Rh.

Since conventional FT-type image pickup devices do not have the accumulation array Z1, it is needed to take out the electric charges to the outside every charge transfer operation. In this case, as the number of times of an operation of reading out the electric charges increases, a reduction in response speed comes into a problem. In addition, to accumulate the electric charges, an external accumulating means must be separately formed from the conventional FT-type image pickup devices. On the contrary, according to the present invention, since the accumulation array Z1 is built in the image pickup device 1, and the effective electric charges are taken out to the outside of the image pickup device 1 after a sufficient amount of the effective electric charges are accumulated in the accumulation array Z1, a remarkable improvement in response speed can be achieved. In addition, as a further effect of accumulating the effective electric charges, it is possible to improve a signal-to-noise ratio, i.e., S/N ratio.

The operation of moving the effective electric charges from the transfer array Y1 to the accumulation array Z1, and the operation of taking out the electric charges accumulated in the accumulation array Z1 to the outside of the image pickup device 1 are explained later.

With respect to the potential barrier B2 in each of the charge generation units U2, when there is a considerable change in environmental light, it is preferred that the electrons in the charge holding well 14 are discarded at every 1 frame. On the other hand, when the environmental light is almost constant, the electrons in the charge holding well 14 may be discarded after the charge transfer operation is repeated a predetermined number of times to reset the height of the potential barrier B2.

(Spatial Information Detecting Apparatus)

As preferred applications of the image pickup device 1 described above, there are spatial information detecting apparatuses for detecting the presence or absence of an object in a target space or the reflectance of the object, and for measuring a distance to the object in the target space. As shown in FIG. 13, the spatial information detecting apparatus explained below is an active-type detecting apparatus with a light emission source 2 for irradiating light to the target space. That is, the detecting apparatus is mainly formed with the light emission source 2, the image pickup device 1 explained above of the present invention, and a signal processing portion 3 for executing processing for the received-light output of the image pickup device, and a control portion for controlling the operation timings of the image pickup device 1 and the light emission source 2, and the timing of executing arithmetic operations in the signal processing portion 3.

The light emission source 2 can be formed by arranging plural infrared light emitting diodes. The light provided from the target space, i.e., a reflected light from the object 5 is incident on the image pickup device 1 through an infrared pass filter (not shown). In the case of using the infrared light as the light for measuring the distance to the object, it is possible to easily suppress the incident of visible light on the image pickup device 1 by the infrared pass filter. The signal processing portion 3 and the control portion 4 can be formed by a microcomputer for executing appropriate programs.

In the intensity measuring operation for detecting the presence or absence of the object 5 or the reflectance of the object 5, as shown in FIG. 14A, a lighting period where the light emission source 2 is turned on, and a rest period where the light emission source is turned off are set, and a difference between the received-light amounts obtained in the lighting and rest periods is determined. The light emission source 2 projects a light intensity-modulated by a modulation signal such as a rectangular wave into the target space. When a duty ratio of the rectangular wave is 50%, the lighting period T1 and the rest period T2 are alternately repeated every 180 degrees. That is, the lighting period T1 corresponds to a phase zone of 0 to 180 degrees, and the rest period T2 corresponds to a phase zone of 180 to 360 degrees.

In the lighting period, as shown in FIG. 14B, both of the signal light projected from the light emission source 2 and reflected by the object 5 in the target space and the environmental light existing in the target space are usually incident on the image pickup device 1. Therefore, by determining the difference between the received-light amounts obtained in the lighting and rest periods, a degree of optical reflection on the object 5 can be estimated without the influence of the environmental light. As described later, the received-light amount obtained in the phase zone of 0 to 180 degrees is represented as "C0", and the received-light amount obtained in the phase zone of 180 to 360 degrees is represented as "C2". Therefore, the difference between the received-light amounts in the lighting and rest periods (T1, T2) corresponds to "C0–C2".

When the distance to the object 5 is constant, the reflectance of the object 5 can be estimated from the difference between the received-light amounts with respect to the wavelength of the projected light. Since the reflectance depends on the wavelength of the projected light, the dependency of reflectance on wavelength can be also estimated by changing the wavelength of the light projected into the target space. In addition, when the difference between the received-light amounts obtained in the lighting and rest periods is larger than a predetermined threshold value, it can be recognized as the presence of the object 5 capable of reflecting the light in the target space.

On the other hand, in the distance measuring operation for measuring the distance to the object 5, an intensity-modulated light is projected from the light emission source 2 into the target space, and then reflected by the object 5 in the target space. When the reflection light is incident on the image pickup device 1, a phase difference between the phase of the intensity change of the projected light and the phase of the intensity change of the incident light is determined, and then converted into a distance value.

For example, when the intensity-modulated light shown in FIG. 15A and FIG. 15B, which is an enlarged view of FIG. 15A, is projected from the light emission source 2 into the target space, and the intensity of the light incident on the image pickup device 1 changes, as shown in FIG. 15C, the distance "L" to the object 5 in the target space is reflected in a time difference "Δt" (s) between the projected light and the received light. Therefore, the distance L to the object 5 is expressed by the following equation:

$$L = c \cdot \Delta t / 2,$$

where "c" is the speed of light (m/s). In addition, when a frequency of a modulation signal used to generate the intensity-modulated light is "f" (Hz), and the phase difference is "ϕ" (rad), the time difference "Δt" is expressed by the following equation:

$$\Delta t = \phi / 2\pi \cdot f.$$

Thus, the distance "L" can be determined by use of the phase difference "ϕ".

In the fact, the received-light amount is detected at every phase zone having a predetermined phase width (time width) by the image pickup device 1, and a received-light output corresponding to this received-light amount is used to calculate the phase difference "ϕ". Specifically, when each of the phase zones has a phase width of 90 degrees, four phase zones are obtained every one period of the modulation signal. For example, four received-light amounts obtained at the four phase zones (i.e., 0 to 90 degrees, 90 to 180 degrees, 180 to 270 degrees, and 270 to 360 degrees) are respectively defined as A0, A1, A2 and A3, as shown by hatching areas in FIG. 15C. In this case, the phase difference "ϕ" is expressed by the following equation:

$$\phi = \tan^{-1}\{(A0-A2)/(A1-A3)\}.$$

The correspondence relation between the phase zone of the modulation signal and the received-light amount is not limited to the above case. The phase width of the phase zone can be appropriately set. For example, the phase zone may have the phase width of 180 degrees. In addition, the phase difference "ϕ" may be determined by use of the received-light amounts obtained in three phase zones, or five phase zones or more.

By the way, in the intensity detecting operation shown in FIGS. 14A and 14B, one light exposure operation is associated with the lighting period T1 or the rest period T2. On the other hand, in the distance measuring operation shown in FIGS. 15A to 15C, one light exposure operation is associated with plural periods (several tens of thousands of periods) of the modulation signal.

To execute the above-described calculation, it is needed to generate electrons corresponding to the received-light amount in each of the phase zones of the modulation signal by the charge generating portion D1 of the image pickup device 1. To obtain the received-light amount in each of the phase zones, the voltage applied to the control electrodes 21 are controlled in synchronization with the modulation signal.

The control portion 4 has the capability of controlling the voltage applied to each of the control electrodes 21. The potential well is formed under the control electrode(s) 21, to which the voltage is applied. That is, by controlling the number of the control electrodes 21, to which the voltage is applied, it becomes possible to form the potential well having a desired aperture area in the charge generating portion D1. Thus, the charge generating portion D1 has a sensitivity control function.

The electrons generated by the charge generating portion D1 are collected in the potential well. Therefore, as the potential well has a larger aperture area (i.e., a larger volume), the efficiency of collecting the electrons increases. On the contrary, when the voltage is applied to the single control electrode 21, the efficiency of collecting the electrons lowers. In other word, when the voltage is applied to the single control electrode 21, the electrons collected in the potential well 21 considerably decrease. Therefore, in a charge collecting period where the voltage is applied to the plurality of the control electrodes 21, electrons can be efficiently collected in the potential well having a large aperture area. Subsequently, in a charge holding period where the voltage is applied to a reduced number of the control electrodes 21, e.g., the single control electrode 21, it is possible to hold the electrons collected in the charge collecting period.

In the case of collecting and holding the electrons according to the above-described procedures, since the amount of electrons collected in the charge holding period is very small, the electrons held in the charge holding period substantially reflect the received-light amount obtained in the charge collecting period. In addition, when the control electrode 21 used to form the potential well for holding the electrons in the charge holding period is light shielded, it is possible to further suppress the collection of electrons in the charge holding period.

As clearly understood from the above operations, when it is needed to collect the electrons corresponding to the received-light amount in a specific phase zone of the modulation signal by the charge generating portion D1, the number of the control electrodes 21, to which the voltage is applied in the charge collecting period, is increased, and on the other hand, the number of the control electrodes 21, to which the voltage is applied in the charge holding period, is decreased. In the charge holding period, it is particularly preferred that the voltage is applied to the single control electrode 21. The control portion 4 changes the voltage applying pattern to the control electrode(s) 21 in synchronization with the modulation signal.

That is, the control portion 4 applies the voltage to the plural control electrodes 21 in each of the specific phase zones of the modulation signal to collect the electrons over plural periods (cycles) of the modulation signal with respect to the respective specific phase zone. In this case, even when the received-light amount obtained in one period (cycle) of the modulation signal with respect to the specific phase zone is small, it is possible to obtain a sufficient received-light amount by collecting the electrons over the plural periods of the modulation signal with respect to in the specific phase zone. On the other hand, when the received-light amount is sufficiently large, saturation may be caused by collecting the electrons over the plural periods of the modulation signal. In such a case, the applying of the voltage to the control electrodes 21 is appropriately controlled according to the use environment. In the signal processing portion 3, the received-light outputs corresponding to the phase zones is used to determine the above-mentioned phase difference. For example, when each of the charge generation units U2 corresponds to one pixel, it is possible to obtain a distance image having pixel values, each of which provides a distance value.

By the way, to measure the distance according to the above-described principle, it is ideal to detect only the signal light projected from the light emission source 2 into the target space by the image pickup device 1. In this case, as the received-light amount of the signal light increases, the measurement accuracy becomes higher. However, in most cases, the environment light is also incident on the image pickup device 1. When a total light amount of the environment light and the signal light exceeds an upper limit (i.e., a saturation charge amount) of the photoelectric conversion capability of the photoelectric converting elements Px of the image pickup device 1, the generation amount of the electric charges are saturated, so that the measurement accuracy deteriorates. Therefore, to improve the operation reliability of the image pickup device irrespective of the use environment, it is desired to prevent the saturation of the image pickup device 1, and increase the electric charge amount corresponding to the signal light.

As described above, the image pickup device 1 of the present invention has the capability of discarding the amount of the undesired electric charges corresponding to the environment light, which is determined according to the electric charge amount in the charge-amount adjusting portion D4. That is, since the height of the potential barrier B2 formed under the barrier electrode 24 is determined according to the received-light amount of only the environment light, the undesired electric charges corresponding to the environment light can be accurately separated by the charge separating portion D2.

As a result, it is possible to increase a ratio of the effective electrons corresponding to the received-light amount of only the signal light, which are accumulated in the charge accumulating portion D3, relative to the electrons corresponding to the received-light amount of both of the signal light and the environment light, which are generated by the charge generating portion D1. In addition, since the undesired electric charges are discarded through the overflow drain 15 as the charge discarding portion, it is possible to prevent the charge accumulating portion D3 from saturation.

Furthermore, even when the environment light fluctuates, and the amount of the undesired electric charges substantially changes with the received-light amount of the environment light, it is possible to stably accumulate a sufficient amount of the effective electric charges corresponding to the signal light in the charge accumulating portion D3. In brief, by separating the undesired electric charges from the electric charges generated in the lighting period by the charge generating portion D1, it is possible to increase the signal-to-noise ratio.

As described above, when the amount of electrons generated in one period of the modulation signal by the charge generating portion D1 is small, the electrons may be collected over plural periods of the modulation signal by the charge generating portion D1. However, electrons may be saturated in the charge generating portion D1. In such a case, it is preferred that the operation of separating the undesired electric charges is performed plural times by the charge separating portion D2 to accumulate a sufficient amount of the effective electric charges in the charge accumulating portion D3. Subsequently, the sufficient amount of the effective electric charges accumulated in the charge accumulating portion D3 is transferred to the transfer array Y1.

The electrons accumulated in the charge accumulating portion D3 correspond to the electrons obtained by removing the undesired electrons from the electrons generated by the charge generating portion D1. Therefore, as compared with the case of accumulating the electrons generated by the charge generating portion D1 directly in the charge accumulating portion D3, it is possible to remarkably reduce the occurrence of the saturation. In addition, since the S/N ratio is increased, an improvement in measurement accuracy can be achieved.

Next, operations for accumulating electric charges in the accumulation array Z1 through the transfer array Y1, and taking out the electric charges accumulated in the accumulation array Z1 to the outside of the image pickup unit 1 are explained according to preferred operation examples. In the followings, it is explained about the case where the electric charges generated by the photoelectric converting element Px of the charge generation unit U2 are accumulated in the charge accumulation element Pz through the transfer array Y1. The explanation is also available in the case where the effective electric charges provided from the charge accumulating portion D3 of the charge generation unit U2 are accumulated in the charge accumulation element Pz through the transfer array Y1.

First Operation Example

In the first operation example, electric charges corresponding to a received-light amount obtained in a predetermined period are accumulated in the accumulation array Z1, and then taken out as the received-light output to the outside of the image pickup device 1. That is, the following exposure-accumulation operation is repeated plural times. This exposure-accumulation operation comprises the steps of:
irradiating a light intensity-modulated by a modulation signal to a target space;
receiving light from the target space with one of the photoelectric conversion elements Px to generate the electric charges corresponding to the received-light amount in the predetermined period;
transferring the generated electric charges from the one of the photoelectric conversion elements Px to one of the charge accumulation elements Pz through the transfer array Y1; and
accumulating the transferred electric charges in the charge accumulation element Pz.

Subsequently, a total amount of the electric charges accumulated in the charge accumulation element Px by repeating the exposure-accumulation operation the plural times is taken out as the received-light output. For example, one light exposure time is approximately 1 ms, and the repetition number of the exposure-accumulation operation is 5 times.

Figure 16:
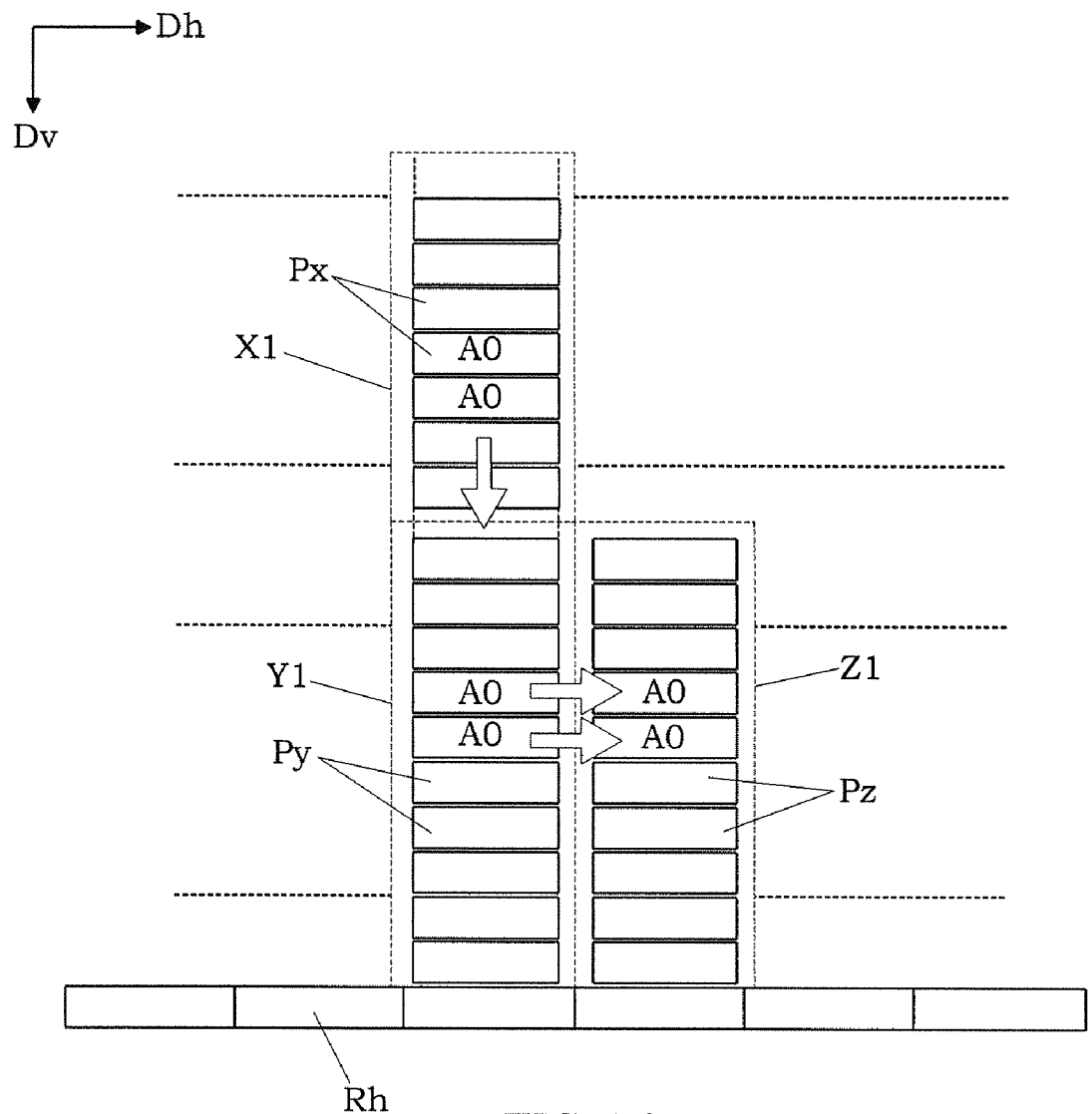
FIG. 16 is an explanatory diagram of a first operation example for accumulating electric charges from the light receiving array in the accumulation array through the transfer array.

For example, as shown in FIG. 16, after the electric charges corresponding to the received-light amount A0 are generated by a pair of photoelectric conversion elements Px, they are transferred to a predetermined pair of charge transfer elements Py, and then accumulated from the charge transfer elements Py in a corresponding pair of charge accumulation elements Pz. By repeating this operation plural times, the electric charges corresponding to the received-light amount A0 can be cumulatively accumulated in these two charge accumulation elements Pz. The thus accumulated electric charges are then taken out as the received-light output corresponding to the received-light amount A0 through the horizontal transfer resistor Rh. In this operation example, each of the photoelectric conversion elements Px is associated with each of the charge accumulation elements Pz.

By performing the same operation with respect to the electric charges corresponding to the received-light amount A2, the electric charges accumulated in the charge accumulation elements Pz are taken out as the received-light output corresponding to the received-light amount A2. Therefore, in the case of performing the intensity detecting operation, two sets of the exposure-accumulation operation and the charge take-out operation are needed to obtain the received-light outputs corresponding to the received-light amounts (C0, C2). On the other hand, in the case of performing the distance measuring operation, four sets of the exposure-accumulation operation and the charge take-out operation are needed to obtain the received-light outputs corresponding to the received-light amounts (A0, A1, A2, A3).

Second Operation Example

In the second operation example, electric charges corresponding to received-light amounts in two different periods are accumulated in the accumulation array Z1, and then taken out as the received-light outputs to the outside of the image pickup device 1. That is, the following exposure-accumulation operation is repeated plural times. This exposure-accumulation operation is comprised of a set of first and second exposure-accumulation operations, which are performed under the condition that a light intensity-modulated by a modulation signal is irradiated to a target space. That is, the first exposure-accumulation operation comprises the steps of:
receiving light from the target space with one of the photoelectric conversion elements Px to generate electric charges corresponding to a received-light amount in a first period;
transferring the generated electric charges from the photoelectric conversion element to one of the charge accumulation elements Pz through the transfer array Y1; and
accumulating the transferred electric charges in the one of the charge accumulation elements.

The second exposure-accumulation operation comprises the steps of:
receiving light from the target space with the one of the photoelectric conversion elements Px to generate electric charges corresponding to a received-light amount in a second period different from the first period;
transferring the generated electric charges from the photoelectric conversion element to another one of the charge accumulation elements Pz through the transfer array Y1; and
accumulating the transferred electric charges in the another one of the charge accumulation elements Pz.

Subsequently, a total amount of the electric charges accumulated in the one of the charge accumulation elements Pz by repeating the first exposure-accumulation operation the plural times, and a total amount of the electric charges accumulated in the another one of the charge accumulation elements Pz by repeating the second exposure-accumulation operation the plural times are taken out as the received-light outputs.

As a preferred method of taking out the electric charges accumulated in the accumulation array Z1 to the outside of the image pickup device 1, the total amount of the electric charges accumulated in the one of the charge accumulation elements PZ by repeating the first exposure-accumulation operation the plural times is sent to the transfer array Y1, and then taken out from the transfer array Y1, and the total amount of the electric charges accumulated in the another one of the charge accumulation elements Pz by repeating the second exposure-accumulation operation the plural times is taken out from the accumulation array Z1.

Figure 17A:
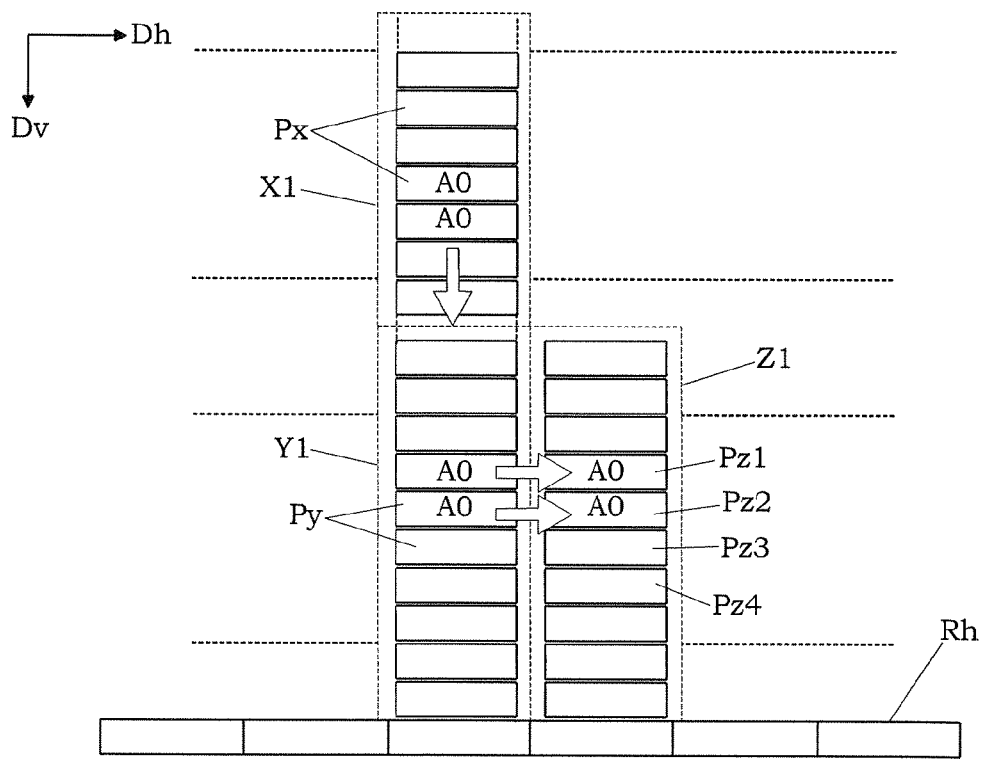
FIGS. 17A and 17B are explanatory diagrams of a second operation example for accumulating electric charges from the light receiving array in the accumulation array through the transfer array.
Figure 17B:
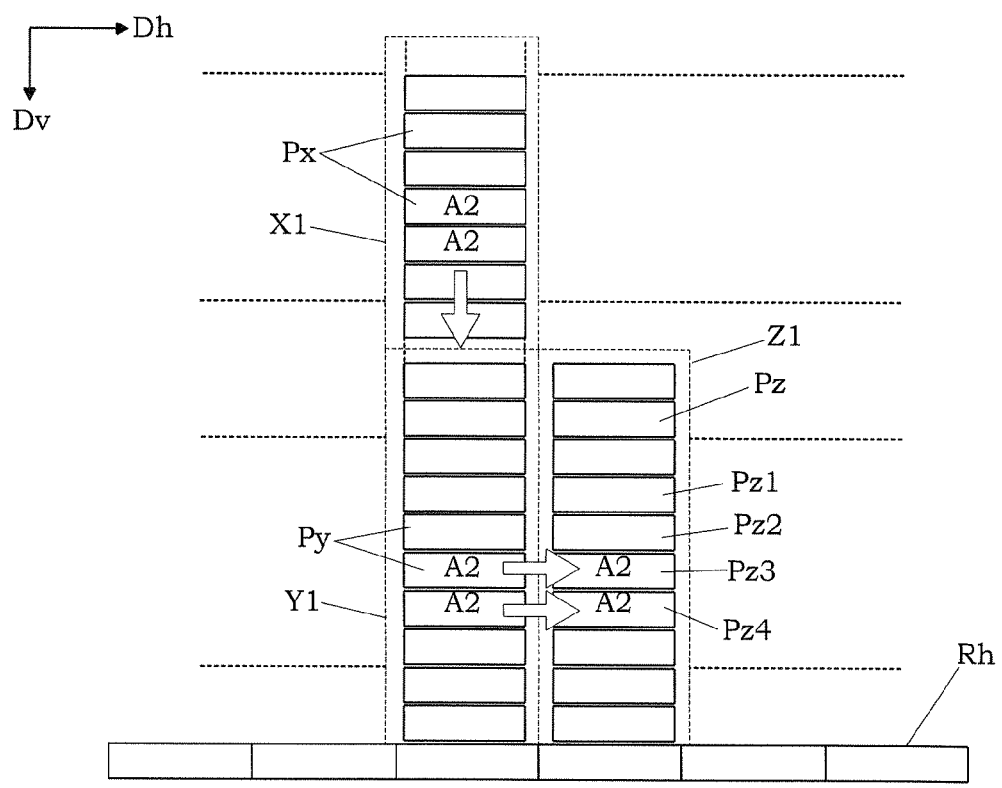

For example, as shown in FIG. 17A, in the first exposure-accumulation operation, after the electric charges corresponding to the received-light amount A0 in a first phase zone of the modulation signal are generated by a pair of photoelectric conversion elements Px, they are transferred to a predetermined pair of charge transfer elements Py, and then accumulated from the charge transfer elements Py in a corresponding pair of charge accumulation elements Pz. The charge accumulation elements Pz used in the first exposure-accumulation operation are represented as Pz1, Pz2, as shown in FIG. 17A. On the other hand, as shown in FIG. 17B, in the second exposure-accumulation operation, after the electric charges corresponding to the received-light amount A2 in a second phase zone of the modulation signal are generated by the pair of the photoelectric conversion elements Px, they are transferred to a predetermined pair of charge transfer elements Py, and then accumulated from the charge transfer elements Py in a corresponding pair of charge accumulation elements Pz. The charge accumulation elements Pz used in the second exposure-accumulation operation are represented as Pz3, Pz4, as shown in FIG. 17B. Thus, in this operation example, each of the photoelectric conversion elements Px is associated with two charge accumulation elements Pz.

By repeating the above-described exposure-accumulation operation plural times (e.g., 5 times), the electric charges corresponding to the received-light amount A0 and the electric charges corresponding to the received-light amount A2 can be cumulatively accumulated in the four charge accumulation elements (Pz1, Pz2, Pz3, Pz4). The thus accumulated electric charges are then taken out as the received-light outputs corresponding to the received-light amounts (A0, A2) through the horizontal transfer resistor Rh, as described later.

Figure 18A:
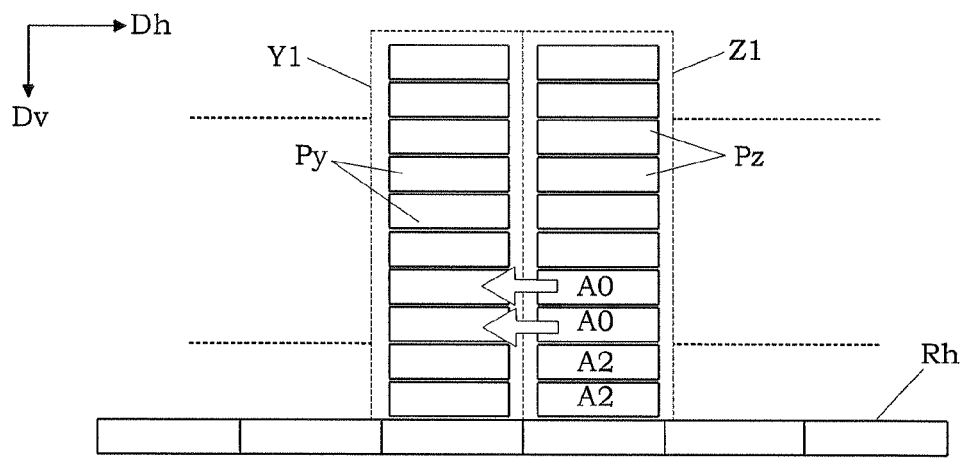
FIGS. 18A to 18C are explanatory diagrams of an operation for taking out the electric charges accumulated by the second operation example from the accumulation array.
Figure 18B:
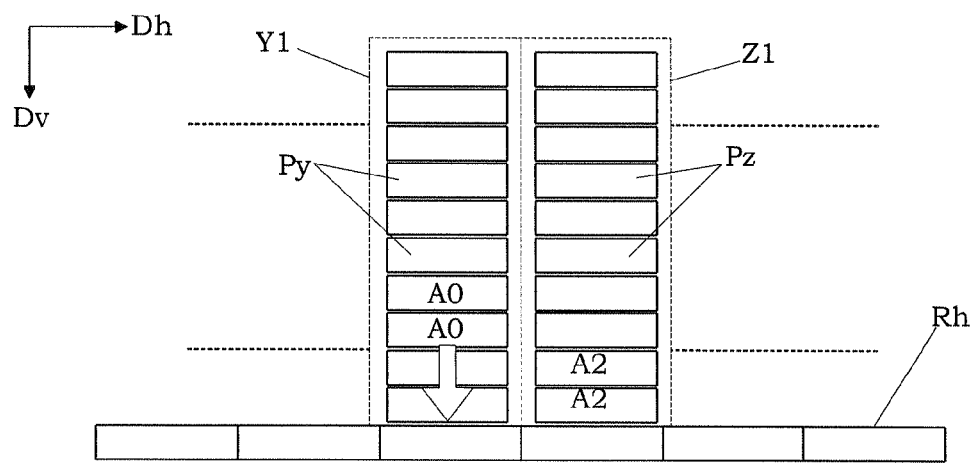
Figure 18C:
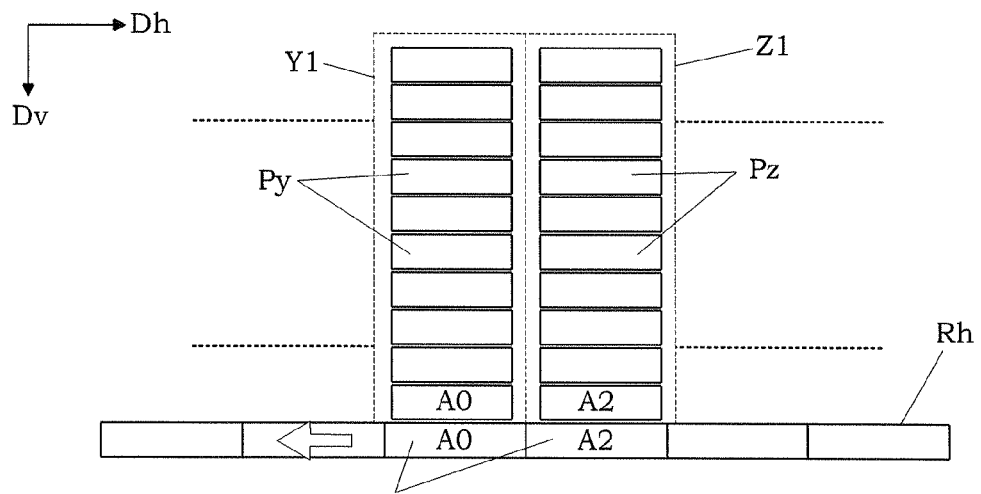

After the exposure-accumulation operation is performed plural times, the electric charges corresponding to the received-light amounts (A0, A2) accumulated in the accumulation array Z1 can be taken out, as shown in FIGS. 18A to 18C. First, the electric charges corresponding to the received-light amounts A0 accumulated in the two charge accumulation elements Pz are transferred to the adjacent charge transfer elements Py, as shown by the arrows in FIG. 18A, and then transferred in the transfer array Y1 in the vertical direction Dv, as shown by the arrow in FIG. 18B such that the electric charges corresponding to the received-light amounts A0 are held in two charge transfer elements Py adjacent to the two charge accumulation elements Pz having the electric charges corresponding to the received-light amounts A2 immediately before the horizontal transfer resistor Rh. Next, a pair of the electric charges corresponding to the received-light amount A0 and the electric charges corresponding to the received-light amount A2 are sent to adjacent transfer cells Pu of the horizontal transfer resistor Rh, so that the received-light outputs corresponding to the received-light amounts (A0, A2) are alternately provided from the horizontal transfer resistor Rh, as shown by the arrow in FIG. 18C.

Figure 19:
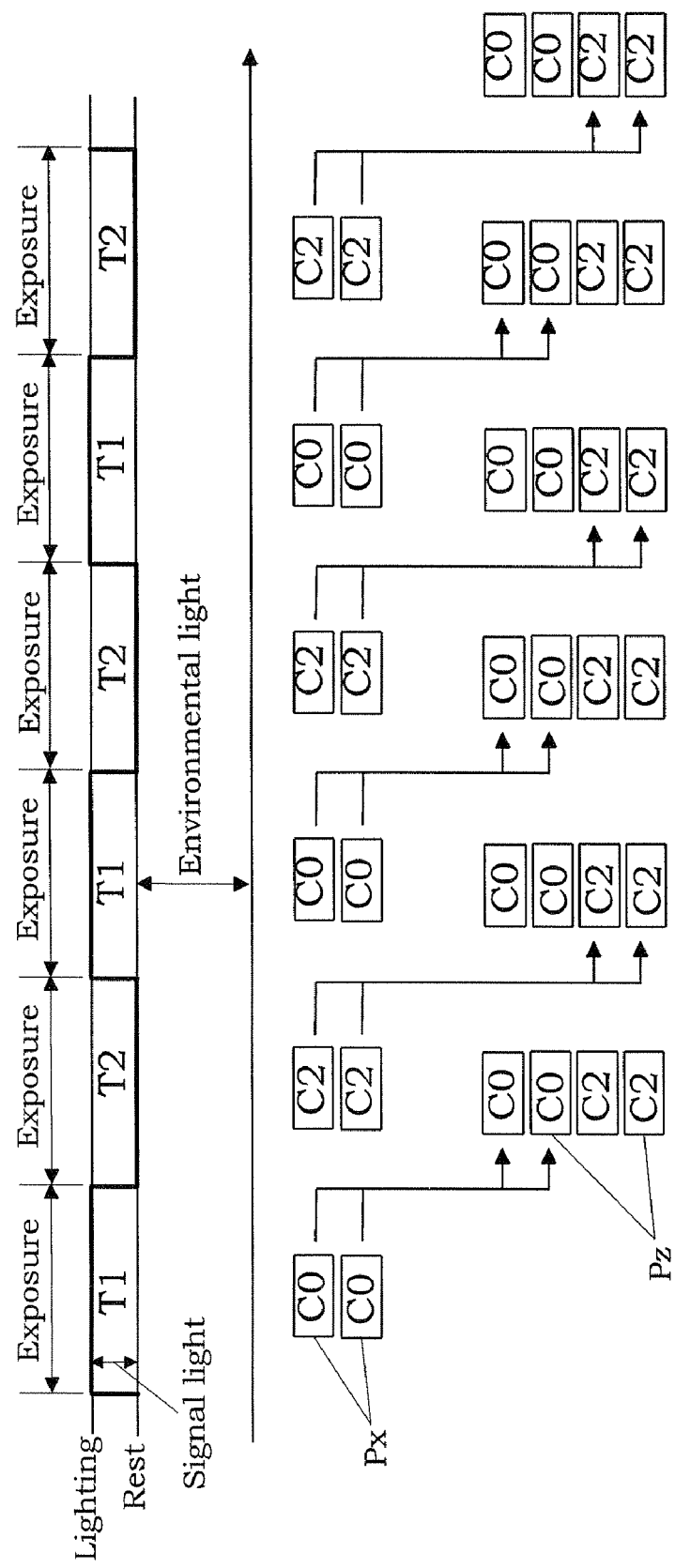
FIG. 19 is an explanatory diagram of the intensity detecting operation according to the second operation example.

In addition, the second operation example can be used for the intensity detecting operation. That is, as shown in FIG. 19, in the first exposure-accumulation operation, after the electric charges corresponding to the received-light amount C0 in the lighting period T1 are generated by a pair of photoelectric conversion elements Px, they are transferred to a predetermined pair of charge transfer elements Py, and then accumulated from the charge transfer elements Py in a corresponding pair of charge accumulation elements Pz. On the other hand, in the second exposure-accumulation operation, after the electric charges corresponding to the received-light amount C2 in the rest period T2 are generated by the pair of photoelectric conversion elements Px, they are transferred to a predetermined pair of charge transfer elements Py, and then accumulated from the charge transfer elements Py in a corresponding pair of charge accumulation elements Pz. By repeating the above-described exposure-accumulation operation plural times (e.g., 3 times), the electric charges corresponding to the received-light amount C0 and the electric charges corresponding to the received-light amount C2 can be cumulatively accumulated in the four charge accumulation elements Pz. The thus accumulated electric charges are then taken out as the received-light outputs corresponding to the received-light amounts (C0, C2) through the horizontal transfer resistor Rh, as described above.

According to this operation example, since both of the electric charges corresponding to the received-light amount A0 and the electric charges corresponding to the received-light amount A2 accumulated in the charge accumulation elements Pz are taken out as a time from the image pickup device 1, it is possible to improve the response speed of the image pickup device 1 by reducing time needed to obtain the received-light outputs, as compared with the first operation example. In addition, since the received-light outputs corresponding to the received-light amounts in the different two periods are alternately taken out, a subtraction processing can be efficiently performed in the signal processing portion 3 to determine the difference between the received light outputs, e.g., "C0−C2" or "A0−A2".

Third Operation Example

The third operation example is characterized by accumulating the electric charges corresponding to the received-light amounts (A0, A2) in two different periods by a single exposure-accumulation operation, and different from the second operation example where the electric charges corresponding to the received-light amount A0 are accumulated in the first exposure-accumulation operation, and the electric charges corresponding to the received-light amount A2 are accumulated in the second exposure-accumulation operation. That is, the following exposure-accumulation operation is repeated plural times. This exposure-accumulation operation comprises the steps of:
irradiating a light intensity-modulated by a modulation signal to a target space;
receiving light from the target space with two of the photoelectric conversion elements Px to generate electric charges corresponding to received-light amounts in different two periods;
transferring the generated electric charges from the two photoelectric conversion elements Px respectively to two of the charge accumulation elements Pz through the transfer array Y1; and
accumulating the transferred electric charges in the two charge accumulation elements Pz.

Subsequently, total amounts of the electric charges accumulated in the two charge accumulation elements Pz by repeating the exposure-accumulation operation the plural times are taken out as the received-light outputs.

As a preferred method of taking out the electric charges accumulated in the accumulation array Z1 to the outside of the image pickup device 1, the total amount of the electric charges accumulated in one of the two charge accumulation elements Pz by repeating the exposure-accumulation operation the plural times is sent to the transfer array Y1, and then taken out from the transfer array Y1, and the total amount of the electric charges accumulated in the other one of the two charge accumulation elements Pz by repeating the exposure-accumulation operation the plural times is taken out from the accumulation array Z1.

Figure 20A:
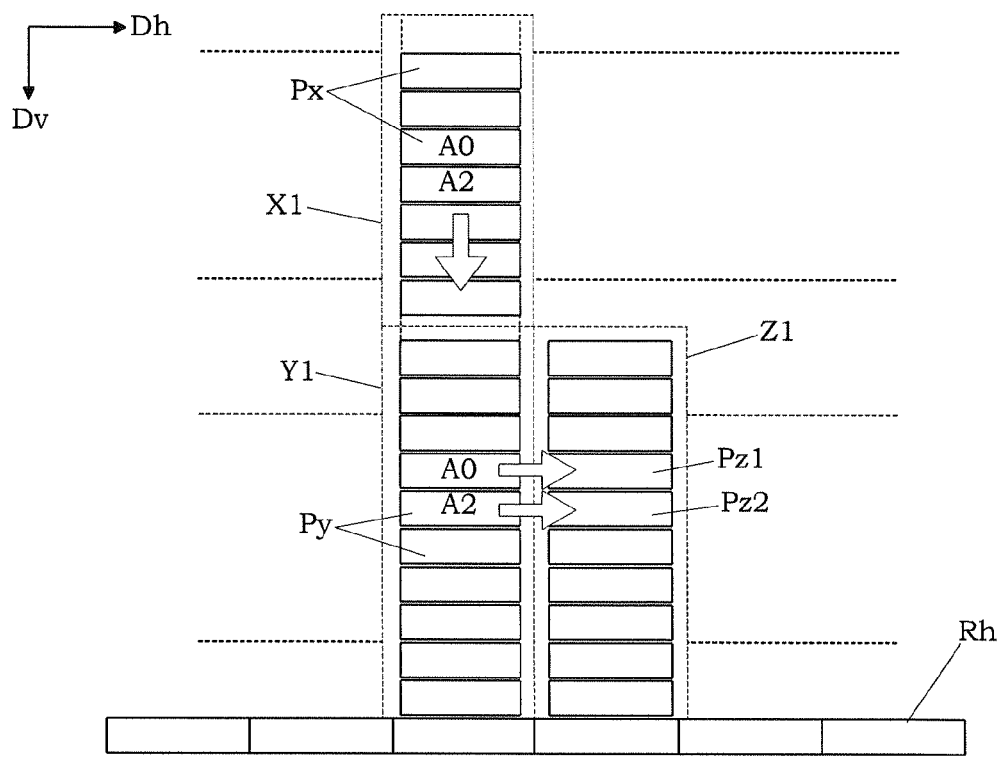
FIGS. 20A and 20B are explanatory diagrams of a third operation example for accumulating electric charges from the light receiving array in the accumulation array through the transfer array.
Figure 20B:
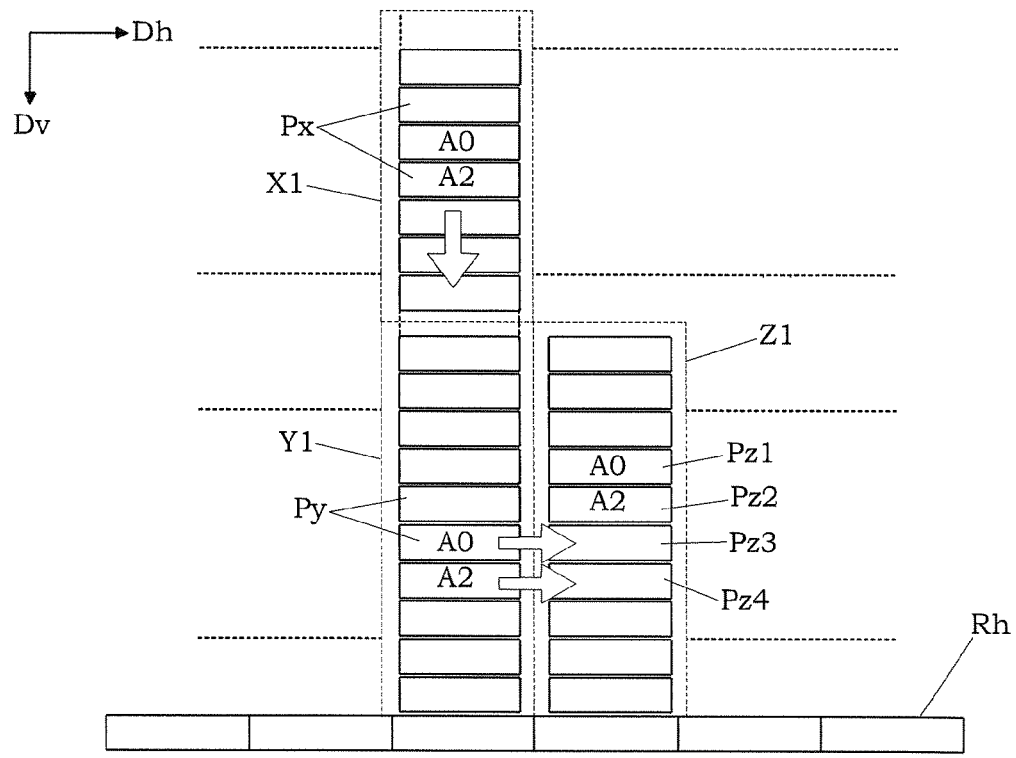

For example, as shown in FIG. 20A, in the exposure-accumulation operation, after the electric charges corresponding to the received-light amounts (A0, A2) in the two different phase zones of the modulation signal are collected in a pair of the photoelectric conversion elements Px, they are transferred to a pair of the charge transfer elements Py, and then accumulated from the charge transfer elements Py in a corresponding pair of the charge accumulation elements Pz. The charge accumulation elements Pz used in this exposure-accumulation operation are represented as Pz1, Pz2, as shown in FIG. 20A. On the other hand, as shown in FIG. 20B, in the next exposure-accumulation operation, the electric charges corresponding to the received-light amounts (A0, A2) are transferred to another pair of the charge transfer elements Py, and then accumulated from the charge transfer elements Py in a corresponding pair of the charge accumulation elements Pz. The charge accumulation elements Pz used in this exposure-accumulation operation are represented as Pz3, Pz4, as shown in FIG. 20B.

By alternately repeating these exposure-accumulation operations plural times (e.g., 5 times), the electric charges corresponding to the received-light amounts (A0, A2) can be cumulatively accumulated in these four charge accumulation elements (Pz1-Pz4). The thus accumulated electric charges are then taken out as the received-light outputs through the horizontal transfer resistor Rh, as described later. In this operation example, each of the photoelectric conversion elements Px is associated with two charge accumulation elements Pz, as in the second operation example. In addition, a light exposure time for each of the exposure-accumulation operations is set to time corresponding to 1 cycle or more of the modulation signal.

Figure 21A:
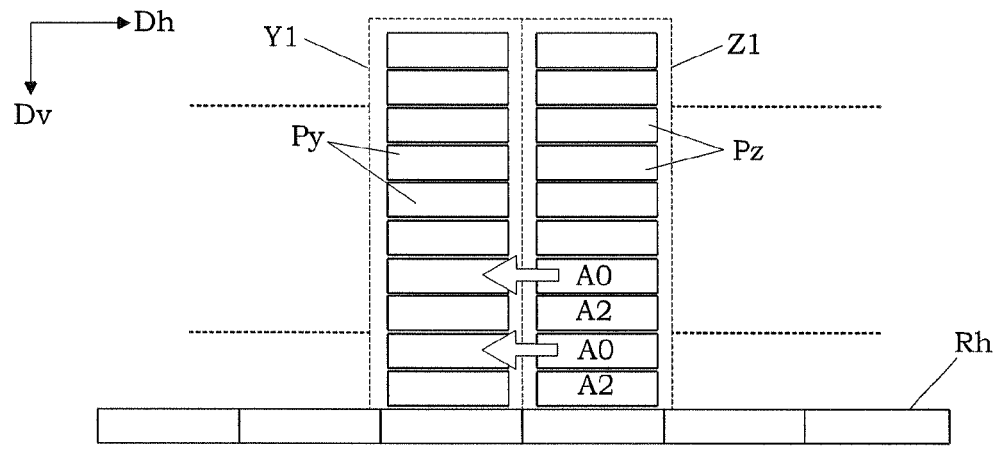
FIGS. 21A to 21C are explanatory diagrams of an operation for taking out the electric charges accumulated by the third operation example from the accumulation array.
Figure 21B:
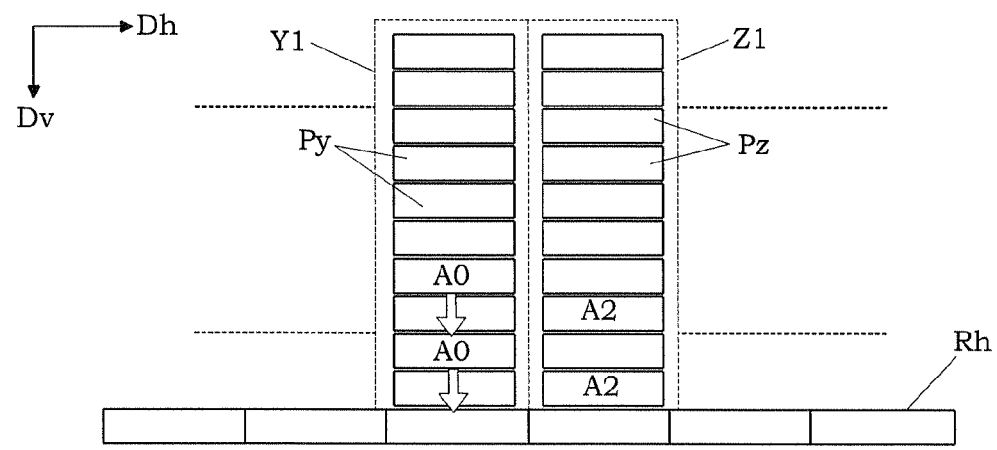
Figure 21C:
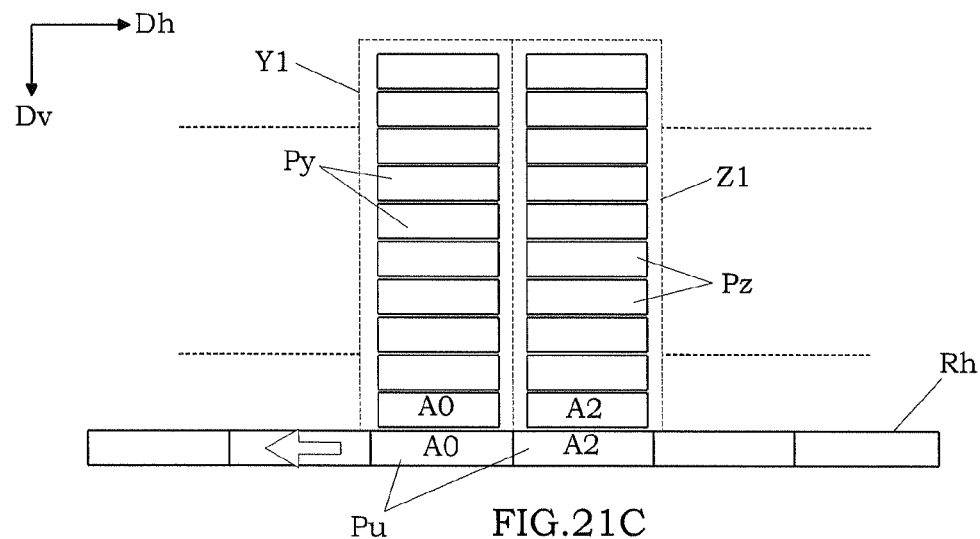

After the above-described exposure-accumulation operations are alternately performed plural times, the electric charges corresponding to the received-light amounts (A0, A2) accumulated in the accumulation array Z1 can be taken out, as shown in FIGS. 21A to 21C. First, the electric charges corresponding to the received-light amounts A0 accumulated in the charge accumulation elements Pz are transferred to the adjacent charge transfer elements Py, as shown by the arrows in FIG. 21A, and then transferred in the transfer array Y1 in the vertical direction Dv, as shown by the arrow in FIG. 21B such that the electric charges corresponding to the received-light amounts A0 are held in the charge transfer element Py adjacent to the charge accumulation element Pz having the electric charges corresponding to the received-light amounts A2 immediately before the horizontal transfer resistor Rh. Next, the electric charges corresponding to the received-light amounts (A0, A2) are sent to adjacent transfer cells Pu of the horizontal transfer resistor Rh, so that the received-light outputs corresponding to the received-light amounts (A0, A2)

are alternately provided from the horizontal transfer resistor Rh, as shown by the arrow in FIG. 21C.

According to the third operation example, since the electric charges corresponding to the received-light amounts in the different periods are obtained by the single exposure-accumulation operation, it is possible to achieve a further improvement in response speed of the image pickup device 1. This operation example is also available for the intensity detecting operation, as in the case of FIG. 19 explained in the second operation example.

Fourth Operation Example

The fourth operation example is the same as the third operation example in that the electric charges corresponding to the received-light amounts (A0, A2) are obtained by one exposure-accumulation operation. However, the fourth operation example is different from the third operation example in that the photoelectric conversion element Px used to collect the electric charges corresponding to a first received-light amount (e.g., A0) in a first exposure-accumulation operation is used to collect the electric charges corresponding to a second received-light amount (e.g., A2) in a second exposure-accumulation operation, and on the contrary the photoelectric conversion element Px used to collect the electric charges corresponding to the second received-light amount (A2) in the first exposure-accumulation operation is used to collect the electric charges corresponding to the first received-light amount (A0) in the second exposure-accumulation operation.

That is, the following exposure-accumulation operation is repeated plural times. This exposure-accumulation operation is comprised of a set of first and second exposure-accumulation operations.

The first exposure-accumulation operation comprises the steps of:
irradiating a light intensity-modulated by a modulation signal to a target space;
receiving light from the target space with one of the photoelectric conversion elements Px to generate electric charges corresponding to a received-light amount in a first period (e.g., a first phase zone in the modulation signal);
transferring the generated electric charges from the one of the photoelectric conversion elements Px to one of the charge accumulation elements Pz through the transfer array Y1;
accumulating the transferred electric charges in the one of the charge accumulation elements Pz;
receiving light from the target space with another one of the photoelectric conversion elements Px to generate electric charges corresponding to a received-light amount in a second period (e.g., a second phase zone different from the first phase zone of the modulation signal);
transferring the generated electric charges from the another one of the photoelectric conversion elements Px to another one of the charge accumulation elements Pz through the transfer array Y1; and
accumulating the transferred electric charges in the another one of the charge accumulation elements Pz.

The second exposure-accumulation operation comprises the steps of:
irradiating the intensity-modulated light to the target space;
receiving light from the target space with the another one of the photoelectric conversion elements Px to generate electric charges corresponding to the received-light amount in the first period;
transferring the generated electric charges from the another one of the photoelectric conversion elements Px to the one of the charge accumulation elements Pz through the transfer array Y1; and
accumulating the transferred electric charges in the one of the charge accumulation elements Pz;
receiving light from the target space with the one of the photoelectric conversion elements Px to generate electric charges corresponding to the received-light amount in the second period;
transferring the generated electric charges from the one of the photoelectric conversion elements Px to the another one of the charge accumulation elements Pz through the transfer array Y1; and
accumulating the transferred electric charges in the another one of the charge accumulation elements Pz.

Subsequently, a total amount of the electric charges accumulated in the one of the charge accumulation elements Pz by repeating the exposure-accumulation operation plural times and a total amount of the electric charges accumulated in the another one of the charge accumulation elements Pz by repeating the exposure-accumulation operation plural times are taken out as the received-light outputs.

As a preferred method of taking out the electric charges accumulated in the accumulation array Z1 to the outside of the image pickup device 1, the total amount of the electric charges accumulated in the one of the charge accumulation elements Pz by repeating the exposure-accumulation operation the plural times is sent to the transfer array Y1, and then taken out from the transfer array Y1, and the total amount of the electric charges accumulated in the another one of the charge accumulation elements Pz by repeating the exposure-accumulation operation the plural times is taken out from the accumulation array Z1.

Figure 22A:
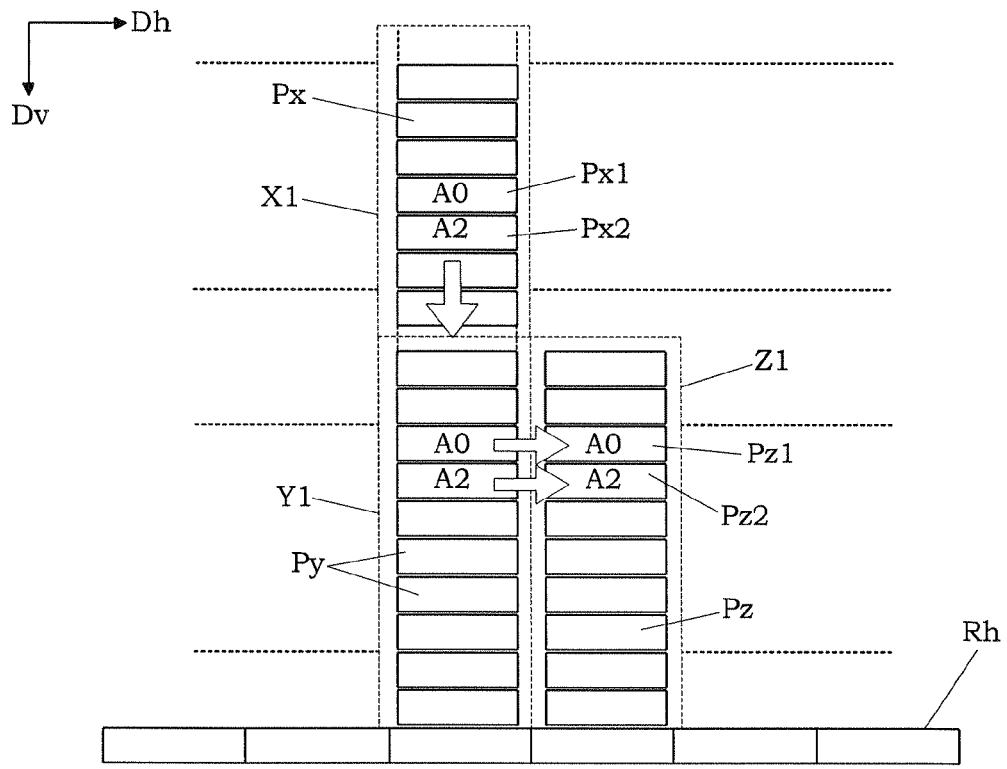
FIGS. 22A and 22B are explanatory diagrams of a fourth operation example for accumulating electric charges from the light receiving array in the accumulation array through the transfer array.

For example, as shown in FIG. 22A, in the first exposure-accumulation operation, one (Px1) of the photoelectric conversion elements Px generates electric charges corresponding to the received-light amount A0 in the first phase zone of the modulation signal by receiving the light from the target space, and another one (Px2) of the photoelectric conversion elements Px, which is located adjacent to the photoelectric conversion element Px1 in the vertical direction Dv, generates electric charges corresponding to the received-light amount A2 in the second phase zone of the modulation signal by receiving the light from the target space. Then, the electric charges corresponding to the received-light amounts (A0, A2) are transferred to a pair of the charge transfer elements Py, and then accumulated from the charge transfer elements Py in a corresponding two (Pz1, Pz2) of the charge accumulation elements Pz, as shown in FIG. 22A.

Figure 22B:
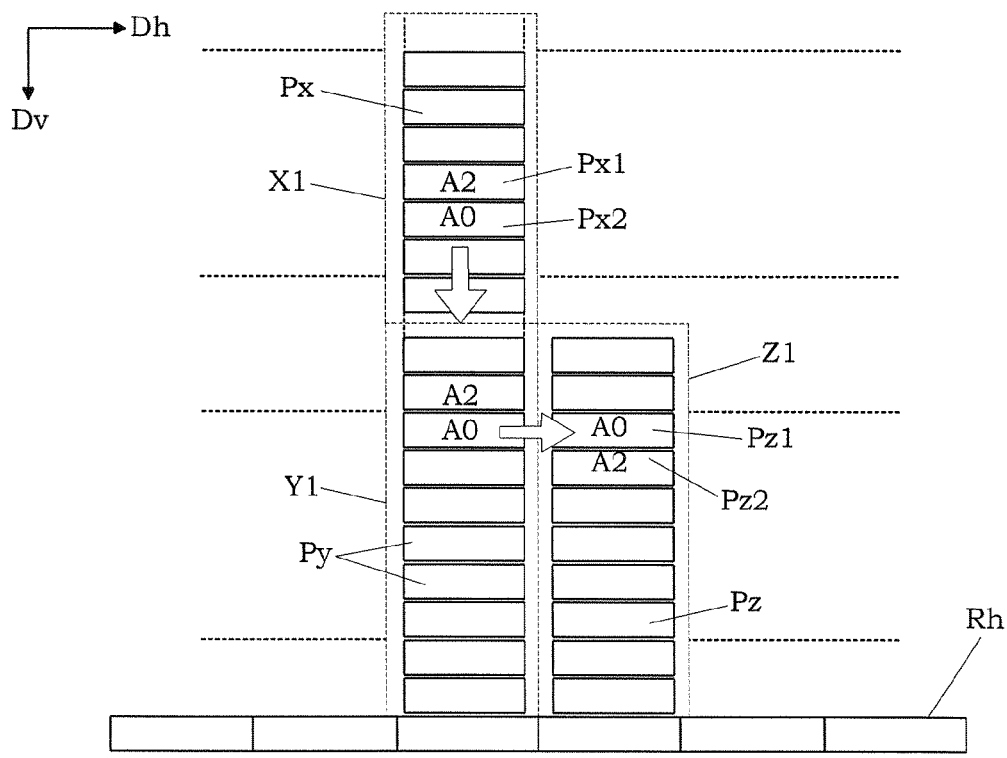

On the other hand, as shown in FIG. 22B, in the second exposure-accumulation operation, the photoelectric conversion element Px1 generates electric charges corresponding to the received-light amount A2 by receiving light from the target space, and the photoelectric conversion element Px2 generates electric charges corresponding to the received-light amount A0 by receiving light from the target space. The thus obtained electric charges corresponding to the received-light amounts (A0, A2) in the second exposure-accumulation operation are transferred to the charge accumulation elements (Pz1, Pz2) through the transfer array Y1, and then accumulated therein.

In brief, the electric charges corresponding to the received-light amount A0 generated by the photoelectric conversion element Px1 in the first exposure-accumulation operation, and the electric charges corresponding to the received-light amount A0 generated by the photoelectric conversion element Px2 in the second exposure-accumulation operation are cumulatively accumulated in the same charge accumulation element Pz1. Similarly, the electric charges corresponding to the received-light amount A2 generated by the photoelectric conversion element Px2 in the first exposure-accumulation operation, and the electric charges corresponding to the received-light amount A2 generated by the photoelectric conversion element Px1 in the second exposure-accumulation operation are cumulatively accumulated in the same charge accumulation element Pz2.

Figure 23A:
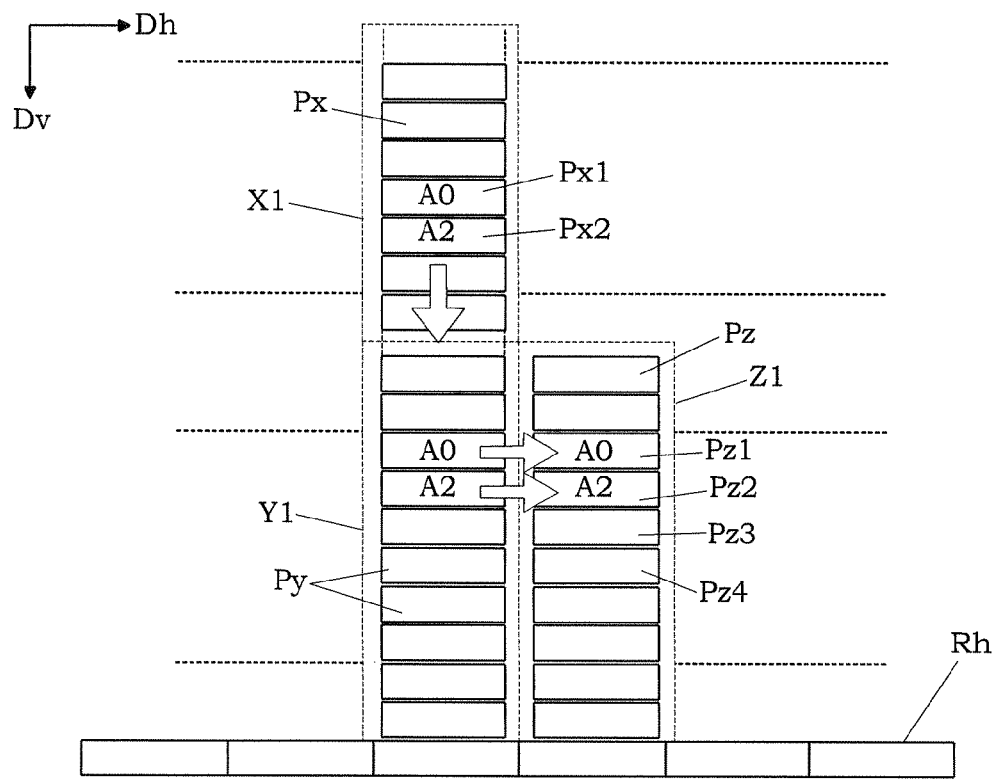
FIGS. 23A and 23B are explanatory diagrams showing a modification of the fourth operation example.
Figure 23B:
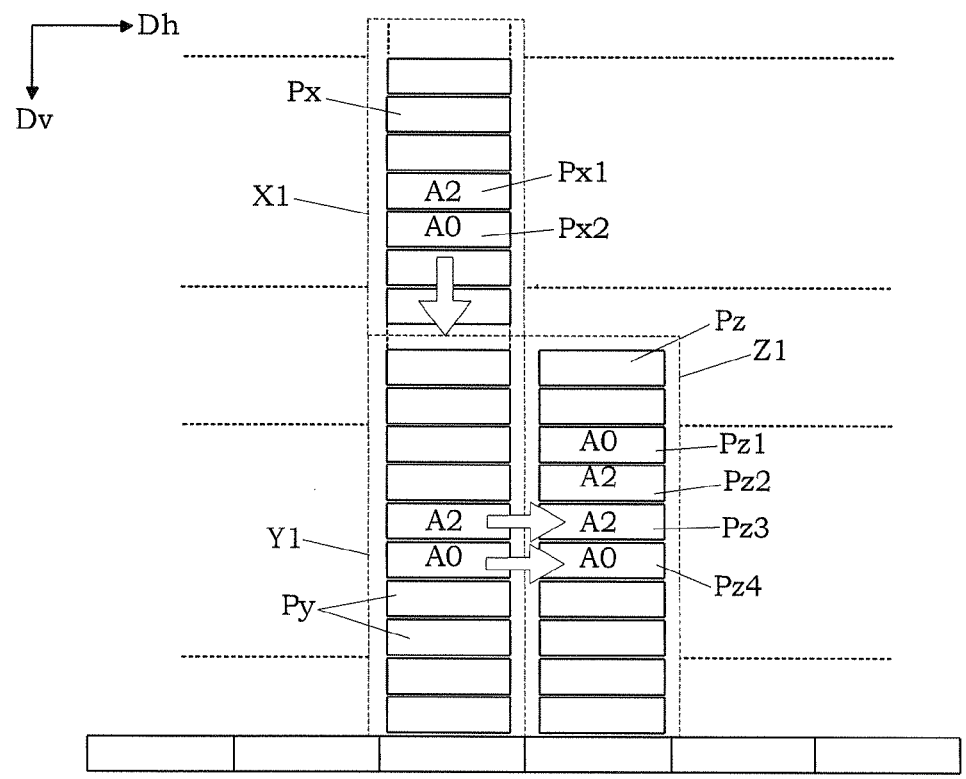

Alternatively, as shown in FIG. 23A, in the first exposure-accumulation operation, the electric charges corresponding to the received-light amount A0 generated by the photoelectric conversion element Px1 are accumulated in the charge accumulation element Pz1, and the electric charges corresponding to the received-light amount A2 generated by the photoelectric conversion element Px2 are accumulated in the charge accumulation element Pz2. Subsequently, as shown in FIG. 23B, in the second exposure-accumulation operation, the electric charges corresponding to the received-light amount A2 generated by the photoelectric conversion element Px1 are accumulated in a charge accumulation element Pz3 different from the charge accumulation element Pz2 used to accumulate the electric charges corresponding to the received-light amount A2 in the first exposure-accumulation operation. In addition, the electric charges corresponding to the received-light amount A0 generated by the photoelectric conversion element Px2 are accumulated in a charge accumulation element Pz4 different from the charge accumulation element Pz1 used to accumulate the electric charges corresponding to the received-light amount A0 in the first exposure-accumulation operation.

In the state of FIG. 22B obtained by repeating the above-described exposure-accumulation operation plural times, the electric charges corresponding to the received-light amount A0 accumulated in the accumulation array Z1 are sent to the transfer array Y1, and then taken out from the transfer array Y1 through the horizontal transfer resistor Rh, and the electric charges corresponding to the received-light amount A2 accumulated in the accumulation array Z1 can be taken out from the accumulation array Z1 through the horizontal transfer resistor Rh.

Figure 24A:
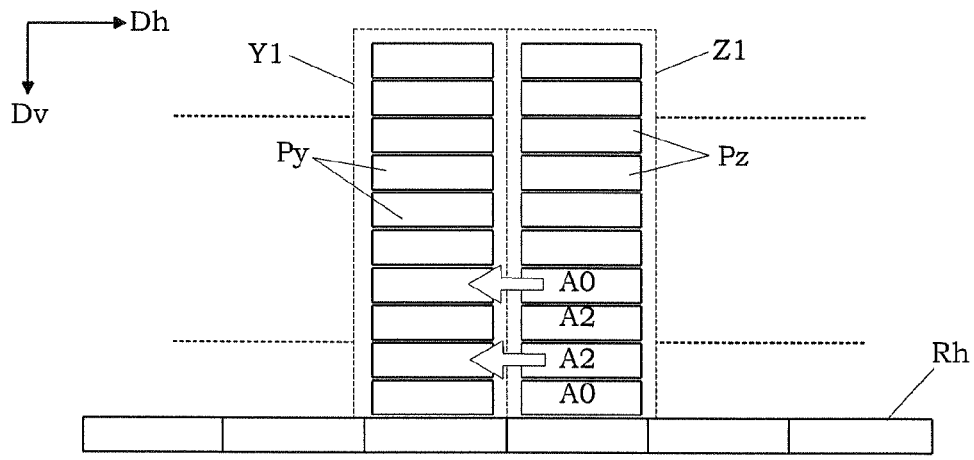
FIGS. 24A to 24C are explanatory diagrams of an operation for taking out the electric charges accumulated by the modification of the fourth operation example from the accumulation array.
Figure 24B:
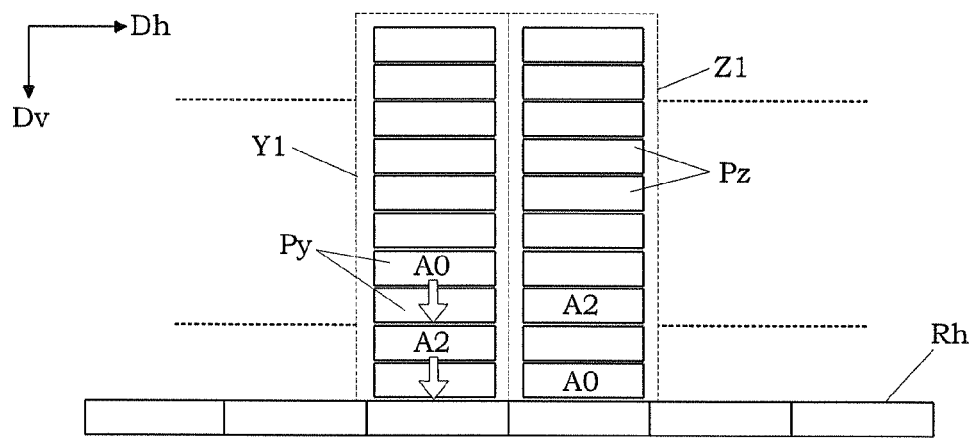
Figure 24C:
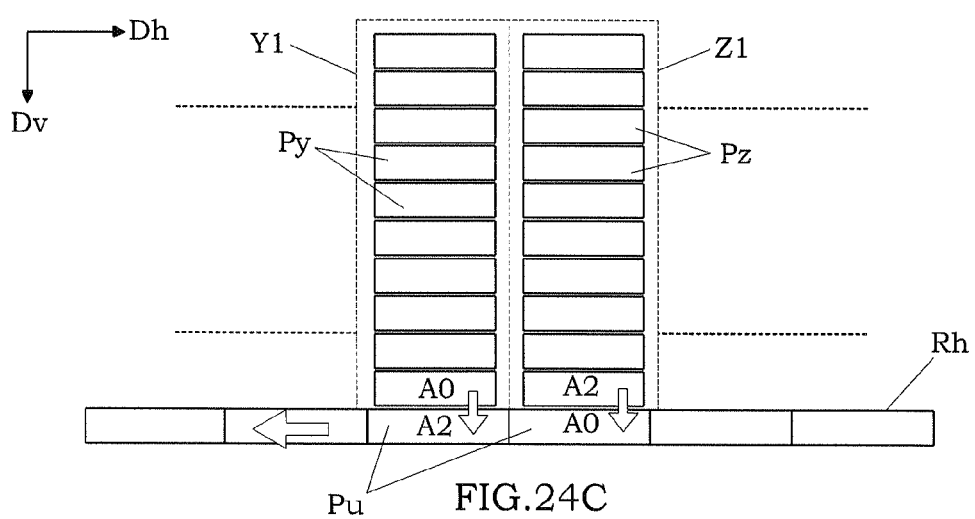

On the other hand, in the state of FIG. 23B obtained by repeating the above-described exposure-accumulation operation plural times, the electric charges corresponding to the received-light amounts (A0, A2) accumulated in the accumulation array Z1 can be taken out, as shown in FIGS. 24A to 24C. For example, as shown by the arrows in FIG. 24A, the electric charges corresponding to the received-light amount A0 accumulated in the charge accumulation array Z1 in the first exposure-accumulation operation are transferred to an adjacent charge transfer element Py, and also the electric charges corresponding to the received-light amount A2 accumulated in the accumulation array Z1 in the second exposure-accumulation operation are transferred to an adjacent charge transfer element Py. Then, as shown by the arrow in FIG. 24B, the electric charges corresponding to the received-light amounts (A0, A2) are transferred in the transfer array Y1 in the vertical direction Dv, so that the electric charges corresponding to the received-light amounts A2 obtained in the second exposure-accumulation operation are held in the charge transfer element Py adjacent to the charge accumulation element Pz having the electric charges corresponding to the received-light amounts A0 accumulated in the second exposure-accumulation operation immediately before the horizontal transfer resistor Rh. Next, the electric charges corresponding to the received-light amounts (A0, A2) accumulated in the second exposure-accumulation operation are sent to adjacent transfer cells Pu of the horizontal transfer resistor Rh. As a result, as shown by the arrow in FIG. 24C, the received-light outputs corresponding to the received-light amounts (A0, A2) are alternately taken out from the horizontal transfer resistor Rh.

Figure 25:
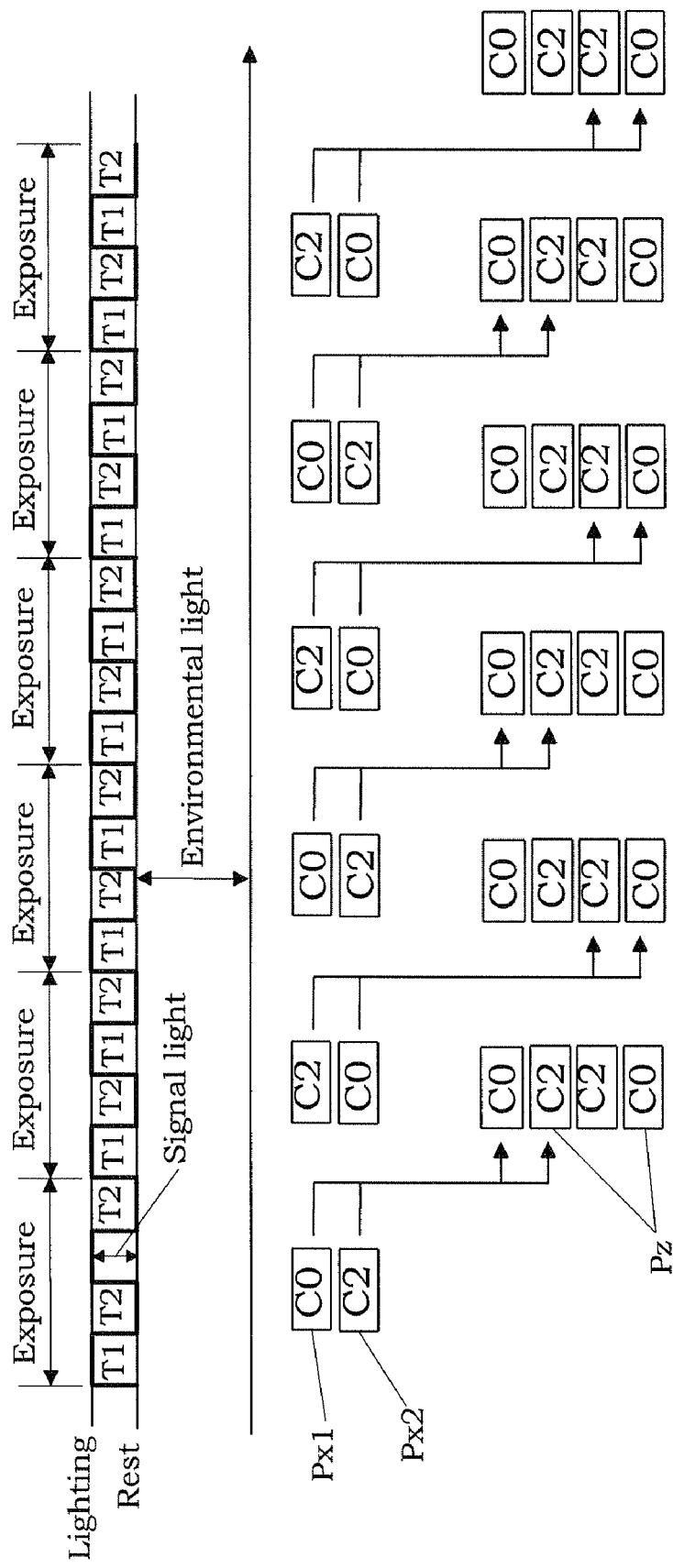
FIG. 25 is an explanatory diagram of the intensity detecting operation according to the fourth operation example.

In addition, the fourth operation example can be used for the intensity detecting operation. That is, as shown in FIG. 25, in the first exposure-accumulation operation, after the electric charges corresponding to the received-light amount C0 in the lighting period T1 are collected in the photoelectric conversion element Px1, and the electric charges corresponding to the received-light amount C2 in the rest period T2 are collected in the photoelectric conversion element Px2, they are accumulated in a pair of the charge accumulation elements Pz through the transfer array Y1. On the other hand, in the second exposure-accumulation operation, after the electric charges corresponding to the received-light amount C2 in the rest period T2 are collected in the photoelectric conversion element Px1, and the electric charges corresponding to the received-light amount C0 in the lighting period T1 are collected in the photoelectric conversion element Px2, they are accumulated in another pair of the charge accumulation elements Pz through the transfer array Y1. By repeating the above-described exposure-accumulation operation (i.e., the set of the first and second exposure-accumulation operations) plural times (e.g., 3 times), the electric charges corresponding to the received-light amounts (C0, C2) can be cumulatively accumulated in the four charge accumulation elements Pz. The thus accumulated electric charges are then taken out as the received-light outputs corresponding to the received-light amounts (C0, C2) through the horizontal transfer resistor Rh, as described above.

According to this operation example, it is possible to accurately determine the spatial information by use of the two received-light outputs corresponding to the received-light amounts, even if there is a relatively large step between two points in the target space. For example, when the electric charges corresponding to the received-light amounts (A0, A2) are generated by adjacent two photoelectric conversion elements Px, a point in the target space corresponding to the received-light amount A0 is different from the point in the target space corresponding to the received-light amount A2. Therefore, when there is a large step between these two points, the measurement accuracy of the spatial information may deteriorate due to a difference in distance therebetween. In the present operation example, since the adjacent two photoelectric conversion elements Px are alternately used to generate the electric charges corresponding to the received light amounts (A0, A2), the influence of the distance difference between the two points in the target space on the measurement accuracy of the spatial information can be reduced, as compared with the case where only one of the adjacent two photoelectric conversion elements is used to generate the electric charges corresponding to the received light amount A0 (or A2). As a result, even when there is a large difference in geometrical conditions between the two points in the target space associated with the adjacent two photoelectric conversion elements Px, it is possible to reduce the occurrence of measurement errors such as abnormal values.

Fifth Operation Example

The fifth operation example is suitable for the distance measuring operation, and characterized by repeating an exposure-accumulation operation plural times, which is provided by a pair of a first exposure-accumulation operation for accumulating electric charges corresponding to two received-light amounts (e.g., A0, A2) and a second exposure-accumulation operation for accumulating electric charges corresponding to another two received-light amounts (e.g., A1, A3).

That is, the first exposure-accumulation operation comprises the steps of:

irradiating a light intensity-modulated by a modulation signal to a target space;

receiving light from the target space with one of the photoelectric conversion elements Px to generate electric charges corresponding to a received-light amount in a first phase zone of the modulation signal;

transferring the generated electric charges from the one of the photoelectric conversion elements Px to a first one of the charge accumulation elements Pz through the transfer array Y1; and accumulating the transferred electric charges in the first one of the charge accumulation elements Pz;

receiving the light from the target space with another one of the photoelectric conversion elements Px to generate electric charges corresponding to the received-light amount in a second phase zone of the modulation signal;

transferring the generated electric charges from the another one of the photoelectric conversion elements Px to a second one of the charge accumulation elements Pz through the transfer array Y1; and accumulating the transferred electric charges in the second one of the charge accumulation elements Pz.

On the other hand, the second exposure-accumulation operation comprises the steps of:

irradiating the intensity-modulated light to the target space;

receiving light from the target space with the one of the photoelectric conversion elements Px to generate electric charges corresponding to the received-light amount in a third phase zone of the modulation signal;

transferring the generated electric charges from the one of the photoelectric conversion elements Px to a third one of the charge accumulation elements Pz through the transfer array Y1, and accumulating the transferred electric charges in the third one of the charge accumulation elements Pz;

receiving the light from the target space with the another one of the photoelectric conversion elements Px to generate electric charges corresponding to the received-light amount in a fourth phase zone of the modulation signal;

transferring the generated electric charges from the another one of the photoelectric conversion elements Px to a fourth one of the charge accumulation elements Pz through the transfer array Y1; and accumulating the transferred electric charges in the fourth one of the charge accumulation elements Pz.

Subsequently, total amounts of the electric charges accumulated in the first and second ones of the charge accumulation elements Pz by repeating the first exposure-accumulation operation plural times, and total amounts of the electric charges accumulated in the third and fourth ones of the charge accumulation elements Pz by repeating the second exposure-accumulation operation plural times are taken out as the received-light outputs.

Figure 26A:
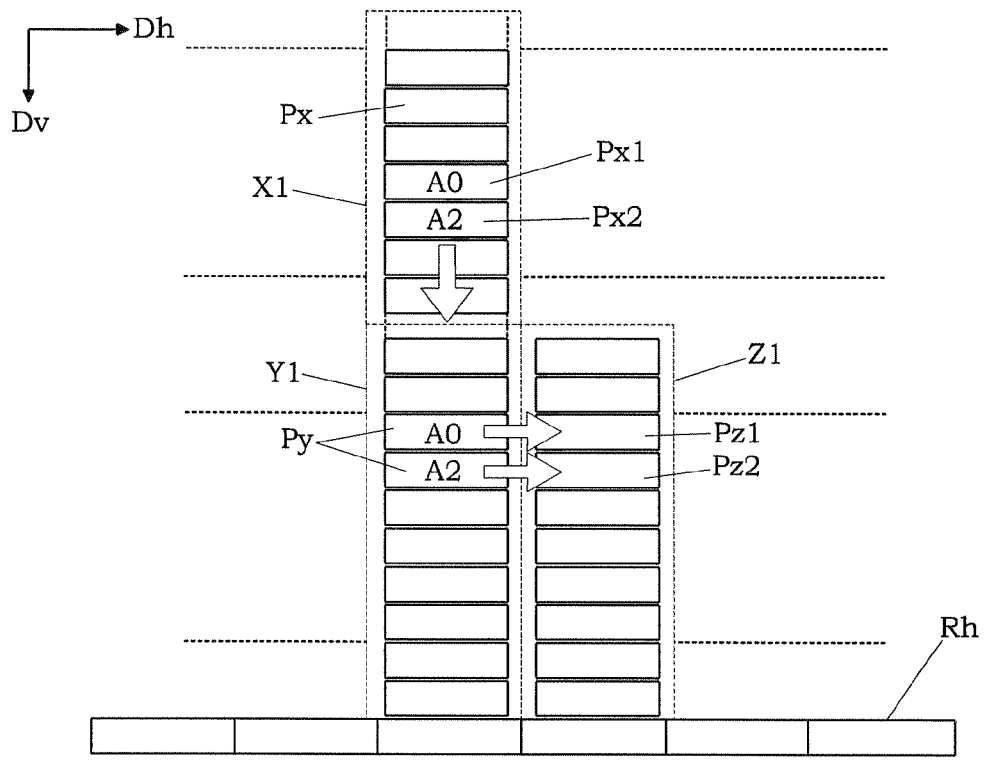
FIGS. 26A and 26B are explanatory diagrams of a fifth operation example for accumulating electric charges from the light receiving array in the accumulation array through the transfer array.
Figure 26B:
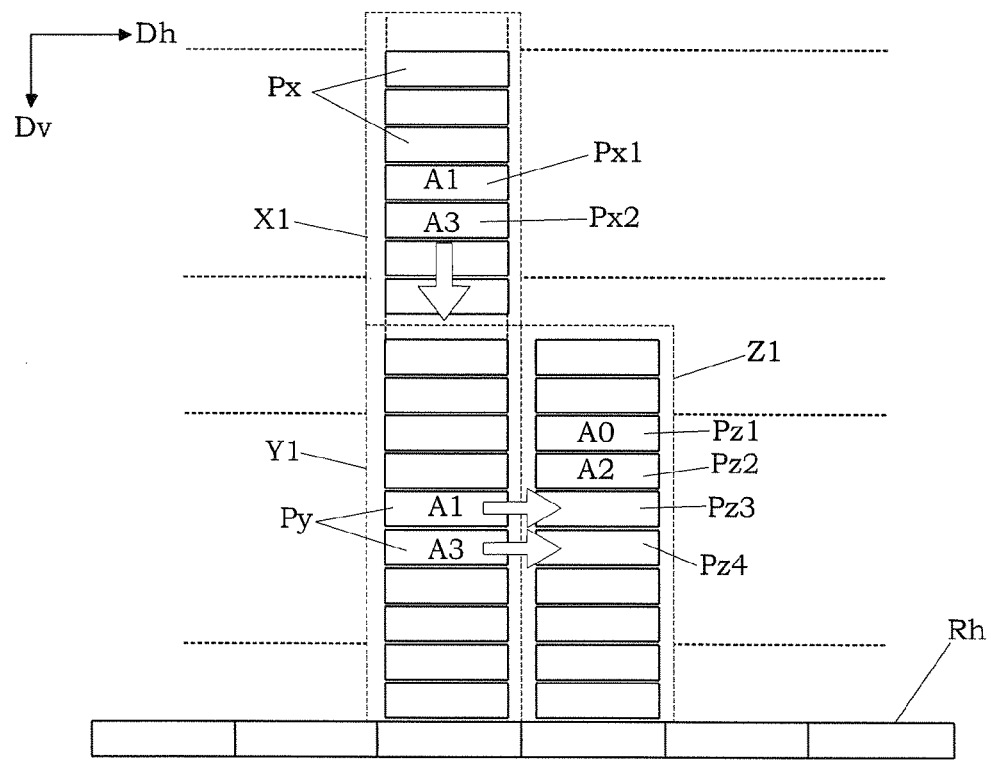

For example, as shown in FIG. 26A, in the first exposure-accumulation operation, after the electric charges corresponding to the received-light amount A0 in the first phase zone of the modulation signal are collected in one (Px1) of the photoelectric conversion elements Px, and the electric charges corresponding to the received-light amount A2 in the second phase zone of the modulation signal are collected in another one (Px2) of the photoelectric conversion elements Px, they are accumulated in a predetermined pair of charge accumulation elements (Pz1, Pz2) through the transfer array Y1. On the other hand, as shown in FIG. 26B, in the second exposure-accumulation operation, after the electric charges corresponding to the received-light amount A1 in the third phase zone of the modulation signal are collected in the photoelectric conversion element Px1, and the electric charges corresponding to the received-light amount A3 in the fourth phase zone of the modulation signal are collected in the photoelectric conversion element Px2, they are accumulated in another pair of charge accumulation elements (Pz3, Pz4) through the transfer array Y1. Thus, in the present operation example, each of the photoelectric conversion elements (Px1, Px2) is associated with two charge accumulation elements (Pz1 and Pz3, Pz2 and Pz4).

By repeating the above-described exposure-accumulation operation (i.e., the set of the first and second exposure-accumulation operations) plural times, the electric charges corresponding to the four received-light amounts (A0 to A3) can be cumulatively accumulated in the four charge accumulation elements (Pz1 to Pz4), respectively. The thus accumulated electric charges are then taken out as the received-light outputs corresponding to the received-light amounts (A0 to A3) through the horizontal transfer resistor Rh, as described later.

According to the present operation example, it is possible to accurately determine a distance to the object in the target space at an improved response speed by taking out the four received-light outputs at a time. That is, time needed for detecting the spatial (distance) information can be remarkably saved.

Figure 27:
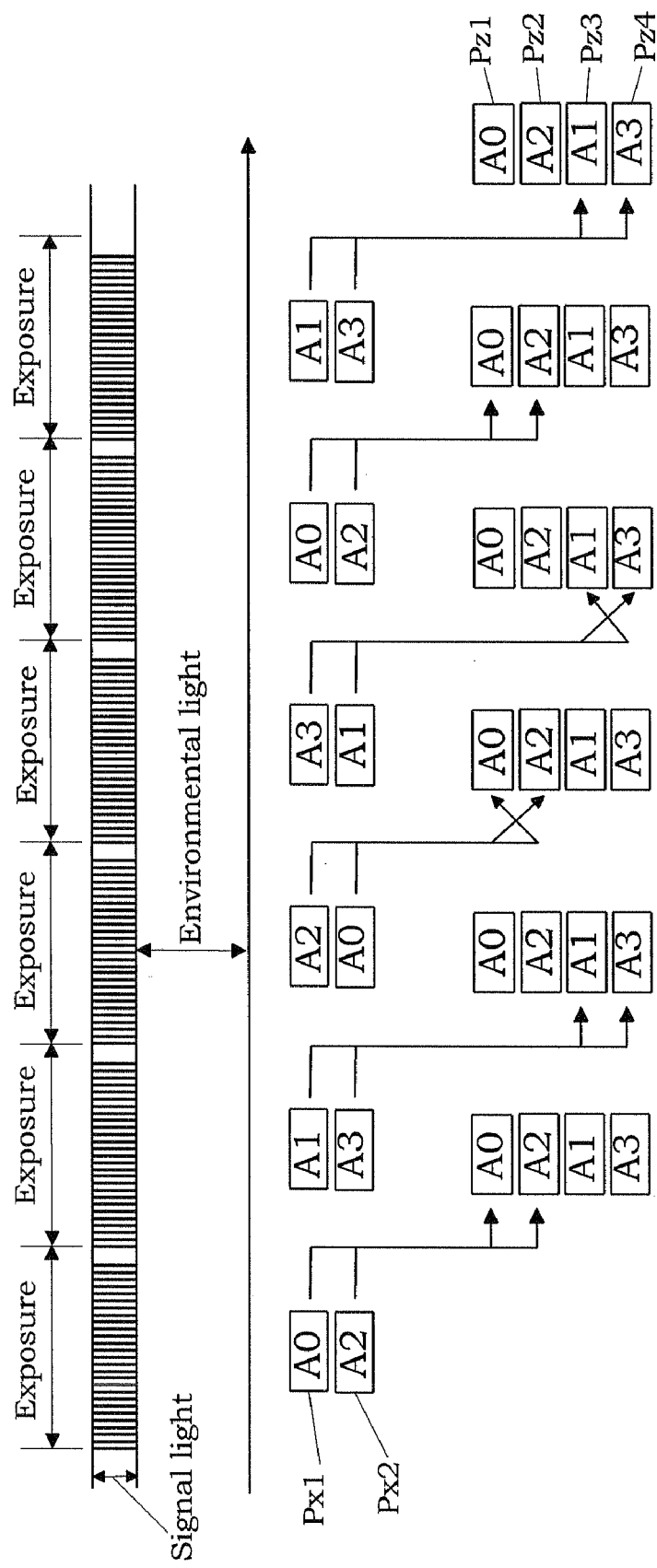
FIG. 27 is an explanatory diagram of the distance measuring operation according to a modification of the fifth operation example.

In a modification of the present operation example, as shown in FIG. 27, the four received-light outputs corresponding to the received-light amounts (A0 to A3) may be cumulatively accumulated in the four charge accumulation elements (Pz1 to Pz4) by using the method of the fourth operation example.

That is, this exposure-accumulation operation is comprised of first to fourth exposure-accumulation operations. In this case, a frequency of the modulation signal used to obtain the intensity-modulated light is approximately 10 MHz, and each of the first to fourth exposure-accumulation operations is performed for a time period corresponding to plural cycles (e.g., 10000 cycles) of the intensity-modulated light.

First, the first exposure-accumulation operation, which is the same as that of FIG. 26A, is repeated plural times to accumulate the electric charges corresponding to the received-light amounts (A0, A2) in the charge accumulation elements (Pz1, Pz2), respectively.

Next, the second exposure-accumulation operation, which is the same as that of FIG. 26B, is repeated plural times to accumulate the electric charges corresponding to the received-light amounts (A1, A3) in the charge accumulation elements (Pz3, Pz4), respectively.

Next, the third exposure-accumulation operation is repeated plural times. In the third exposure-accumulation operation, the electric charges corresponding to the received-light amount A2 are collected in the photoelectric conversion elements Px1 used to collect the electric charges corresponding to the received-light amount A0 in the first exposure-accumulation operation, and the electric charges corresponding to the received-light amount A0 are collected in the photoelectric conversion elements Px2 used to collect the electric charges corresponding to the received-light amount A2 in the first exposure-accumulation operation. Subsequently, these electric charges corresponding to the received-light amounts (A2, A0) are accumulated in the charge accumulation elements (Pz2, Pz1) through the transfer array Y1.

Next, the fourth exposure-accumulation operation is repeated plural times. In the fourth exposure-accumulation operation, the electric charges corresponding to the received-light amount A3 are collected in the photoelectric conversion elements Px1 used to collect the electric charges corresponding to the received-light amount A1 in the second exposure-accumulation operation, and the electric charges corresponding to the received-light amount A1 are collected in the photoelectric conversion elements Px2 used to collect the electric charges corresponding to the received-light amount A3 in the second exposure-accumulation operation. Subsequently, these electric charges corresponding to the received-light amounts (A3, A1) are accumulated in the charge accumulation elements (Pz4, Pz3) through the transfer array Y1.

By repeating the above-described exposure-accumulation operation (i.e., the set of the first to fourth exposure-accumulation operations) plural times (e.g., 5 times), the electric charges corresponding to the four received-light amounts (A0 to A3) can be cumulatively accumulated in the four charge accumulation elements (Pz1 to Pz4). The thus accumulated electric charges are then taken out as the received-light outputs corresponding to the received-light amounts (A0 to A3) through the horizontal transfer resistor Rh, as described later.

According to this operation example, it is possible to accurately determine the distance to the object in the target space by use of the four received-light outputs, even if there is a relatively large geometrical step between two points in the target space.

Figure 28A:
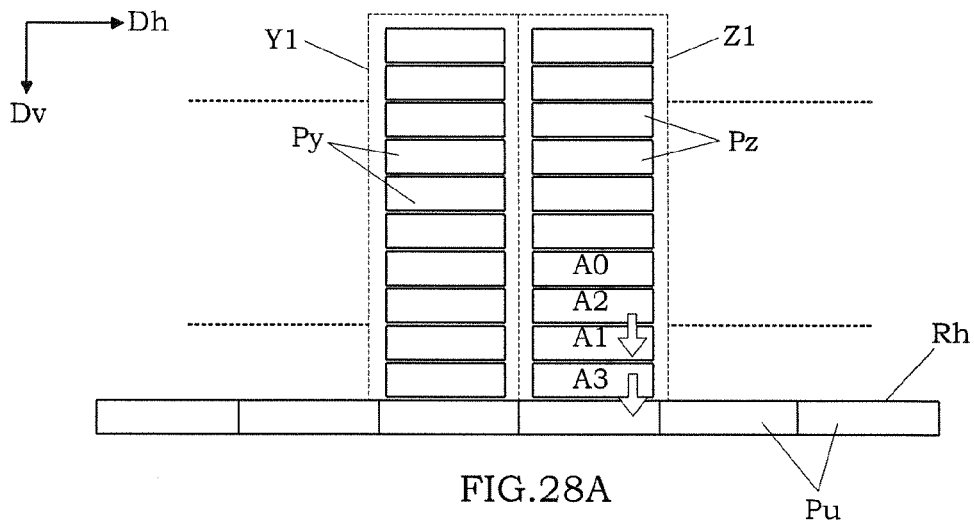
FIGS. 28A to 28C are explanatory diagrams of an operation for taking out the electric charges accumulated by the fifth operation example from the accumulation array.
Figure 28B:
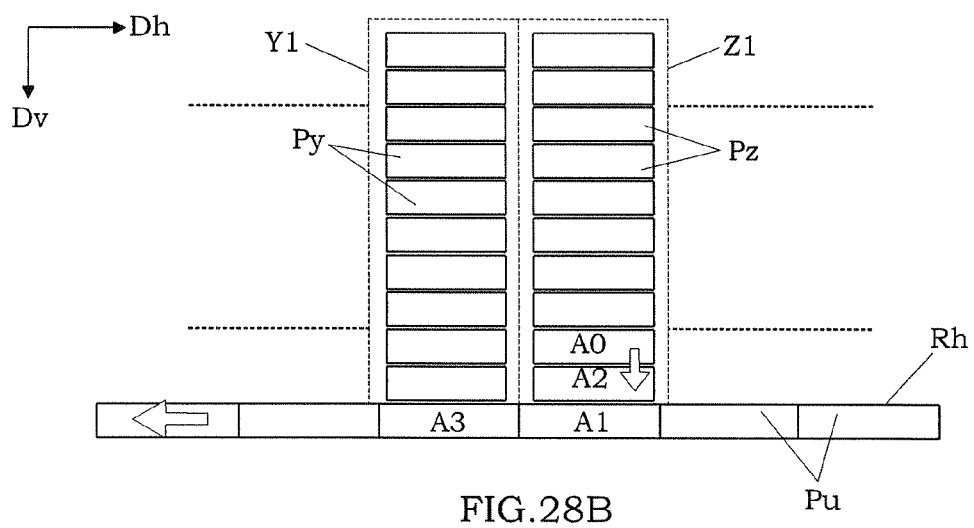
Figure 28C:
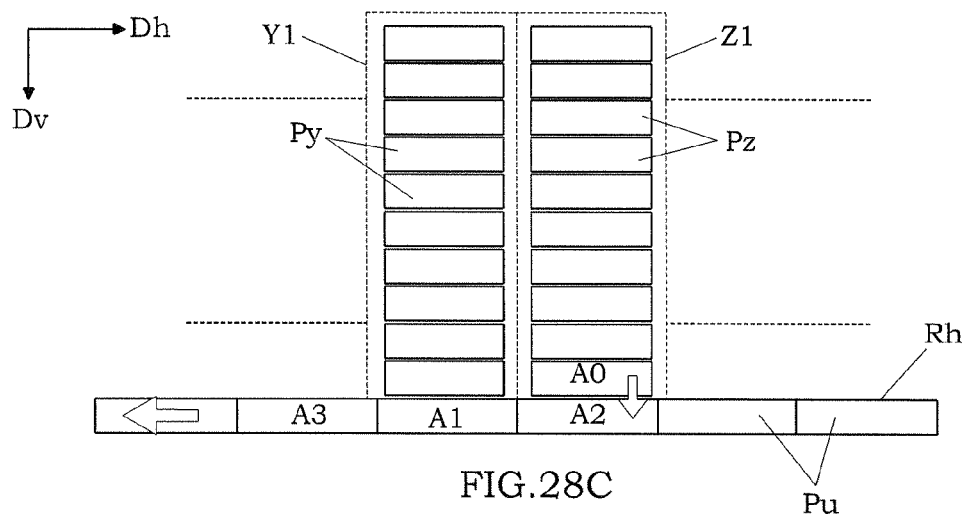
Figure 29A:
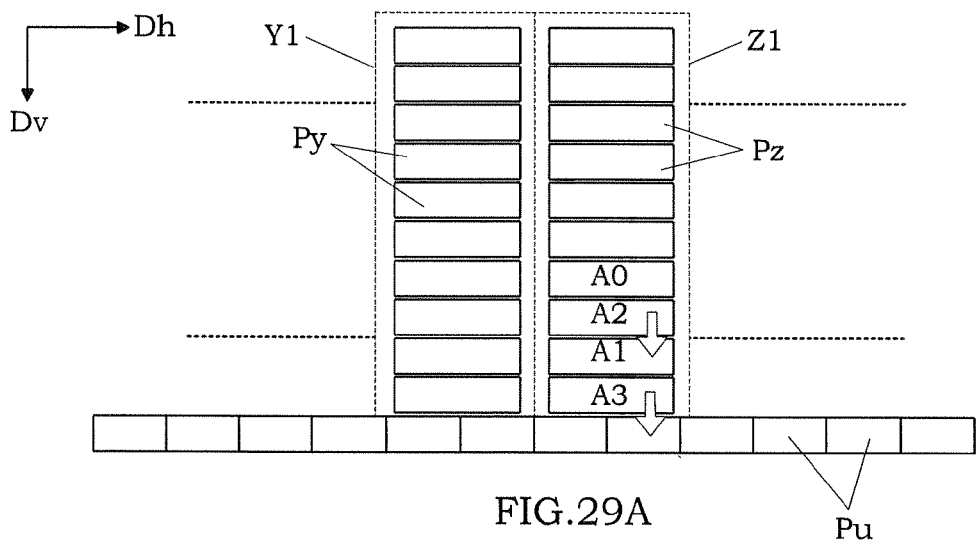
FIGS. 29A to 29C are explanatory diagrams of an another operation for taking out the electric charges accumulated by the fifth operation example from the accumulation array.
Figure 29B:
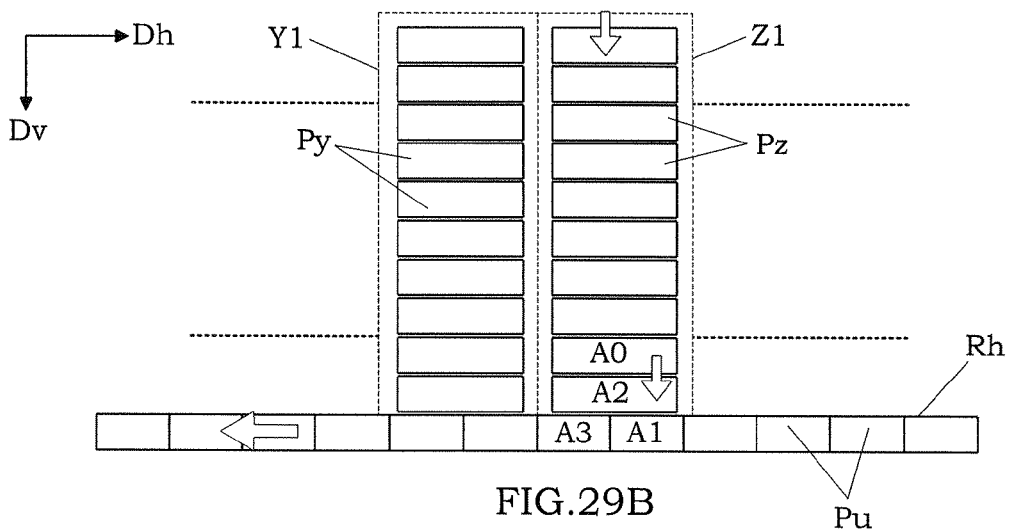
Figure 29C:
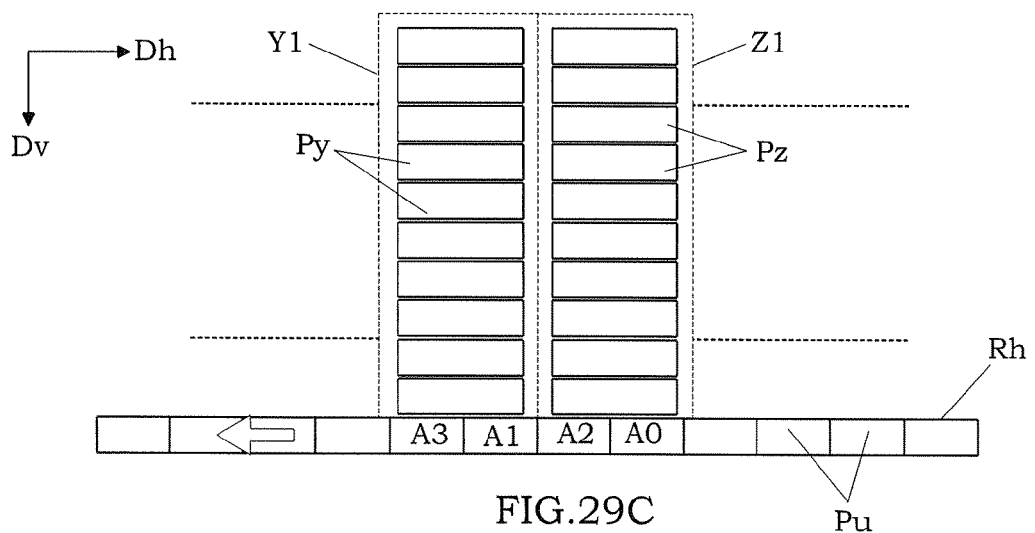

After the above-explained exposure-accumulation operation is performed plural times, the electric charges corresponding to the received-light amounts (A0 to A3) accumulated in the accumulation array Z1 can be taken out by turns through the horizontal transfer resistor Rh, as shown in FIGS. 28A to 28C. In this case, one transfer cell Pu of the horizontal transfer resistor Rh is associated with each of the transfer array Y1 and the accumulation array Z1. By taking out these four received-light outputs from the horizontal transfer resistor Rh, (A0−A2)/(A1−A3) is calculated by the signal processing portion 3 to determine the distance to the object. In addition, it is preferred that the electric charges corresponding to the received-light amounts (A0 to A3) are read out at a time in a 4-bit parallel manner from the four transfer cells Pu of the horizontal transfer resistor Rh. Alternatively, as shown in FIGS. 29A to 29C, two transfer cell Pu of the horizontal transfer resistor Rh may be associated with each of the transfer array Y1 and the accumulation array Z1 to take out the electric charges corresponding to the received-light amounts (A0 to A3).

In the above-described image pickup device 1, one photoelectric conversion element Px can be used as a plurality of image pickup elements. For example, it is explained below about the case where one photoelectric conversion element Px can be used as two image pickup elements Pe. As described above, since each of the photoelectric conversion elements Px has six control electrodes 21, three control electrodes 21 are used for each of the two image pickup elements. As shown in FIGS. 30A and 30B, the six control electrodes 21 are represented as (1) to (6). That is, one of the two image pickup elements Pe corresponds to three control electrode (1) to (3), and the other image pickup element Pe corresponds to another three control electrode (4) to (6).

In this case, a potential well Wa having large aperture area and depth is formed by applying a large voltage to the three control electrodes 21, and a potential well Wb having small aperture area and depth is formed by applying a small voltage to a center one of the three control electrodes 21. That is, these two different potential wells can be formed by controlling the magnitude of the applied voltage and the number of the control electrodes 21, to which the voltage is applied.

Therefore, the electric charges (e.g., electrons) generated by receiving light from the target space can be collected by the potential well Wa, and then held by the potential well Wb. That is, a charge collecting period and a charge holding period can be defined by changing the aperture area of the potential well (Wa, Wb). With respect to each of the photoelectric conversion elements Px, the charge collecting period and the charge holding period are alternately repeated plural times. Subsequently, the collected electric charges are transferred from the light receiving array X1 to the accumulation array Z1 through the transfer array Y1.

Specifically, as shown in FIG. 30A, in a period of the intensity-modulated light, electric charges are collected in the potential well Wa corresponding to the three control electrodes (1) to (3), and electric charges are held in the potential well Wb corresponding to the center one (5) of the three control electrodes (4) to (6). On the other hand, as shown in FIG. 30B, in another period of the intensity-modulated light, the electric charges are held in the potential well Wb corresponding to the center one (2) of the three control electrodes (1) to (3), and the electric charges are collected in the potential well Wa corresponding to the three control electrodes (4) to (6).

By alternately repeating the states of FIGS. 30A and 30B, the charge collecting period and the charge holding period are alternately obtained with respect to each of the image pickup elements. For example, the period corresponding to the received-light amount A0 is associated with the state of FIG. 30A, and the period corresponding to the received-light amount A2 is associated with the state of FIG. 30B. In this case, the electric charges corresponding to the received-light amount A0 are collected in the potential well Wa corresponding to the control electrodes (1) to (3), and the electric charges corresponding to the received-light amount A2 are collected in the potential well Wa corresponding to the control electrodes (4) to (6).

In addition, the electric charges corresponding to four different periods can be collected in four potential wells by using twelve control electrodes. By the way, a small amount of electric charges generated by receiving the light from the target space during the charge holding period is collected in the potential well Wb. However, the influence of the electric charges collected during the charge holding period can be cancelled out by arithmetic processing for determining the spatial information.

INDUSTRIAL APPLICABILITY

As understood from the above embodiments, according to the present invention, since the light receiving array of the photoelectric conversion elements, the transfer array of the charge transfer elements and the accumulation array of the charge accumulation elements each having a greater charge storage capacity than the saturation charge amount of the photoelectric conversion element are formed in each of the image pickup units, it is possible to expand the dynamic range of the received-light output by preventing the saturation phenomenon without increasing the area of the photoelectric conversion elements.

In addition, when the charge-amount adjusting portion is formed adjacent to the light receiving array in the horizontal direction, and the accumulation array and the charge amount adjusting portion are arranged in a line in a vertical direction, the amount of undesired electric charges can be appropriately determined according to the environmental light condition without causing an increase in area of the image pickup unit.

Furthermore, when the image pickup device of the present invention is utilized for the spatial information detecting apparatus, the spatial information of the target space can be accurately detected even under a condition that the environment light fluctuates with time.

Thus, the image pickup device of the present invention and the spatial information detecting apparatus using the same device are expected to be utilized in various application fields such as crime-prevention system and factory automation system.

The invention claimed is:

1. A spatial information detecting apparatus comprising:
a light emission source configured to irradiate a light intensity-modulated by a modulation signal to a target space;
an image pickup device for receiving light from said target space, generating electric charges corresponding to a received-light amount, and outputting the electric charges as a received-light output; and
an analyzer configured to determine spatial information of the target space according to the received-light output of said image pickup device,
wherein said image pickup device comprises a plurality of image pickup units formed on a semiconductor substrate, each of which comprising:
a light receiving array of photoelectric conversion elements, each of which is configured to receive light, and generate electric charges corresponding to a received-light amount;
a transfer array of charge transfer elements;
an accumulation array of charge accumulation elements, which is configured to accumulate the electric charges transferred from said light receiving array through said transfer array;
a plurality of control electrodes, which are formed at regions corresponding to said photoelectric conversion elements on said semiconductor substrate through an insulating layer, and used to transfer the electric charges from said light receiving array to said transfer array; and
a charge-amount adjusting portion configured to determine an amount of undesired electric charges depending on an environmental light existing in the target space to be separated from the electric charges generated by each of said photoelectric conversion elements,
said transfer array and said light receiving array being arranged in a line in a first direction,
said accumulation array being disposed adjacent to said transfer array in a second direction substantially orthogonal to the first direction,
said transfer array and said accumulation array being disposed in a light shielding region, and
each of said charge accumulation elements having a charge storage capacity greater than a saturation charge amount of each of said photoelectric conversion elements, and
said accumulation array and said charge-amount adjusting portion being arranged in a line in the first direction.

2. The spatial information detecting apparatus as set forth in claim 1, wherein each of said charge accumulation elements is disposed in a face-to-face relation with each of said charge transfer elements.

3. The spatial information detecting apparatus as set forth in claim 1, wherein each of said charge transfer elements is a first impurity diffusion layer formed in said semiconductor substrate, and each of said charge accumulation elements is a second impurity diffusion layer formed in said semiconductor substrate to have a larger impurity concentration than said first impurity diffusion layer.

4. The spatial information detecting apparatus as set forth in claim 1, wherein each of said image pickup units further comprises at least one transfer control electrode formed at a region corresponding to each of said charge transfer elements on said semiconductor substrate, and at least one accumulation control electrode formed at a region corresponding to each of said charge accumulation elements on said semiconductor substrate.

5. The spatial information detecting apparatus as set forth in claim 1, wherein each of said image pickup units further comprises a separation zone configured to provide a potential barrier between said accumulation array and said transfer array.

6. The spatial information detecting apparatus as set forth in claim 5, wherein each of said image pickup units further comprises at least one barrier control electrode formed at a region corresponding to said separation zone on said semiconductor substrate through an insulating layer.

7. The spatial information detecting apparatus as set forth in claim 1, wherein each of said charge transfer elements is a first impurity diffusion layer formed in said semiconductor substrate, and each of said charge accumulation elements is a second impurity diffusion layer formed in said semiconductor substrate to have a larger impurity concentration than said first impurity diffusion layer,
each of said image pickup units comprises at least one of a first slit region formed between said separation zone and said charge transfer element and a second slit region formed between said separation zone and said charge accumulation element,
said first slit region is a third impurity diffusion layer formed in said semiconductor substrate to have a larger impurity concentration than said first impurity diffusion layer, and said second slit region is a fourth impurity diffusion layer formed in said semiconductor substrate to have a larger impurity concentration than said second impurity diffusion layer.

8. The spatial information detecting apparatus as set forth in claim 1, wherein each of said image pickup units further comprises an overflow drain formed adjacent to said accumulation array.

9. The spatial information detecting apparatus as set forth in claim 8, wherein each of said image pickup units further comprises an overflow drain formed adjacent to each of said photoelectric conversion elements, and a buffer region having no overflow drain, which is provided between said light receiving array and said transfer array.

10. The spatial information detecting apparatus as set forth in claim 1, wherein each of said image pickup units further comprises a transfer resistor having a plurality of transfer cells and extending along the second direction, and said transfer cells are arranged such that said accumulation array is associated with at least one of said transfer cells, and said transfer array is associated with another at least one of said transfer cells.

11. The spatial information detecting apparatus as set forth in claim 1, wherein the spatial information detecting apparatus further comprises a controller configured to control a control voltage applied to said control electrodes to change an aperture area of a potential well formed in said semiconductor substrate such that the aperture area of said potential well is switched between a charge collecting period where said potential well has a large aperture area and a charge holding period where said potential well has a small aperture area.

12. The spatial information detecting apparatus as set forth in claim 1, wherein said light emission source irradiates said intensity-modulated light to the target space so as to alternately repeat a lighting period where said intensity-modulated light is irradiated to the target space, and a rest period where said intensity-modulated light is not irradiated to the target space.

13. A method for taking out a received-light output from the spatial information detecting apparatus as set forth in claim 1, the method comprising the steps of:
repeating an exposure-accumulation operation plural times, which comprises the steps of receiving light from a target space by said light receiving array of the image pickup device to generate electric charges corresponding to a received-light amount, transferring the generated electric charges from said light receiving array to said accumulation array through said transfer array of the image pickup device, and accumulating the transferred electric charges in said accumulation array; and
taking out, as a received-light output, a total amount of the electric charges accumulated in said accumulation array by repeating said exposure accumulation operation plural times.

14. The method as set forth in claim 13, wherein said exposure-accumulation operation comprises the steps of irradiating a light intensity-modulated by a modulation signal to the target space, and receiving the light from the target space by said light receiving array to generate the electric charges corresponding to the received-light amount in a predetermined phase zone of said modulation signal.

15. The method as set forth in claim 13, wherein said exposure-accumulation operation comprises the steps of irradiating an intensity-modulated light to the target space so as to alternately repeat a lighting period where said intensity-modulated light is irradiated to the target space, and a rest period where said intensity-modulated light is not irradiated to the target space, and receiving the light from the target space by said light receiving array to generate the electric charges corresponding to the received-light amount in each of the lighting period and the rest period.

16. The spatial information detecting apparatus as set forth in claim 1,
wherein said charge-amount adjusting portion is configured to determine said amount of undesired electric charges on the basis of the electric charges generated by each of said photoelectric conversion elements in a period where said light emission source is turned off.

* * * * *